US008755944B2

(12) United States Patent
Elliott et al.

(10) Patent No.: US 8,755,944 B2
(45) Date of Patent: Jun. 17, 2014

(54) ELECTRICAL SWITCHING MODULE

(75) Inventors: Randall B. Elliott, Tigard, OR (US);
Richard A. Leinen, Wilsonville, OR
(US); Robert L. Hick, Newberg, OR
(US); Kevin Parsons, Wilsonville, OR
(US); Subramanian Muthu, Portland,
OR (US)

(73) Assignee: Leviton Manufacturing Co., Inc.,
Melville, NY (US)

( * ) Notice: Subject to any disclaimer, the term of this
patent is extended or adjusted under 35
U.S.C. 154(b) by 892 days.

(21) Appl. No.: 12/751,956

(22) Filed: Mar. 31, 2010

(65) Prior Publication Data

US 2011/0115460 A1    May 19, 2011

Related U.S. Application Data

(63) Continuation-in-part of application No. 12/618,497,
filed on Nov. 13, 2009, now Pat. No. 8,463,453.

(51) Int. Cl.
| G05D 7/00 | (2006.01) |
| G05D 11/00 | (2006.01) |
| G05D 11/02 | (2006.01) |
| G05D 3/12 | (2006.01) |
| G05D 5/00 | (2006.01) |
| G05D 9/00 | (2006.01) |
| G05D 17/00 | (2006.01) |

(52) U.S. Cl.
USPC ........... 700/282; 700/283; 700/284; 700/285;
700/286

(58) Field of Classification Search
USPC ................................................. 700/282–286
See application file for complete search history.

(56) References Cited

U.S. PATENT DOCUMENTS

| 3,678,291 A | 7/1972 | Coe |
| 4,010,386 A | 3/1977 | Rossell |
| 4,096,884 A | 6/1978 | Horowitz |
| 4,296,449 A | 10/1981 | Eichelberger |
| 4,365,164 A | 12/1982 | Sibley |
| 4,427,863 A | 1/1984 | Fujita |
| 4,581,705 A | 4/1986 | Gilker et al. |
| 4,675,987 A | 6/1987 | Minks et al. |
| 4,739,351 A | 4/1988 | Feldman |
| 4,829,457 A | 5/1989 | Russo et al. |
| 4,835,350 A * | 5/1989 | Ozu et al. ................... 200/50.12 |

(Continued)

FOREIGN PATENT DOCUMENTS

| EP | 0039869 A1 | 4/1981 |
| EP | 2214287 A2 | 8/2010 |

(Continued)

OTHER PUBLICATIONS

International Preliminary Report on Patentability for PCT/US2010/
044022, dated May 15, 2012, 6 pages.

(Continued)

*Primary Examiner* — Ronald Hartman, Jr.
(74) *Attorney, Agent, or Firm* — Marger Johnson &
McCollom PC

(57) ABSTRACT

A module including a case; an electrical switching device
configured to control power to a load; and a controller
coupled to the electrical switching device. The electrical
switching device and the controller are substantially encapsulated by the case. Functionality of the module can be
exposed through a communication interface in the case.

37 Claims, 28 Drawing Sheets

(56) References Cited

U.S. PATENT DOCUMENTS

| | | | |
|---|---|---|---|
| 4,835,502 A | 5/1989 | Minnette | |
| 5,258,889 A | 11/1993 | Belanger, Jr. | |
| 5,335,135 A | 8/1994 | Kinney | |
| 5,338,908 A | 8/1994 | Rahman et al. | |
| 5,359,486 A | 10/1994 | Crane et al. | |
| 5,644,463 A | 7/1997 | El-Sharkawi et al. | |
| 5,784,285 A | 7/1998 | Tamaki et al. | |
| 5,930,104 A | 7/1999 | Kadah et al. | |
| 5,936,495 A * | 8/1999 | LeCourt | 335/6 |
| 5,971,597 A | 10/1999 | Baldwin et al. | |
| 6,002,313 A | 12/1999 | Mrenna et al. | |
| 6,188,181 B1 | 2/2001 | Sinha et al. | |
| 6,198,063 B1 | 3/2001 | Kramer | |
| 6,222,448 B1 * | 4/2001 | Beck et al. | 340/506 |
| 6,232,855 B1 | 5/2001 | Malingowski et al. | |
| 6,233,132 B1 | 5/2001 | Jenski | |
| 6,285,157 B1 * | 9/2001 | Hain et al. | 318/809 |
| 6,456,511 B1 | 9/2002 | Wong | |
| 6,497,656 B1 | 12/2002 | Evans et al. | |
| 6,512,682 B2 | 1/2003 | Cohen et al. | |
| 6,525,542 B2 | 2/2003 | Price | |
| 6,633,823 B2 | 10/2003 | Bartone et al. | |
| 6,693,395 B2 | 2/2004 | Wilhelm | |
| 6,741,442 B1 | 5/2004 | McNally et al. | |
| 6,768,615 B2 | 7/2004 | Liu | |
| 6,897,760 B2 | 5/2005 | Kawata et al. | |
| 6,903,554 B2 | 6/2005 | Wilson et al. | |
| 6,993,417 B2 | 1/2006 | Osann, Jr. | |
| 7,046,716 B1 | 5/2006 | Miao | |
| 7,110,225 B1 | 9/2006 | Hick | |
| 7,141,891 B2 | 11/2006 | McNally et al. | |
| 7,171,461 B2 | 1/2007 | Ewing et al. | |
| 7,196,900 B2 | 3/2007 | Ewing et al. | |
| 7,236,338 B2 | 6/2007 | Hale et al. | |
| 7,368,830 B2 | 5/2008 | Cleveland et al. | |
| 7,492,062 B1 * | 2/2009 | Wristen et al. | 307/113 |
| 7,538,645 B2 | 5/2009 | Nishi et al. | |
| 7,656,626 B2 * | 2/2010 | Carton et al. | 361/42 |
| 2001/0039626 A1 | 11/2001 | Jauert | |
| 2003/0062990 A1 | 4/2003 | Schaeffer, Jr. et al. | |
| 2003/0161279 A1 | 8/2003 | Sherman | |
| 2004/0034484 A1 | 2/2004 | Solomita et al. | |
| 2004/0054905 A1 | 3/2004 | Reader | |
| 2004/0155722 A1 | 8/2004 | Pruchniak | |
| 2005/0147071 A1 | 7/2005 | Karaoguz et al. | |
| 2005/0185669 A1 | 8/2005 | Welborn et al. | |
| 2005/0203987 A1 | 9/2005 | Ewing et al. | |
| 2005/0243787 A1 | 11/2005 | Hong et al. | |
| 2006/0007627 A1 | 1/2006 | Lewis | |
| 2006/0094461 A1 | 5/2006 | Hameed et al. | |
| 2006/0259538 A1 | 11/2006 | Ewing et al. | |
| 2007/0076340 A1 | 4/2007 | Ewing et al. | |
| 2007/0081505 A1 | 4/2007 | Roberts | |
| 2007/0112939 A1 | 5/2007 | Wilson et al. | |
| 2007/0114953 A1 * | 5/2007 | Kim et al. | 315/307 |
| 2007/0121265 A1 * | 5/2007 | Hill et al. | 361/62 |
| 2007/0130243 A1 | 6/2007 | Ewing et al. | |
| 2007/0136453 A1 | 6/2007 | Ewing et al. | |
| 2007/0140238 A1 | 6/2007 | Ewing et al. | |
| 2007/0198748 A1 | 8/2007 | Ametsitsi | |
| 2008/0016452 A1 * | 1/2008 | Pincus | 715/763 |
| 2008/0019063 A1 | 1/2008 | Muller et al. | |
| 2008/0019068 A1 | 1/2008 | Reynolds et al. | |
| 2008/0112097 A1 | 5/2008 | Maharsi | |
| 2008/0136261 A1 | 6/2008 | Mierta | |
| 2009/0021213 A1 | 1/2009 | Johnson | |
| 2009/0185333 A1 * | 7/2009 | Coomer et al. | 361/622 |
| 2009/0259603 A1 | 10/2009 | Housh et al. | |
| 2009/0285189 A1 | 11/2009 | Kim et al. | |
| 2012/0207481 A1 * | 8/2012 | Elberbaum | 398/113 |

FOREIGN PATENT DOCUMENTS

| | | |
|---|---|---|
| JP | 2008-302771 | 12/2008 |
| WO | 9010942 A1 | 9/1990 |
| WO | 0182321 A1 | 1/2001 |
| WO | 2006091565 A2 | 8/2006 |
| WO | 2008102147 A1 | 8/2008 |

OTHER PUBLICATIONS

Leviton, Product Data "Z-MAX Relay Cards," 2009, 2 pages.
Lighting Controls, "Lighting Control & Design—Product Catalog," Oct. 2008, 100 pages.
SVEA Building Control Systems—LON I/O Module REG-M DIM 1-10V, May 16, 2007, 4 pages.
Wattsupmeters, Smart Circuit, "Electricity Controller—Applications," Mar. 30, 2010, 2 pages.
Wattsupmeters, Smart Circuit, "Methodology for Commercial Applications," Mar. 30, 2010, 2 pages.
Wattsupmeters, Smart Circuit, "The Intelligent Electricity Monitor that can Measure and Switch Loads via the Internet," Mar. 30, 2010, 2 pages.
Wattsupmeters, Smart Circuit, "20 AMP Internet Enabled Electricity Controller," Product Information, 2005, 2 pages.
U.S. Appl. No. 12/751,993, filed Mar. 31, 2010, 87 pages.
Written Opinion and International Search Report for PCT/US2010/044022, dated Feb. 24, 2011, 10 pages.
ADMMicro EMS, "Controllers," 2006, 1 page.
ADMMicro, "What We Do," Controllers, 2006, 3 pages.
Architectural Lighting Magazine, "Load Shedding and Lighting: The New Frontier," printed Mar. 20, 2009, 2 pages.
E-Mon, Energy Monitoring Products, E-Mon D-Mon Metering Products, printed Jul. 7, 2009, 1 page.
I.M.S. Industrial Measurement Systems Ltd., "General Information," 2006, 2 pages.
Leviton, "Architectural Lighting Controls," 2007, 39 pages.
Lutron, "Quantum—Whole-Building Light Management Solution," Apr. 30, 2009, 28 pages.
Quad Logic: Power Line Communications Technology, "Where There is Power . . . Quadlogic Brings You Knowledge," 2008, 2 pages.
Shadowmetering, "About Shadow Metering Inc. Jacksonville, Florida," 2009, 1 page.
Site Controls: Products and Services, "The Site-Command Platform," 2009, 1 page.
Wattsupmeters, "Smart Circuit—The Intelligent Electricity Monitor that Can Measure and Switch Loads via the Internet, Sep. 2005," 6 pages.
Society of Automotive Engineers, Inc., Surface Vehicle Recommended Practice, 2001, 32 pages.
GM Electric Power/Advanced Systems, "Plug-In Electric Vehicles—Standards," Ontario Smart Grid Forum, Oct. 14, 2008, 17 pages.
RS485 serial information, http://www.lammertbies.nl/comm/info/RS-485.html; printed from Internet on Jul. 27, 2011; 3 pages.

* cited by examiner

ELECTRICAL SWITCHING MODULE

CROSS-REFERENCE TO RELATED APPLICATIONS

This application is a continuation-in-part of application Ser. No. 12/618,497, filed Nov. 13, 2009, the contents of which are herein incorporated by reference in their entirety.

BACKGROUND

Electrical switching devices such as relays and circuit breakers can be placed on a circuit board with electronics to actuate the electrical switching device. For example, the circuit board can include a first set of terminals for line and load wiring. Another set of terminals can receive an input for actuation of the relay. However, control electronics, monitoring, or the like are implemented on a different circuit board or module.

Electrical switching devices such as relays and circuit breakers are often encapsulated in cases to protect the operating mechanisms from dust, moisture and other environmental conditions, and to prevent technicians and others from contacting live electrical parts. Certain operating conditions may cause a blast or build-up of hot, pressurized gases and other materials within the case. For example, short circuits may cause contacts in relays or circuit breakers to melt or explode, thereby releasing hot gases and molten metal. As another example, an over current condition may cause the contacts in a circuit breaker to open, which may in turn, create a momentary arc between the contacts. The arc releases a blast of ionized air.

If the blast is not vented from inside the case, it may damage, destroy or interfere with the operation of the electrical device and/or cause the case to rupture, thereby scattering dangerous blast products. Thus, cases for electrical switching devices are often provided with a vent in the top or side of the case to enable a short circuit or other type of blast to escape from within the case. While venting the case may solve certain problems with the electrical switching device, it often causes other problems. For example, in an electrical enclosure housing multiple components, a blast from one device may be directed at another device, which in turn is damaged or destroyed by the blast. In addition, within the electrical switching device, the blast can short high voltage terminals with low voltage circuitry, creating a potential hazard.

Some other previous efforts to accommodate a blast from an electrical switching device have involved the use of complicated systems of baffles or dividers between components to direct the blast from one component away from other components. These systems, however, add cost and complexity, and may still create hazardous conditions.

DETAILED DESCRIPTION

Figure 1:
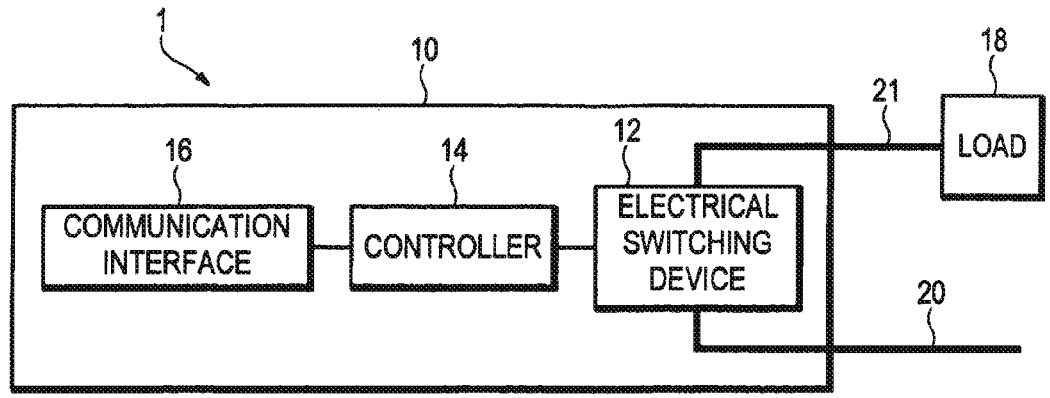
FIG. 1 illustrates an embodiment of an electrical switching module according to some inventive principles of this patent disclosure.

FIG. 1 illustrates an embodiment of an electrical switching module according to some inventive principles of this patent disclosure. In this embodiment, the module 1 includes a case 10. The case 10 substantially encapsulates an electrical switching device 12 and a controller 14. The electrical switching device 12 can be a relay, a circuit breaker, a switch, or any other type of device or combination of devices that can control current to a load 18. The electrical switching device 12 can be an air-gap relay, a solid-state relay, a combination of such relays, or the like. In particular, in an embodiment, the electrical switching device 12 can be configured to be coupled to line wiring 20. Load wiring 21 can couple the electrical switching device 12 to the load 18.

The controller 14 can include a processor or processors such as digital signal processors, programmable or non-programmable logic devices, microcontrollers, application specific integrated circuits, state machines, or the like. The controller 14 can also include additional circuitry such as memories, input/output buffers, transceivers, analog-to-digital converters, digital-to-analog converters, or the like. In yet another embodiment, the controller 14 can include any combination of such circuitry. Any such circuitry and/or logic can be used to implement the controller 14 in analog and/or digital hardware, software, firmware, etc., or any combination thereof.

The controller 14 is coupled to the electrical switching device 12. Accordingly, the controller 14 can be configured to monitor the electrical switching device 12. For example, the controller 14 can be configured to sense aspects associated with the electrical switching device 12 such as current, voltage, amplitude, frequency, or the like. The controller 14 can be configured to actuate the electrical switching device 12. As the electrical switching device 12 and the controller 14 are substantially encapsulated by the case 10, higher level functionality can be presented to a user of the module 1.

In an embodiment, the module 1 can also include a communication interface 16. The communication interface 16 can include any variety of interfaces. For example the communication interface 16 can include a wired or wireless interface. The communication interface 16 can include a serial interface or a parallel interface. In an embodiment, a MODBUS interface can be used. In another embodiment, an Ethernet interface, controller area network interface, or the like can be used.

Accordingly, the controller 14 can be configured to communicate monitored parameters, expose functionality of the electrical switching device 12, provide functionality beyond actuation for the electrical switching device 12, or the like to a user. Thus, the module 1 can present more functionality beyond switching control.

Moreover, although a communication network such as a controller area network, a MODBUS network, or the like can be used, a more general purpose network can be used. For example, as described above the communication interface 16 can include an Ethernet interface. Each module could have a globally unique address, such as an IPv6 address. Thus, each module could be individually accessible, controllable, monitorable, or the like from an arbitrary location or system.

Figure 2:
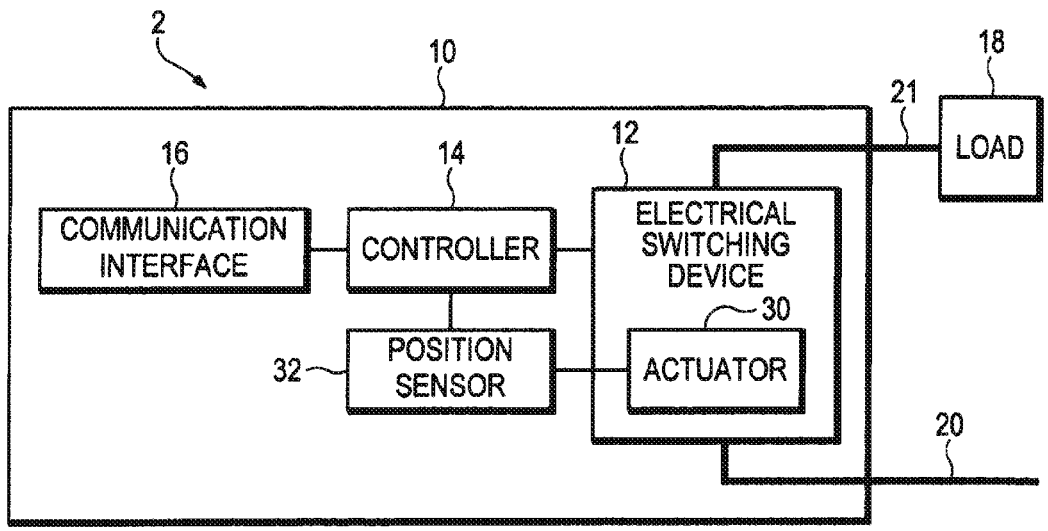
FIG. 2 illustrates an embodiment of an electrical switching module with a position sensor according to some inventive principles of this patent disclosure.

FIG. 2 illustrates an embodiment of an electrical switching module with a position sensor according to some inventive principles of this patent disclosure. In this embodiment, the electrical switching device 12 includes an actuator 30. The actuator 30 can include a mechanism coupled to a contact of the electrical switching device 12.

In an embodiment, the actuator 30 can be a manual actuator. The manual actuator can be operable by a user to actuate the electrical switching device 12. For example, the manual actuator can be accessible through the case 10, coupled to a structure accessible through the case 10 and coupled to the electrical switching device 12, or the like. For example, a lever of the electrical switching device 12 can be moved to actuate the electrical switching device 12. The lever of the electrical switching device 12 can be coupled to another lever that is operable through the case 10. However, in other embodiments, other manual controls such as buttons, knobs, switches, or the like can be used.

The module 2 can include a position sensor 32. The position sensor is configured to sense a state of the electrical switching device 12. A state of the electrical switching device 12 can include open, closed, fault, transitioning, or the like. For example, the position sensor 32 can be coupled to a manual actuator. The position sensor 32 can be configured to sense a position of the manual actuator. In another embodiment, the position sensor 32 can be coupled to the electrical switching device 12 regardless of the presence of a manual actuator to sense the state.

The position sensor 32 can include a variety of sensors. For example, a photointerruptor can be used as a position sensor 32. A manual actuator can be coupled to the photointerruptor such that an actuation of the manual actuator can actuate the photointerruptor in response to the state of the electrical switching device 12.

In another example, a mechanical contact sensor that makes or breaks an electrical circuit can be used. In yet another example, a digital position encoder can be used to sense the position of a structure of the electrical switching device 12. Any sensor that can sense position, movement, acceleration, or the like can be used. That is, the position sensor 32 can be configured to sense more than position, unable to sense actual position but infer position from velocity, or the like. The electrical switching device 12 can be coupled to any of these position sensors 32 such that the state of the electrical switching device 12 can be sensed.

Figure 3:
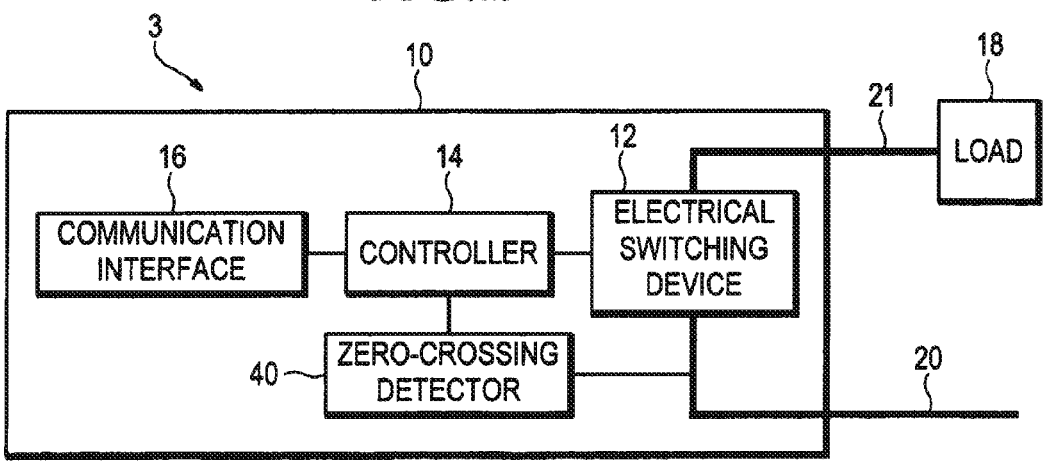
FIG. 3 illustrates an embodiment of an electrical switching module with a zero-crossing detector according to some inventive principles of this patent disclosure.

FIG. 3 illustrates an embodiment of an electrical switching module with a zero-crossing detector according to some inventive principles of this patent disclosure. In this embodiment, the module 3 includes a zero-crossing detector 40. The zero-crossing detector 40 is configured to detect a zero-crossing associated with the electrical switching device 12.

For example, with an alternating current (AC) line voltage on the line wiring 20, the instantaneous voltage across the electrical switching device 12 can vary around zero volts. As illustrated the zero-crossing detector 40 is coupled to the line wiring 20. Accordingly, the zero-crossing detector 40 can be configured to detect a zero-crossing of the voltage on the line wiring.

In another embodiment, the zero-crossing can be a current zero-crossing. The zero-crossing detector 40 can be configured to sense such a current zero-crossing. Accordingly, the zero-crossing detector 40 can be configured to detect a variety of zero-crossings. Moreover, the zero-crossing detector 40 can be configured to detect multiple zero-crossings. For example, depending on the load 18, the zero-crossing of the current can, be out of phase with the voltage zero-crossing. The zero-crossing detector 40 can be configured to sense both voltage and current zero-crossings. Furthermore, although the zero-crossing detector 40 is illustrated coupled to the line wiring 20 coupled to the electrical switching device 12, the zero-crossing detector 40 can be coupled to any appropriate circuitry to sense the corresponding zero-crossings.

The zero-crossing detector 40 can be coupled to the controller 14. Accordingly, the controller 14 can be configured report the zero-crossings, operate in response to the zero-crossings, or the like. For example, as will be described in further detail below, the controller 14 can be configured to actuate the electrical switching device 12 in response to the zero-crossing detector 40.

Figure 4:
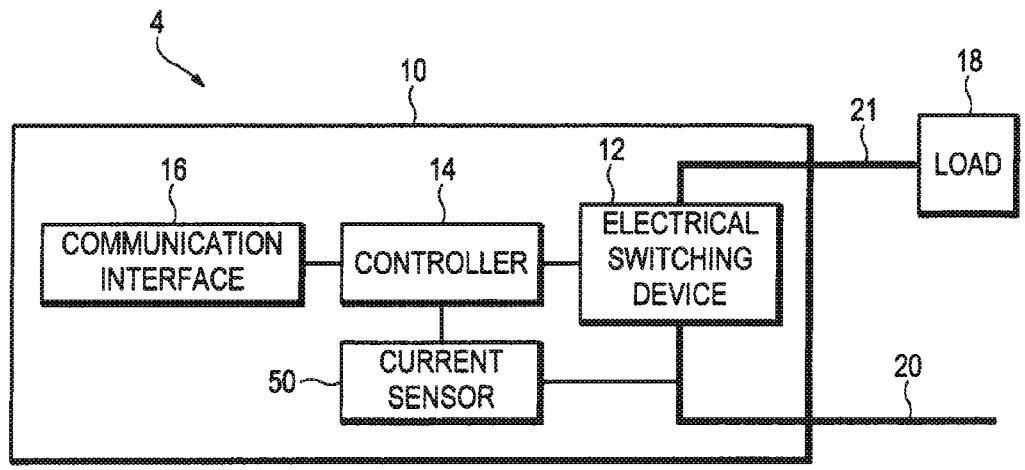
FIG. 4 illustrates an embodiment of an electrical switching module with a current sensor according to some inventive principles of this patent disclosure.

FIG. 4 illustrates an embodiment of an electrical switching module with a current sensor according to some inventive principles of this patent disclosure. In this embodiment, the module 4 includes a current sensor 50. The current sensor 50 is configured to sense a current passing through the electrical switching device 12. Moreover, the current sensor 50 can be configured to sense other currents associated with the electrical switching device 12. For example, a current used in energizing a coil of the electrical switching device 12 can be measured.

The current sensor 50 can be a variety of devices. For example, the current sensor can be a hall-effect sensor, an inline current sensor, or the like. The current sensor 50 can be coupled to the controller 14. Accordingly, the controller 14 can be configured to report the sensed current, operate in response to the sensed current, or the like.

Figure 5:
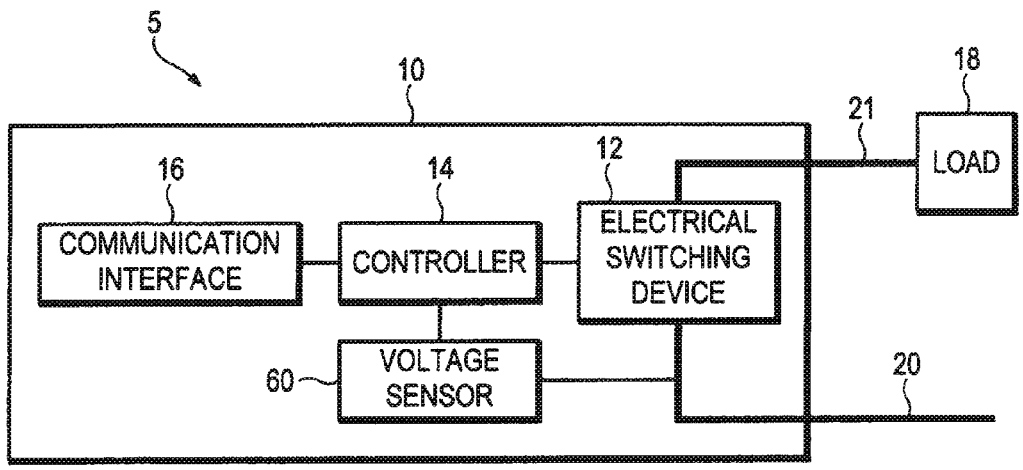
FIG. 5 illustrates an embodiment of an electrical switching module with a voltage sensor according to some inventive principles of this patent disclosure.

FIG. 5 illustrates an embodiment of an electrical switching module with a voltage sensor according to some inventive principles of this patent disclosure. In this embodiment, the module 5 includes a voltage sensor 60. The voltage sensor 60 is coupled to the electrical switching device 12. The voltage sensor 60 can be configured to sense a voltage associated with the electrical switching device 12. For example, as illustrated, the voltage sensor 60 can be configured to sense a voltage on line wiring 20 coupled to the electrical switching device 12. Alternatively, the voltage sensor can be configured to sense a voltage on the load wiring 21, a power supply for driving the actuation of the electrical switching device 12, or the like. The voltage sensor 60 can be configured to sense any voltage associated with the electrical switching device 12.

The voltage sensor 60 can include any variety of voltage sensors. For example, the voltage sensor 60 can be single ended or differential. The voltage sensor 60 can sense direct current (DC) or alternating current (AC) voltages. The voltage sensor 60 can have a single input or multiple inputs.

In another embodiment the voltage sensor 60 can include conditioning circuitry to transform the monitored voltage into a voltage suitable for digitizing by the controller 14. For example, the voltage sensor 60 can include rectification and scaling to transform a 120 VAC voltage into a 2.5 VDC voltage, or the like. Accordingly, an analog to digital converter of the controller 14 can sense the 2.5 VDC voltage.

In an embodiment, the sensing of various voltages, currents, and the like within the case 10 of the module can allow power measurement at a module level resolution. For example, multiple modules can be installed within a load center, electrical cabinet, or the like. Each module can monitor the current and voltage associated with the electrical switching device 12. Accordingly, the power delivered to each load 18 can be monitored. The controller 14 can be configured to monitor such measurements, record such measurements, report the measurements to a system master or user, or the like.

Figure 6:
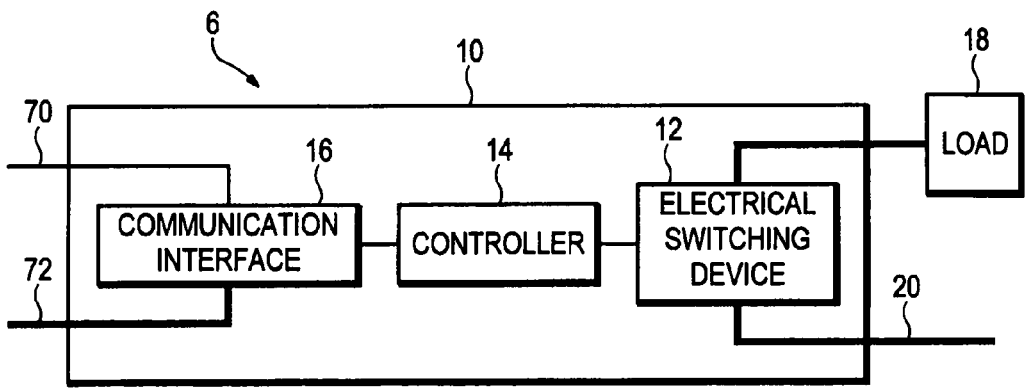
FIG. 6 illustrates an embodiment of an electrical switching module with a communication interface according to some inventive principles of this patent disclosure.

FIG. 6 illustrates an embodiment of an electrical switching module with a communication interface according to some inventive principles of this patent disclosure. In this embodiment, the communication interface 16 is coupled to a terminal 70. The communication interface 16 is also coupled to communication terminals 72. The communication terminals include terminals over which communication signals are transmitted.

In this embodiment, the terminal 70 is separate from the communication terminals 72. When installed in a mounting site, a voltage can appear on the terminal 70. The voltage can correspond to a parameter of the communication interface. For example, the voltage can be interpreted into data associated with the communication interface.

In an embodiment, each mounting site for a module 6 within a cabinet, panel, or other enclosure can have a different voltage appear at a connection for the associated terminal 70. The controller 14 can be configured to determine an address for the module 6 in response to the voltage. Thus, each module 6 can have a unique address resulting from a unique voltage. As a result, substantially identical modules 6 can be installed in substantially identical mounting sites within an enclosure yet each module can be addressed individually.

Although a voltage has been described as being present on the terminal, another aspect of the terminal can be used. For example, a current, an AC amplitude, a digital signal, or the like can be sensed.

Although a single terminal 70 has been described multiple terminals 70 can be used. For example, a cabinet can be divided into multiple regions with each region including mounting sites for multiple modules. A first terminal 70 can be used as described above to determine a first voltage. A second terminal 70 can be used to determine a second voltage. The combination of the two voltages can be used to select a unique address. In another example, the states of eight terminals 70 can form an eight bit value for use in determining an address. Any number of terminals 70 can be used to detect any number of signals to define the parameters of the communication interface 16.

Although an address has been used as an example of a parameter for a communication interface 16, a parameter can include other aspects of the communication interface 16. For example, a parameter can include a type of communication network, a master/slave indication, or the like.

Although the communication interface 16 has been illustrated in each of FIGS. 1-6, a module need not have a communication interface 16, yet can still have the various other circuitry and functionality described above. For example, the various circuitry described above can be used in monitoring an electrical switching device for a fault. Such a fault, the underlying information generating the fault, or the like can, but need not, be communicated through a communication interface. Rather, such a fault can be communicated to a user through a different user interface. For example, the state of a manual actuator can be changed to indicate the fault. In another example, another user interface within the module, such as a light emitting diode (LED) can be illuminated to indicate the fault, the type of fault, or the like. Moreover, a fault need not be the only state communicated through such a user interface.

Accordingly, the module can act as a stand alone module without any external processing monitoring, or the like. Information about the module, the electrical switching device 12, or the like can be provided to a user beyond mere on, off, and tripped states, or the like.

Figure 7:
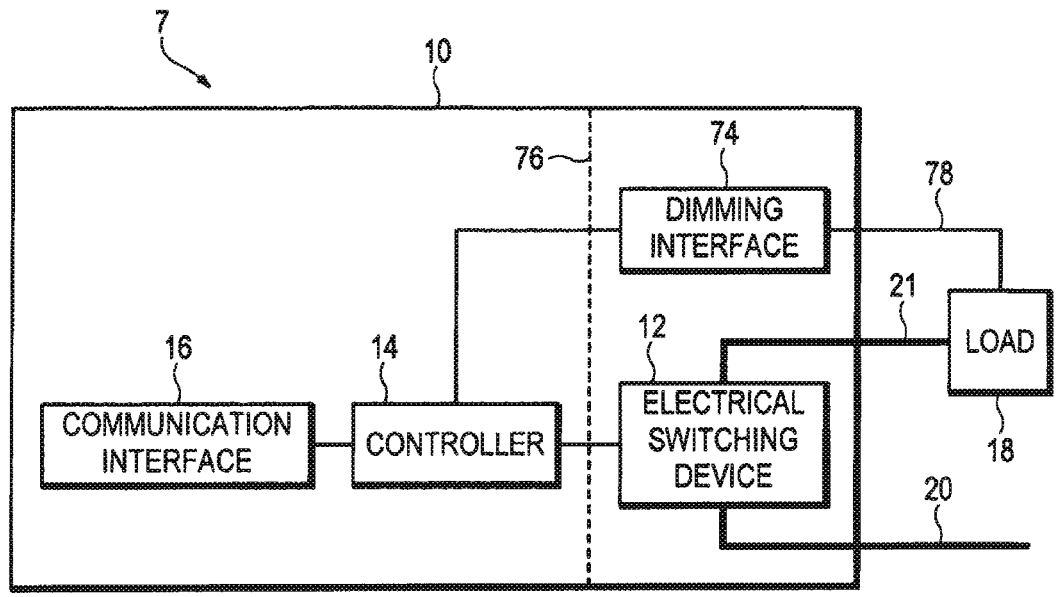
FIG. 7 illustrates an embodiment of an electrical switching module with a dimming interface according to some inventive principles of this patent disclosure.

FIG. 7 illustrates an embodiment of an electrical switching module with a dimming interface according to some inventive principles of this patent disclosure. In this embodiment, the module 7 includes a dimming interface 74. The dimming interface 74 can be any variety of dimming interfaces. For example, the dimming interface 74 can be a digital addressable lighting interface (DALI), a 0-10V load interface, a digital signal interface (DSI), or any other interface for dimming control.

In addition, in an embodiment, the dimming interface can be disposed in a region of the module 7 along with the electrical switching device 12. For example, the electrical switching device 12 can be wired as a class 1 device. The dimming interface 74 can also be wired as a class 1 device even though it has an interface to the controller 14. That is, even though the controller 14 is disposed in a region of the module, such as a class 3 region, the connection to the dimming interface 74 across the boundary 76 can be formed such that the electrical regions are appropriately isolated.

Although a variety of individual elements of a module have been described above, a given module can include any combination of such elements. Moreover, any variety of different modules can be used in concert as the communication interface 16 can be configured to allow the controller 14 to be interrogated for its capabilities.

Figure 8:
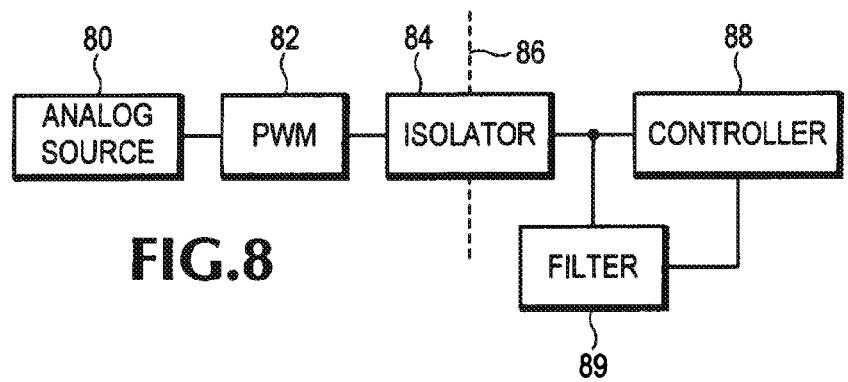
FIG. 8 illustrates an analog signal measurement circuit capable of signal transmission across a voltage boundary according to some inventive principles of this patent disclosure.

FIG. 8 illustrates an analog signal measurement circuit capable of signal transmission across a voltage boundary according to some inventive principles of this patent disclosure. As described above, a variety of voltages, currents, signals, or the like can be monitored. Such parameters can be transformed into an analog signal suitable for communication. For example, an amplitude of a 120VAC signal can be converted into a 2.5 VDC signal. The analog source 80 represents such circuitry, coupling, or the like to obtain such a signal.

Once obtained, the analog signal can be used to modulate a pulse width. Pulse width modulated (PWM) signal generator 82 can be configured to generate a PWM signal having a pulse width corresponding to the analog signal. For example, the pulse width can correspond to a voltage measured by a voltage sensor 60, current sensor 50, described above, or the like. An isolator 84 can span a boundary 86 between a first voltage region and a second voltage region. For example, a class 1 region and a class 3 region can be separated by the boundary 86. The isolator can allow a signal to cross the boundary, yet maintain the isolation. The isolator 84 can be any variety of isolator. For example, an optoisolator, a transformer, or the like can be used as an isolator 84.

The PWM signal can be propagated across the boundary 86 through the isolator. In particular, as the information contained within the PWM signal is the pulse width, a variation in amplitude of the PWM signal has a reduced if not negligible effect on a quality of the transmitted signal. However, any aging, degradation, or the like of the isolator 80 can have a reduced effect on the recovered analog signal.

In this embodiment, a controller 88 and a filter 89 are both illustrated as receiving the PWM signal. Thus, the filter 89 can be configured to filter the PWM signal to another analog signal. In an embodiment, the recovered analog signal can, but need not, be substantially identical to the original analog signal. That is, the recovered analog signal can be scaled differently, include an offset, or the like.

In addition, the controller 88 can receive the PWM signal. As will be described in further detail below, additional information beyond the analog signal can be communicated through the PWM signal. However, the controller 88 can also be configured to recover the analog signal from the PWM signal. For example, the controller can be configured to measure a pulse width of the PWM signal. Thus, the encoded analog signal can be recovered.

Figure 9:
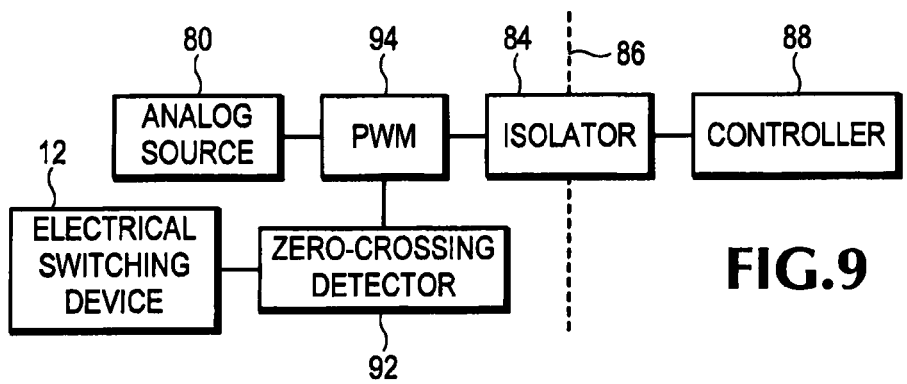
FIG. 9 illustrates the circuit of FIG. 8 with a zero-crossing detector according to some inventive principles of this patent disclosure.

FIG. 9 illustrates the circuit of FIG. 8 with a zero-crossing detector according to some inventive principles of this patent disclosure. In this embodiment, the PWM signal generator 94 is coupled to a zero-crossing detector 92. The zero-crossing detector 92 is configured to detect a zero-crossing associated with an electrical switching device 90.

The PWM signal generator 94 is configured to generate a PWM signal having a pulse width corresponding to the analog signal. However, the PWM signal generator 94 is also configured to generate a PWM signal in response to the zero-crossing detector 92. For example the PWM signal can be substantially synchronized with zero-crossings detected by the zero-crossing detector 92. Thus, the PWM signal that is propagated through the isolator 84 has two distinct sets of information encoded within. That is, the analog signal and the zero-crossings are encoded in a single PWM signal.

In particular, in an embodiment the time of the zero-crossing can be represented by an edge of the PWM signal. For example, each rising edge can be substantially coincident with a zero-crossing However, in an embodiment, the detected zero-crossing can be offset in time, phase, or the like from the actual zero-crossing. Accordingly, the PWM signal can be adjusted, the processed PWM signal can be adjusted, or the like to identify the actual zero-crossing.

As described above, the controller 88 can be configured to sense the analog signal within the PWM signal. In addition, the controller 88 can be configured to sense a zero-crossing from the PWM signal. For example, the controller 88 can include an edge triggered interrupt responsive to rising edges. Thus, the controller 88 can receive an interrupt for each zero-crossing.

Figure 10:
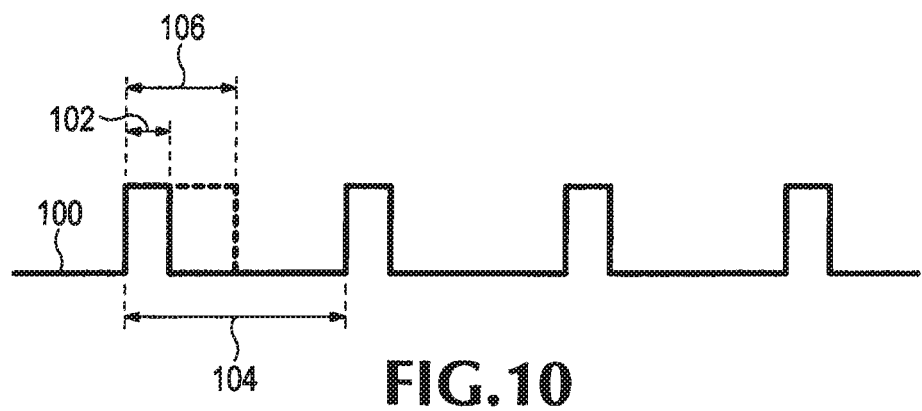
FIG. 10 illustrates a pulse width modulated pulse train synchronized with a zero-crossing according to some inventive principles of this patent disclosure.

FIG. 10 illustrates a pulse width modulated pulse train synchronized with a zero-crossing according to some inventive principles of this patent disclosure. The pulse train 100 has a series of pulses having a width 102. The pulses occur with a period 104. As described above, the pulse width can encode an analog signal. Pulse width 106, illustrated in phantom, illustrates a different pulse width corresponding to a different level of the analog signal.

As illustrated the pulse with width 102 and the pulse with width 106 share a common rising edge. Thus, regardless of the pulse width, assuming it is not substantially 0% or 100% of the period 104, a rising edge can occur substantially coincident with the zero-crossing. That is, the period 104 can convey a separate piece of information, such as the zero-crossing described above.

In an embodiment, multiple zero-crossings can be communicated through multiple PWM signals. Although a single zero-crossing detector 92 has been described above, the zero-crossings detected by the zero-crossing detector 92 can, but need not, be the only zero-crossings detected. For example, a zero-crossing of a current through electrical switching device 12 may be out of phase with a zero-crossing of a voltage coupled to the electrical switching device 12.

Accordingly, a first PWM signal can be substantially synchronized with a first zero-crossing signal. A second PWM signal can be substantially synchronized with a second zero-crossing signal. Thus, any number of different zero-crossing signals can be communicated across a voltage region boundary as desired.

Although the PWM signal has been described as substantially synchronized with zero-crossings, such synchronization can, but need not, include substantially similar frequencies. For example, a voltage zero-crossing can occur in a 60 Hz signal at 120 Hz. However, the PWM signal can be synchronized to 60 Hz, 30 Hz, or the like. Similarly, the PWM signal can be synchronized to a higher frequency, such as 240 Hz, 480 Hz, or the like. However, in such circumstances, an additional signal may be used to determine which edges of the PWM signal are substantially coincident with a zero-crossing.

Figure 11:
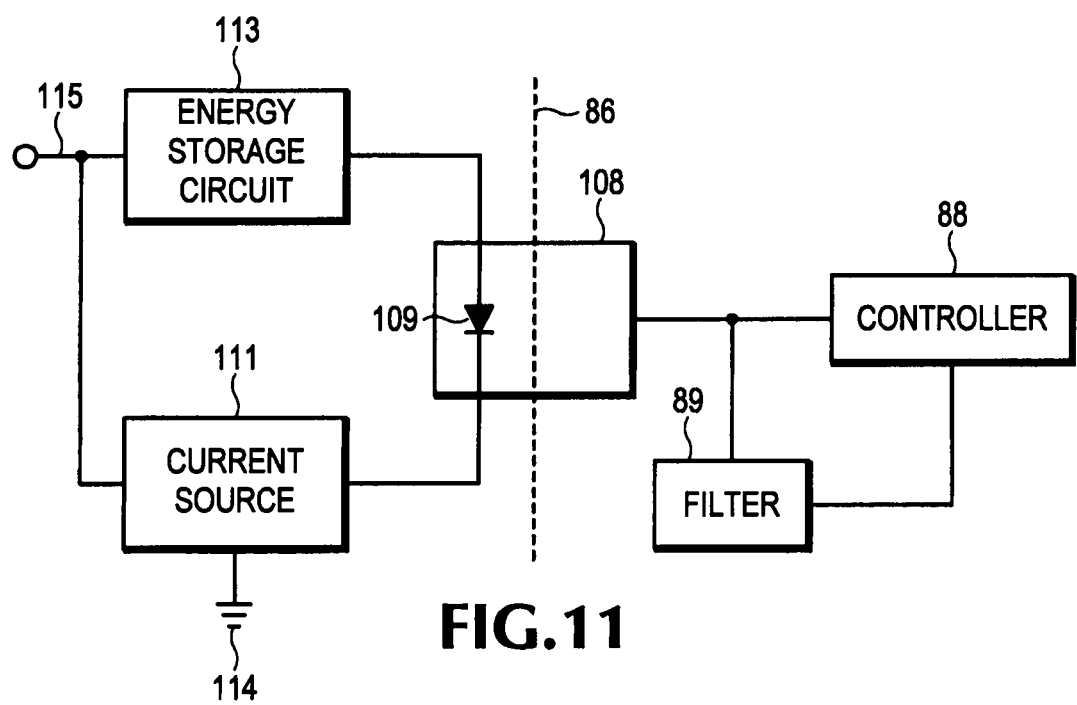
FIG. 11 illustrates an embodiment of a combined signal measurement circuit and zero crossing detector according to some inventive principles of this patent disclosure.

FIG. 11 illustrates an embodiment of a combined signal measurement circuit and zero crossing detector according to some inventive principles of this patent disclosure. In this embodiment, the circuit includes an isolator 108 spanning the boundary 86. The isolator 108 has an actuator 109. The actuator 109 is illustrated as an LED; however, other actuators can be used according to the type of the isolator 108.

The actuator 109 is coupled in series with a charge storage circuit 113 and a current source 111. In an embodiment, at least one of the charge storage circuit 113 and the current source is responsive to the line voltage 115. For example, the current source 111 can be configured to source or sink a current during substantially only one half-cycle of the line voltage 115. In another example, the charge storage circuit 113 can be configured to charge during substantially only one half-cycle of the line voltage 115.

In yet another example, both the current source and charge storage circuit can be configured to operate during such half-cycles, but on opposite half cycles. Using this example, on a positive half-cycle, the charge storage circuit 113 can be configured to charge to a voltage corresponding to the line voltage 115. The current source 111 can be configured to not sink current during the positive half-cycle. As a result, the charge in the charge storage circuit 113 can remain substantially charged.

In the negative half-cycle, the charge storage circuit 113 can be configured to not charge. The current source 111 can be configured to sink a current. Thus, the charge storage circuit 113 can be discharged through the actuator 109, actuating the isolator 108. Since the charge in the charge storage device 113 corresponds to the line voltage 115, the discharge time can correspond to the line voltage 115. Thus, the time that the isolator 108 is actuated corresponds to the line voltage 115. In addition, since the discharge of the charge storage circuit 113 can begin on a transition from the positive half-cycle to the negative half-cycle, the beginning of the actuation of the isolator 108 corresponds to the zero-crossing of the line voltage 115.

Although the line voltage 115 has been used as an example of a signal that can be used with the circuit, a line current, or other periodic signal could similarly be used. Furthermore, although a particular description of sourcing or sinking current has been used, current can be controlled in the appropriate direction. Moreover, the orientation of the various components can change based on the polarity of voltages, currents, components or the like.

Figure 12:
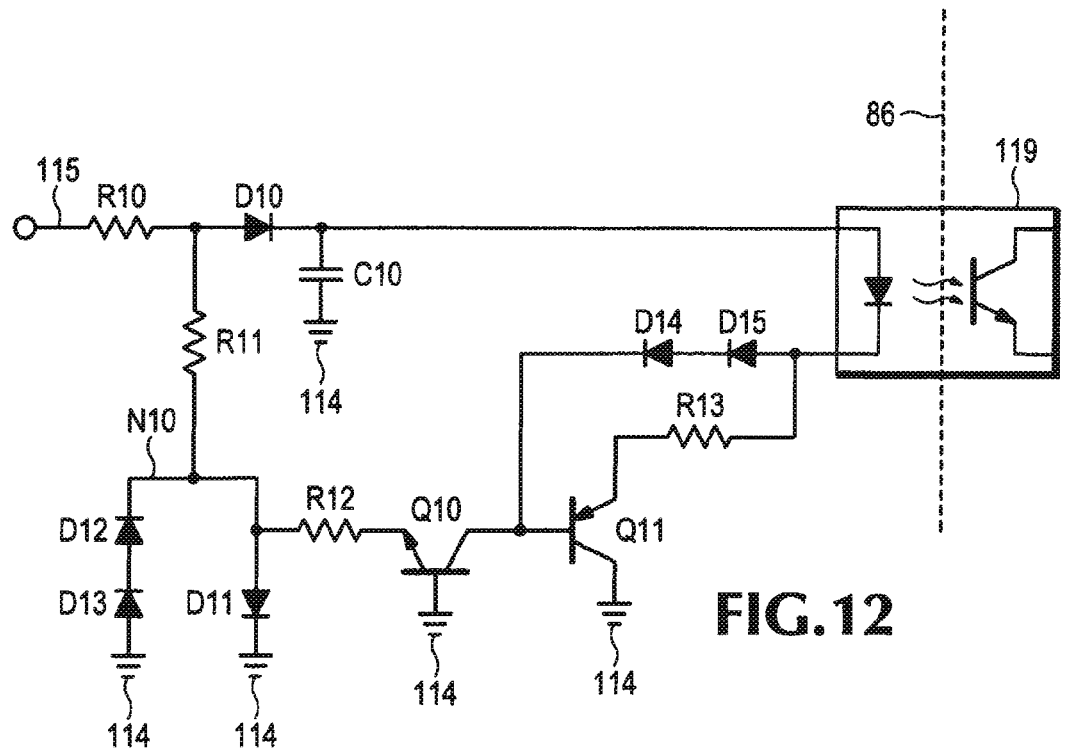
FIG. 12 illustrates another embodiment of a combined signal measurement circuit and zero crossing detector according to some inventive principles of this patent disclosure.

FIG. 12 illustrates another embodiment of a combined signal measurement circuit and zero crossing detector according to some inventive principles of this patent disclosure. In this embodiment, when the line voltage 115 is in a positive half-cycle, a voltage divider is created with resistors R10, R11, and diode D11. This voltage can charge capacitor C10 through diode D10.

When diode D11 is conducting, node N10 will be substantially at one diode voltage drop. Accordingly, the base-emitter junction of transistor Q10 will be reverse biased, turning off transistor Q10. As a result, no current will flow through the LED D16 of the isolator 119, allowing capacitor C10 to charge.

When the line voltage 115 transitions to the negative half-cycle, node N10 will be pulled down two diode voltage drops below the neutral 121. As a result, transistor Q10 will turn on, allowing diodes D14 and D15 to conduct and turn on transistor Q11. A substantially constant current can then flow through LED D16. Since diode D10 is now reverse biased, capacitor C10 can stop charging through diode D10. LED D16 can remain on until the charge on the capacitor C10 is discharged substantially. Thus, the LED D16 will remain on a time according to the line voltage 115 and will turn on substantially at the transition from the positive half-cycle to the negative half-cycle.

Figure 13:
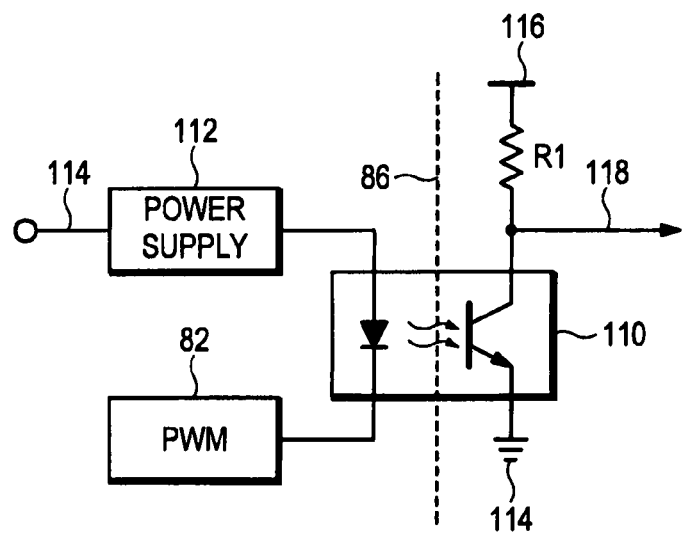
FIG. 13 illustrates a circuit spanning a voltage region boundary according to some inventive principles of this patent disclosure.

FIG. 13 illustrates a circuit spanning a voltage region boundary according to some inventive principles of this patent disclosure. In this embodiment, the isolator is an optoisolator 110 with a light emitting diode (LED) and a phototransistor. The LED is coupled between a power supply 112 and a PWM signal generator 82. In an embodiment, the power supply 112 is coupled to a line voltage 117. Accordingly, the LED can be switched on and off according to a PWM signal.

The phototransistor is coupled to a resistor R and a ground 114. The resistor R is coupled to a power supply 116. As the phototransistor is alternately turned on an off by the actuated LED, the node 118 is alternately pulled up by the resistor R and pulled down by the phototransistor. Thus, the PWM signal can be propagated across the boundary 86. Although in this embodiment, the PWM signal that is propagated corresponds to the generated PWM signal, the components, connections, or the like can be selected such that the PWM signal on node 118 can be inverted when crossing the boundary 86.

In an embodiment, the power supply 112 can receive a line voltage from a line terminal 114. The power supply 112 can be configured to generate a power voltage for the LED of the optoisolator. The LED of the optoisolator 110 can have a threshold voltage below which the LED will not substantially actuate the optoisolator 110. The power supply 112 can be configured such that at a minimum specified voltage of the line voltage, the power voltage is substantially equal to the threshold voltage of the LED. That is, if the line voltage is below the minimum specified voltage, the power voltage will be below the threshold voltage of the photo diode. As a result, a relatively smaller amount of current will be drawn from the power supply 112 than in operation. Thus, the current consumed by the circuit can be reduced until the minimum specified voltage has been met or exceeded.

Figure 14:
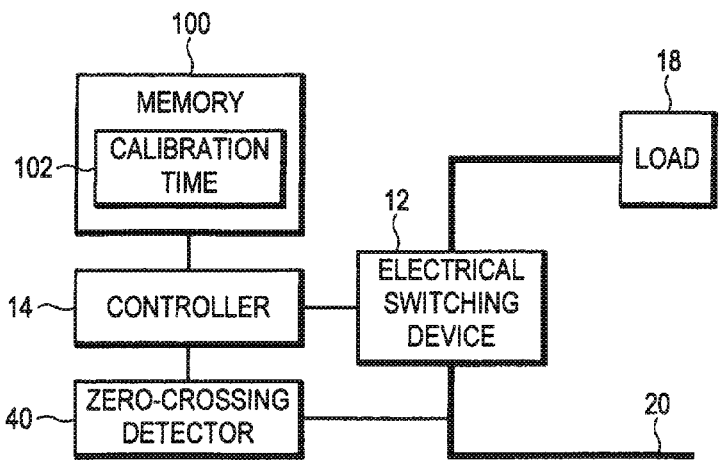
FIG. 14 illustrates a zero-crossing synchronization circuit according to some inventive principles of this patent disclosure.

FIG. 14 illustrates a zero-crossing synchronization circuit according to some inventive principles of this patent disclosure. In this embodiment, the controller 14 is coupled to a memory 100. The memory is configured to store a calibration time 102. The memory 100 can be any variety of memory. For example, the memory can be non-volatile or volatile memory, static or dynamic memory, or the like. Moreover, the memory 100 can be internal to the controller 14, external, or a combination.

As described above, the controller 14 can be coupled to a zero-crossing detector 40 and receive a zero-crossing. The controller 14 can be configured to actuate the electrical switching device in response to the zero-crossing detector and a calibration time. The calibration time 102 can be a variety of different times. For example, the calibration time 102 can be an actuation time, an offset from an actuation time, a delay between a zero-crossing and an energization time, or the like.

Figure 15:
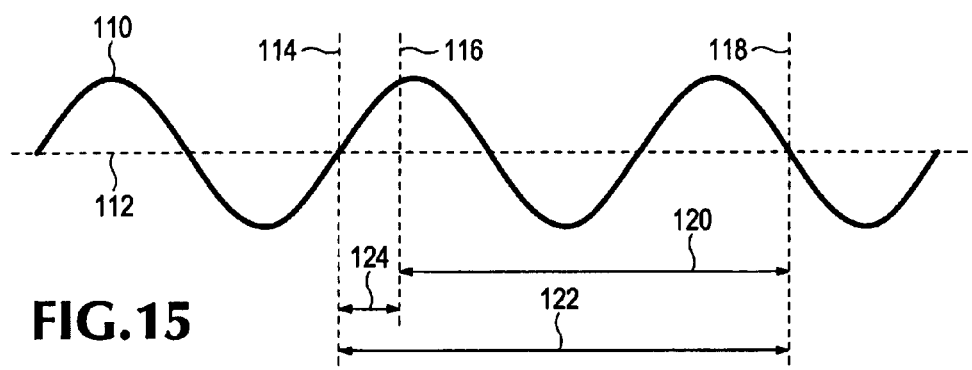
FIG. 15 illustrates an example of a timing of an actuation of the electrical switching device relative to zero-crossings of a waveform according to some inventive principles of this patent disclosure.

FIG. 15 illustrates an example of a timing of an actuation of the electrical switching device relative to zero-crossings of a waveform according to some inventive principles of this patent disclosure. In this embodiment, reference line 112 represents the zero level associated with waveform 110. The waveform 110 can represent the parameter having the zero-crossing, such as a voltage or current.

In this embodiment, time 120 is an actuation time 120. For example, the stored calibration time 102 can be the actuation time 120. The delay time 124 was calculated such that a total of the actuation time 120 and the delay time 124 was substantially equal to an integer multiple of the zero-crossing period. In this embodiment, the total time period 122 is substantially equal to three zero-crossing periods.

The controller 14 is configured to receive a zero-crossing, such as zero-crossing 114. The controller 14 does not actuate the electrical switching device 12 until a delay time 124 after the zero-crossing 114. In particular the electrical switching device 12 is actuated at time 116. The electrical switching device 12 takes time 120 to actuate such that the actuation is not substantially complete until time 118. Since the total time 122 including the delay time 124 and the actuation time 120 was an integer multiple of the zero-crossing period and the total time 122 began substantially at a zero-crossing at time 114, the completion of the actuation will occur substantially at the zero-crossing at time 118, three zero-crossing time periods from the zero-crossing at time 114. Thus, the actuation of the electrical switching device 1 can be substantially synchronized with a zero-crossing.

Although a single zero-crossing sequence has been described as being used to actuate the electrical switching device 12, different zero-crossing sequences can be used for different operations of the electrical switching device 12. For example, a zero-crossing sequence for the voltage of the line wiring 20 can be used when actuating the electrical switching device 12 to close the contacts of the electrical switching device 12. Thus, as the contacts are closed, the voltage drop across the contacts can approach a minimum. When the contacts of the electrical switching device 12 are to be opened, the opening can be substantially synchronized with the zero-crossings of the current flowing through the electrical switching device 12.

Figure 16:
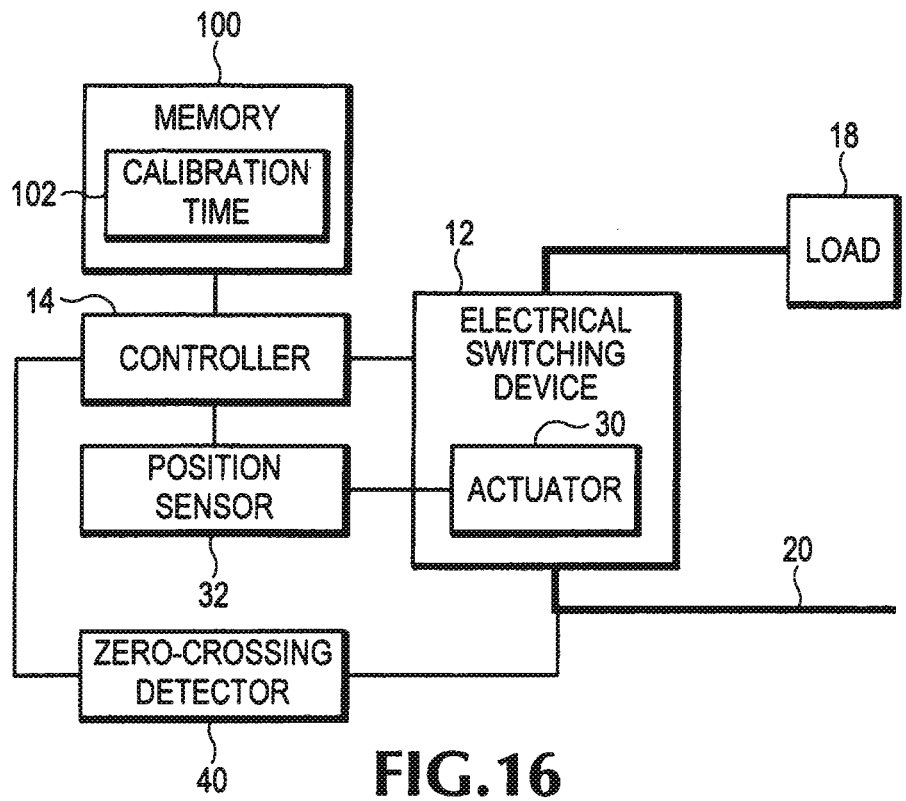
FIG. 16 illustrates another zero-crossing synchronization circuit according to some inventive principles of this patent disclosure.

FIG. 16 illustrates another zero-crossing synchronization circuit according to some inventive principles of this patent disclosure. In this embodiment, the controller 14 is configured to measure a delay time between an energization of the electrical switching device and an actuation of the electrical switching device.

In this embodiment, a position sensor 32 is configured to sense a state of the electrical switching device 12. For example, as described above, the position sensor 32 can sense a position of the actuator 30. As a result, the state of the electrical switching device 12 can be sensed. However, in another embodiment, other techniques can be used to sense the state of the electrical switching device 12. For example, an instantaneous voltage across the electrical switching device 12, a current passing through the electrical switching device, or the like can be used to sense the state.

The controller 14 can be configured to measure a delay time between an energization of the electrical switching device 12 and a change in the state sensed by the position sensor 32. As a result, the actuation time can be determined. The actuation time can be used to update the calibration time 102. Thus, a different delay time 124, different actuation time 120, or the like can be stored as the calibration time 102.

Figure 17:
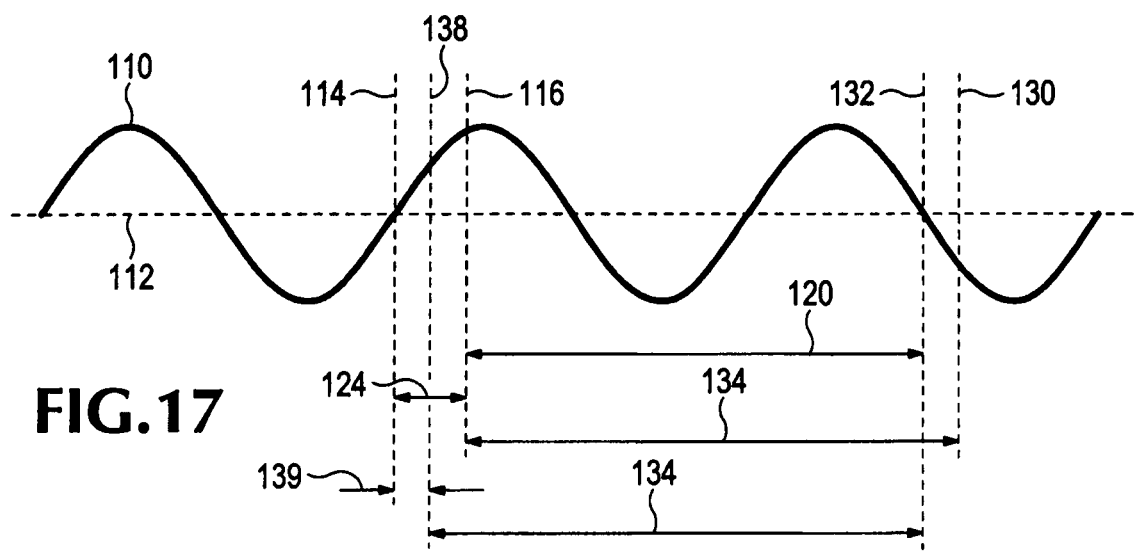
FIG. 17 illustrates an example of a measurement of an actuation time of the electrical switching device relative to zero-crossings of a waveform according to some inventive principles of this patent disclosure.

FIG. 17 illustrates an example of a measurement of an actuation time of the electrical switching device relative to zero-crossings of a waveform according to some inventive principles of this patent disclosure. Delay time 124 and actuation time 120 are illustrated for reference. However, in this embodiment, the actuation time of the electrical switching device 12 has changed to 134. That is, the electrical switching device 12 is energized at time 116 after the delay time 124. The electrical switching device 12 is actuated by the actuation time 134 at time 130, after the zero-crossing at time 132. Thus, because the actual actuation time 134 is different, the actuation does not occur on the desired zero-crossing at time 132.

However, as described above, the actuation time of the electrical switching device 12 can be measured. That is, by detecting the time between the energization at time 116 and the actual actuation at time 130, a new actuation time 134 can be determined. Accordingly, the delay time 124 can be adjusted such that a total of the new delay time 139 and the recently measured actuation time 134 can be substantially equal to an integer multiple of a zero-crossing period. That is, the new delay time 139 can be updated, the actuation time 136 can be updated, or the like.

In an embodiment, the actuation time can be measured whenever the electrical switching device 12 is actuated. Accordingly, the time delay 139 can be calculated in response to recent measurements. Moreover, as the electrical switching device 12 is actuated, multiple measurements of the actuation time 136 can be obtained. Using the multiple measurements, a variation of the actuation time can be determined. As with any measurement technique, some variation may be present. However, variation greater than or equal to a threshold can be identified within the multiple measurements.

For example, the variation can be an erratic variation with substantially unpredictable actuation times. If the magnitude of the variation crosses the threshold, the variation can be reported by the controller 14, a fault can be indicated, the controller 14 can open the electrical switching device 12, or the like. In other words, the measured actuation time 136 can be used for any purpose beyond adjustment of the calibration time for the module.

In another example, the actuation time can be increasing monotonically. Such a change can be an indication of aging, but may not indicate that the electrical switching device 12 is failing, operating in an unsafe manner, or the like. The controller 14 can be configured to analyze the various actuation times to make such a determination.

In an embodiment, the difference between a new actuation time, such as time 134, and an earlier actuation time, such as time 120, can be greater than the earlier delay time 124. That is, the new time 134 can exceed the integer multiple of zero-crossings of the total of the delay time 124 and the earlier actuation time 120. Accordingly, the new delay time 139 can be selected for a different integer multiple of zero-crossing periods. That is, a greater number of zero-crossing periods can be included in the total time. Similarly, if the measured actuation time 136 is sufficiently less, a reduced number of zero-crossing periods can be included in the total.

Moreover, in an embodiment, the number of zero-crossing periods used as the total of the delay time 139 and the actuation time 136 need not be the minimum number. For example, as illustrated, three zero-crossing periods are included in the total of the delay time 139 and the actuation time 136. However, the delay time 139 could be set such that four or more zero-crossing periods can be included. That is, the delay time 139 can be, but need not be a fraction of a single zero-crossing period.

As described above, a single zero-crossing has been described with respect to the timing and measurement of energization and actuation. However, different calibration times, zero-crossings, delay times, or the like can be used according to the associated actuation. For example, an actuation of the electrical switching device 12 to close the contacts can use the voltage zero-crossings with an associated voltage zero-crossing calibration time. An actuation of the electrical switching device 12 to open the contacts can use the current zero-crossings with an associated current zero-crossing calibration time, both of which may be different from the corresponding voltage related parameters.

Figure 18:
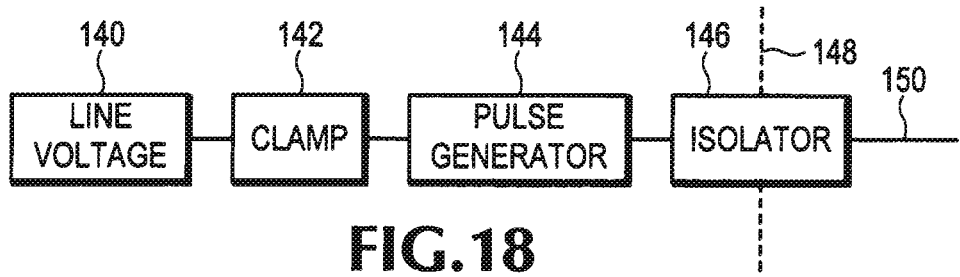
FIG. 18 illustrates a zero-crossing detector according to some inventive principles of this patent disclosure.

FIG. 18 illustrates a zero-crossing detector according to some inventive principles of this patent disclosure. In this embodiment, a clamp 142 is configured to clamp an alternating current (AC) signal. For example, the AC signal can be the line voltage 140 on line wiring. However, in other embodiments, the AC signal can be different, for example, the current flowing through the electrical switching device 12, or the like.

A pulse generator 144 is coupled to the clamp 142 and configured to generate a pulse in response to an edge of the clamped AC signal. An isolator 146 is coupled to the pulse generator 144 and configured to be actuated by the pulse. Accordingly, the pulse from the pulse generator can be propagated across the voltage boundary 148 to generate a pulse on line 150.

In particular, as the AC signal is clamped, the clamped AC signal can transition during low voltage portions of the AC signal. For example, as the AC signal crosses through approximately zero volts, the clamped AC signal can also transition. Thus, the transitions, or edges of the clamped AC signal correspond to the zero-crossings.

In an embodiment, the information conveyed in the pulses is conveyed in the edge. Accordingly, a minimum pulse width sufficient to be detected can be used. For example, a pulse width of about 100 μs can be used. As a result, the isolator 146 can be configured to be actuated for only about 100 μs. Thus, with a 120 Hz zero-crossing frequency, corresponding to a period of about 8.3 ms, a 100 μs pulse width is a duty cycle of about 1.2%. Accordingly, for a majority of the time of a zero-crossing period, the isolator 146 can be disabled. In particular, with an optoisolator described above, the LED can be disabled for the majority of the zero-crossing period.

As a result, a power consumption of the circuit can be reduced. For example, if the clamped AC signal is used to turn the LED on and off, a duty cycle of about 50% is achieved. Thus, the LED is on for about 50% of the time. In contrast, if a 1.2% duty cycle as described above, the LED is turned on only about 1.2% of the time, yet the same zero-crossing information is conveyed. That is, the zero-crossing information can be obtained with a reduced amount of power.

In particular, the reduction in power can occur with respect to a power supply generated from the line voltage. For example, the power supply for the LED actuation can be generated from a line voltage. An amount of current that is allowed to be sunk to a neutral terminal can be limited. Accordingly, power consumption can be reduced, leaving more power for other devices, or the like.

Figure 19:
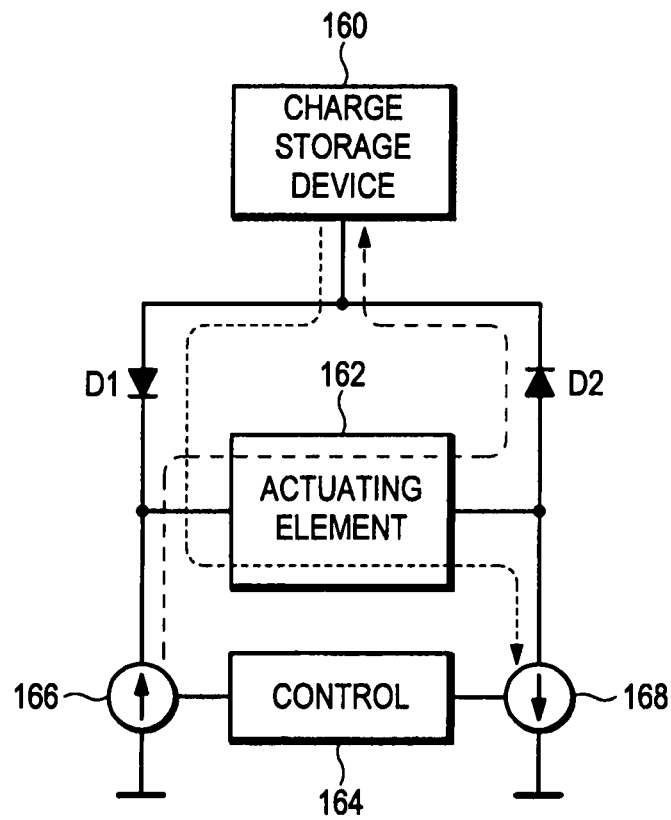
FIG. 19 illustrates an example of the pulse generator of FIG. 18 according to some inventive principles of this patent disclosure.

FIG. 19 illustrates an example of the pulse generator of FIG. 18 according to some inventive principles of this patent disclosure. In this embodiment, a charge storage device 160 is configured to store a charge. The charge storage device 160 can include a capacitor, inductor, or the like. The charge storage device 160 can also include various other components, such as resistors, current limiters, or the like such that the charge and discharge time can be set as desired.

The charge storage device 160 is coupled to diodes D1 and D2. The diodes D1 and D2 are coupled to the charge storage device 160 in opposite directions. Thus, current flowing towards and away from the charge storage device 160 can take substantially different paths as illustrated by paths 161 and 163.

The diodes D1 and D2 are coupled to the actuating element 162 of the isolator 146. For example, the actuating element 162 can be the LED of the optoisolator described above. In particular, the diodes D1 and D2 can be coupled to the actuating element 162 such that the current paths 161 and 163 each flow the same direction through the actuating element 162. That is, even though the paths 161 and 163 are substantially different, the paths 161 and 163 share the same path through the actuating element 162.

Controllable current sources 166 and 168 are responsive to the control 164. The control 164 represents the driving circuitry that sources or sinks the current of the paths 161 and 162. In particular, the current sources 166 and 168 are not ideal sources. That is the current that is sourced or sunk can fall as the charge storage device 160 is charged or discharged.

The control 164 is configured to drive the current sources in response to the clamped AC signal from the claim 142. That is, as described above, the clamped AC signal can be a square wave signal with about a 50% duty cycle. The current sources 166 and 168 can be configured to be alternately activated in response to the different states of the clamped AC signal. Thus, the charge storage device 160 can be charged and discharged in response to the states of the clamped AC signal.

As described above, the current sources 166 and 168 are non-ideal sources. In particular, the current sources 166 and 168 are each configured to charge or discharge the charge storage device 160 to a corresponding rate. As the charge rate defines the time that the charge storage device 160 takes to charge or discharge, and effectively disable the corresponding current source 166 to 168, the time that the actuating element 162 is actuated can be controlled. As described above, regardless of the direction of charging or discharging of the charge storage device 160, the current passes through the actuating element 162 in the same direction. Thus, the actuating element 162 will be actuated substantially during the charging or discharging operation. However, the current can drop below a threshold to activate the actuation element 162 during a steady state condition. Thus, a pulse can be generated with a finite width.

Moreover, as the control of the current source 166 and 168 changes as the clamped AC signal changes, a new charge or discharge cycle will begin on each change of state. As described above, with the clamped AC signal, the transitions can correspond to a zero-crossing. Thus, a new charge or discharge cycle will begin on the zero-crossing, and hence, the actuating element 162 will be actuated on the zero-crossing. The time the actuating element 162 is actuated will be dependent on the charge or discharge time of the charge storage device 160.

Figure 20:
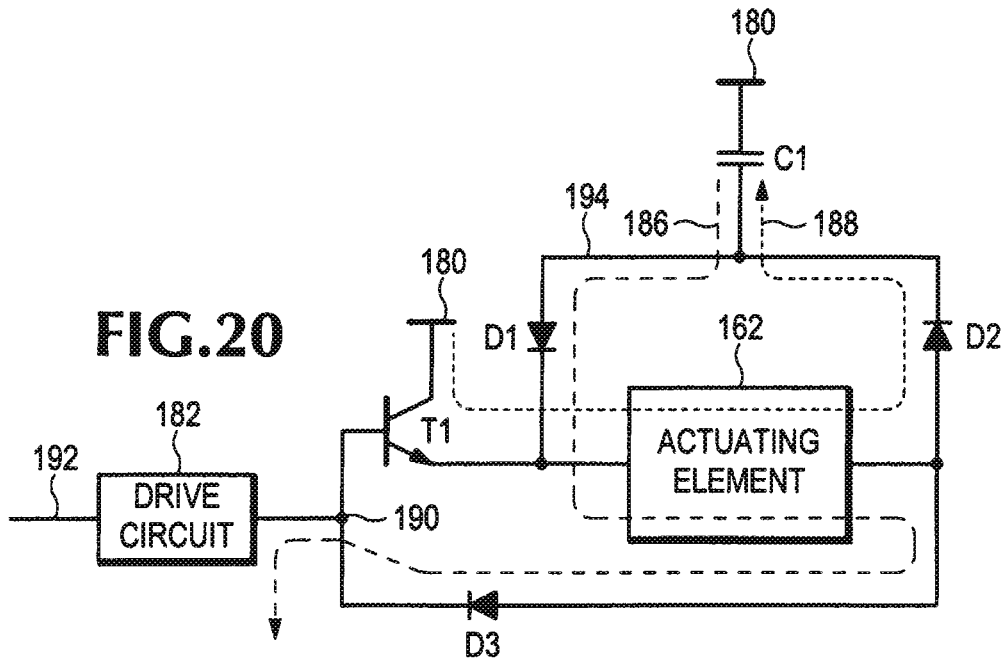
FIG. 20 illustrates another example of the pulse generator of FIG. 18 according to some inventive principles of this patent disclosure.

FIG. 20 illustrates another example of the pulse generator of FIG. 18 according to some inventive principles of this patent disclosure. In this embodiment, the charge storage device 160 is a capacitor C1. The capacitor C1 is coupled between the diodes and the power supply 180. Although a single power supply 180 connection is illustrated, the capacitor C1 can represent capacitance to more than one reference voltage.

A first terminal of the actuating element 160 is coupled to a transistor T1. Transistor T1 is coupled to power supply 180 and configured to receive a control output from the drive circuit 182 at a common node 190. The drive circuit 182 includes any circuitry to condition the clamped AC signal 192 appropriately to drive the common node 190.

A second terminal of the actuating element 162 is coupled to a diode D3. Diode D3 is also coupled to the common node 190. In this embodiment, when the control output at the control node 190 is a low signal, current is conducted along path 186, charging the capacitor 180 and pulling down node 194. During this time, the actuating element 162 is actuated in response to the current. Eventually, node 194 will be pulled down sufficiently such that the voltage drop across the various components along the path 186 and, in particular, the actuating element 162, will be insufficient to actuate the isolator 146. Thus, the actuating element 162 will be actuated substantially only for such a time period.

When the control node 190 is driven with a high signal, transistor T1 conducts. Diode D3 is substantially reversed biased and does not conduct. Thus, current flows along path 188, pulling up node 194, reducing the charge on the capacitor C1. Similarly, the transistor T1 will pull up node 194 until the voltage drop is insufficient. Again, the actuating element 162 is actuated for the time node 194 is pulled up.

Although in this embodiment, a transistor T1 and diode D3 have been described, other circuitry can be used to drive the terminals of the actuating element 162. For example, transistor T1 could be replaced with a diode and the drive circuit 182 can be configured to supply the current for path 188. Moreover, although the terms pull up and pull down have been used above, the circuitry, charge storage element 160, or the like can be configured where the flow of current, control, or the like is reversed.

Figure 21:
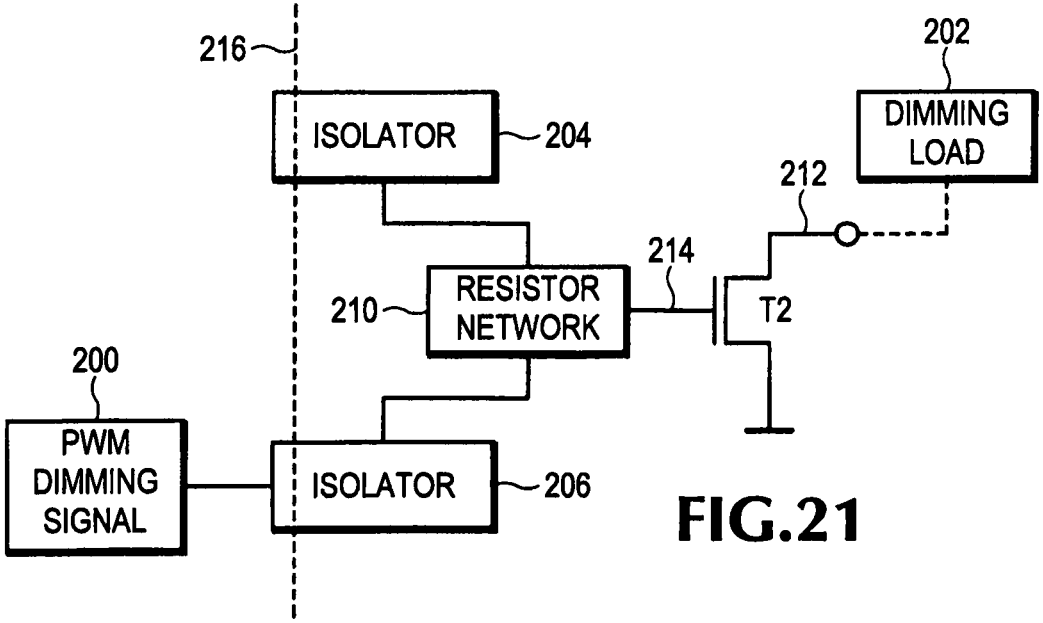
FIG. 21 illustrates a dimming control circuit according to some inventive principles of this patent disclosure.

FIG. 21 illustrates a dimming control circuit according to some inventive principles of this patent disclosure. In this embodiment, the circuit is actuated by a PWM dimming signal 200. For example, the desired level of dimming can be set by the pulse of the PWM dimming signal 200. The PWM dimming signal 200 is applied to the isolator 206. The isolator 206 bridges the boundary 216 between voltage regions. In an embodiment, the PWM dimming signal can be located on a low voltage side of the boundary 216.

The isolator 206 is coupled to a resistor network 210. The resistor network 210 is also coupled to an isolator 204 and a control node 214 coupled to a control input of a transistor T2. In an embodiment, the isolators 204 and 206 can be configured to be substantially non-conducting when a power supply is disabled. For example, as will be described in further detail below, the power supply can be a power supply in the low voltage region. Thus, the isolators 204 and 206 can be substantially non-conducting when the low voltage region power supply is disabled. In particular, the PWM dimming signal 200 can be generated by circuitry also powered by the low voltage power supply. Accordingly, the isolators 204 and 206 can be configured to be substantially non-conducting when the PWM dimming signal is not a valid signal.

The isolators 204 and 206 can be coupled to the resistor network 210 such that when the isolators 204 and 206 are substantially non-conducting, the direct current (DC) current paths associated with the control node 214 are substantially non-conducting. In particular, as described above, the isolators 204 and 206 can be substantially non-conducting when the low voltage power supply is disabled. As a result, the voltage on the control node 214 can remain substantially the same after the low voltage power supply is disabled.

In this embodiment, the dimming circuit is configured to drive a dimming load 202 through output port 212. The dimming load 202 can be a pull-up style of load where the control is varied by varying the current pulled through the transistor T2. In particular the current can be varied by controlling the control node 214.

As described above, when the low voltage power supply is disabled, the control node 214 can remain at substantially the same level. As a result, the current pulling down the output port 212 can remain at substantially the same level. Thus the dimming load 202 can receive substantially the same signal even though a power supply associated with the PWM dimming signal 200 has been disabled.

Figure 22:
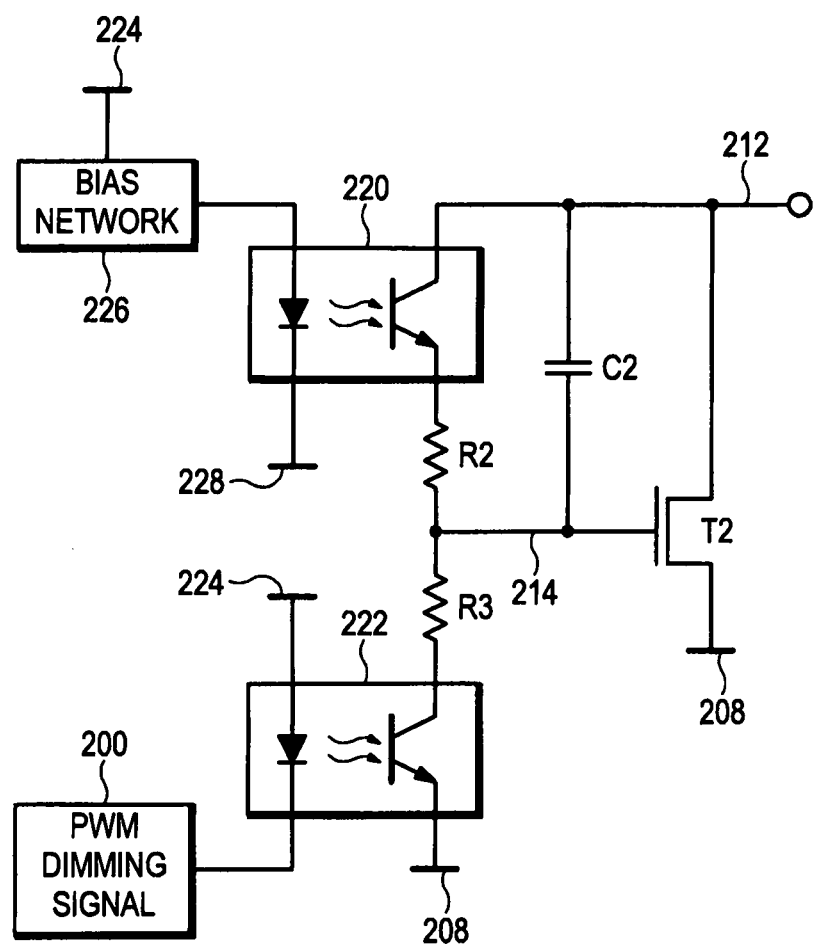
FIG. 22 illustrates another dimming control circuit according to some inventive principles of this patent disclosure.

FIG. 22 illustrates another dimming control circuit according to some inventive principles of this patent disclosure. In this embodiment optoisolator 220 is coupled between a bias network 226 and the power supply terminal 228. The bias network 226 is coupled to the power supply terminal 224. Accordingly, when the power supply is disabled, the voltage drop between the power supply terminals 224 and 228 will not be sufficient to actuate the LED, and hence, the phototransistor.

Similarly, the optoisolator 222 is coupled to power supply terminal 224 and driven by the PWM dimming signal 200. When the power supply is disabled, the optoisolator 222 will similarly be disabled. Although a bias network 226 has been illustrated for only the optoisolator 220, a similar bias network could be used for optoisolator 222. Moreover, the power supply 224 can supply a bias to the optoisolator 222 such that it can respond to the PWM dimming signal 200. Regardless, when the power supply is disabled, the optoisolators 220 and 222 can be configured to become substantially non-conducting.

In this embodiment, resistors R2 and R3 form a resistor network coupled to control node 214. A capacitor C2 is coupled between the control node 214 and the output port 212. As illustrated, the only DC current paths from control node 214 are through the phototransistors of optoisolators 220 and 222. When the optoisolators 220 and 222 are disabled and substantially non-conducting, the DC current paths of the control node 214 are substantially non-conducting.

Substantially non-conducting can, but need not mean that zero current will flow from the control node 214 when the optoisolators 220 and 222 are disabled. Rather, the amount of current that can flow is substantially reduced. For example, parasitic DC current paths can charge or discharge the control node 214. However, the components can be selected such that a time frame over which the voltage on the control node 214 changes can be controlled such that the output through the output port 212 can remain substantially the same for a desired time period. In addition, the capacitor C2 can aid in maintaining the output level. For example, the capacitor C2 can add additional charge storage to extend the time that the level of the control node 214 is substantially maintained. However, the capacitor C2 can also provide feedback to the control node 214. For example, if the output node 212 is pulled up, control node 214 can be similarly pulled up. As a result, the current through the transistor T2 can increase, countering the effects of the output node 212 being pulled up.

Although a transistor T2 has been described, other circuits with similar properties can be used. For example, additional transistors can be used to increase the output drive capability. Amplifier circuits can be used. Any circuit that can control a current in response to the control node 214 can be used.

Although a variety of circuits, systems, and the like have been described, any combination of such circuits and systems can be combined within an electrical switching module. Moreover, although embodiments have been described with particular implementations of measuring circuits, zero-crossing detectors, or the like, an electrical switching module can include such circuits and can also include other conventional circuits.

Figure 23:
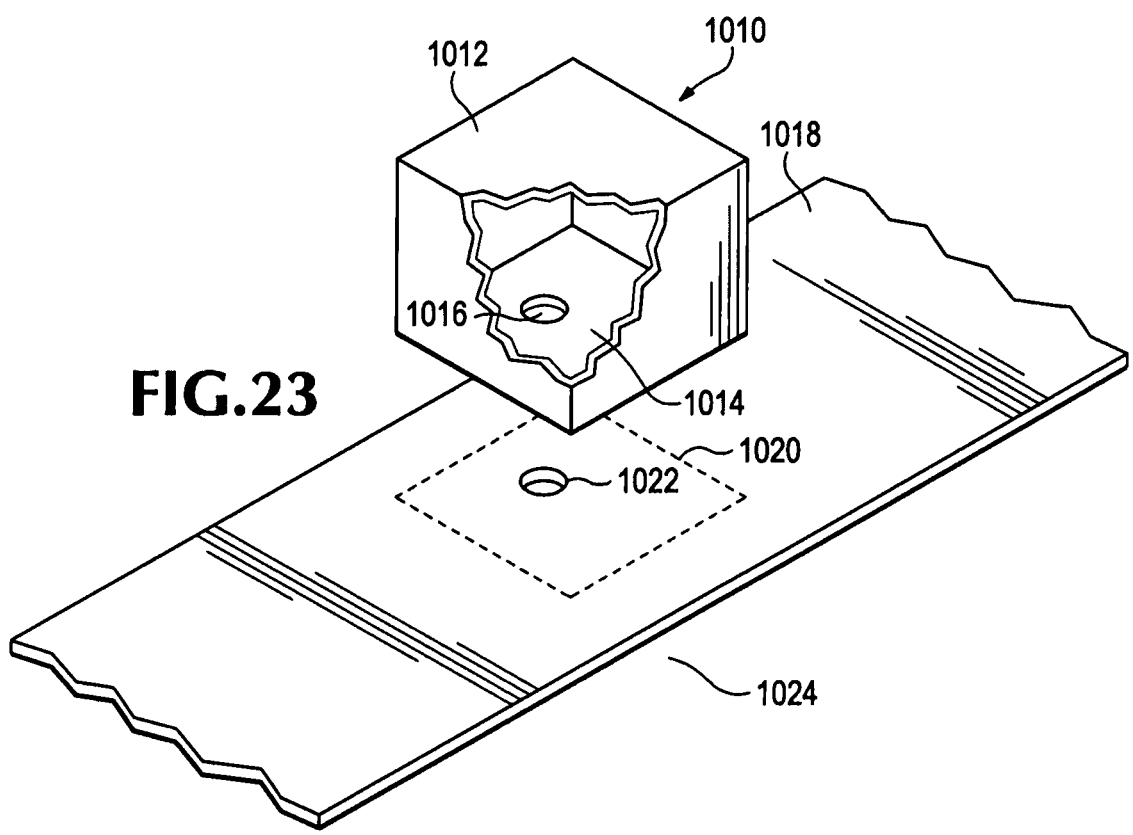
FIG. 23 illustrates an embodiment of a venting system for an electrical switching component according to the inventive principles of this patent disclosure.

FIG. 23 illustrates an embodiment of a venting system for an electrical switching component according to the inventive principles of this patent disclosure. The embodiment of FIG. 23 includes an electrical switching component 1010 having an electrical switching device (not shown) substantially encapsulated in a case 1012. The case has a mounting portion 1014, which in this example is the bottom of the case 1012. The mounting portion includes a vent 1016 to enable gases and other material from a blast to escape from within the case. The embodiment of FIG. 23 also includes a chassis 1018 having a mounting site 1020 where the electrical switching device 1010 is mounted to the chassis. The mounting site 1020 includes a passage 1022 to enable the blast from vent 1016 to flow from the case through the chassis and into a blast diverting space 1024.

FIG. 23 shows the electrical switching component 1010 elevated above the chassis 1018 so as not to obscure the details of the mounting site 1020. When fully assembled, however, the electrical mounting portion 1014 of switching component 1010 is mounted to the mounting site 1020 of the chassis 1018 so the vent 1016 is generally aligned with the passage 1022.

The electrical switching device contained in the case is not shown in FIG. 23 so as not to obscure the mounting portion 1014 or vent 1016. The electrical switching device may be a relay, a circuit breaker, a manually actuated switch, a dimmer, or any other type of device or combination of devices that controls current to a load and which, in response to electrical stress such as a short circuit, over current condition, etc., or during normal operation, may produce a blast of gases, molten metal or any other matter that may damage or interfere with the operation of the device if not vented out of the case. A blast need not necessarily be a high pressure event, but may be, for example, a puff of ionized air generated by an arc caused by opening a switch on an inductive load.

The case 1012 may be of any suitable size, shape, material, etc., for enclosing the specific type of electrical switching device. Some examples of suitable materials include various plastics, composites, glasses, metals, etc. commonly used for encapsulating relays, circuit breakers, switches, etc. The case 1012 need not completely encapsulate the electrical switching device. For example, the case may include loose-fitting openings around electrical terminals that pass through the case, or there may be small gaps where different portions of the case are joined, or there may be imperfectly fit openings for access to potentiometers, dip switches and the like. Relatively small amounts of gas or other matter may escape from these openings without defeating the purpose of the vent 1016.

The vent 1016 may have any suitable form to vent gases or other material from the case. Some examples include a simple circular hole, a combination of holes to form a baffle, a pressure relief valve set to open only when the inside of the case reaches a certain internal pressure and/or temperature, a relatively thin or weak portion of the case that ruptures under pressure or high heat, an elastomeric material that opens to vent, but then recloses after venting, etc.

The mounting portion 1014 in the embodiment of FIG. 21 is shown as a flat bottom portion of the case 1012 to enable the case to be attached to the flat mounting site 1020 on chassis 1018, but countless variations are contemplated by the inventive principles of this patent disclosure. For example, in some embodiments, the mounting portion may be molded with a profile to fit in or on a rail or track such as a standard DIN rail. In other embodiments, the mounting portion may be shaped to plug into a relay socket. In an embodiment for a snap-in type circuit breaker, the mounting portion may include the flat bottom of the circuit breaker case which is bounded at one end by a hook to engage the panel and at the other end by the plug-in terminal to engage the power distribution bus.

The manner in which the electrical switching component 1010 is attached to the chassis 1018 is not limited to any particular technique and may depend on the configuration of the chassis 1018 and/or the mounting portion 1014 of the case 1012. In an embodiment having two flat mating surfaces as shown in FIG. 23, any type of fasteners such as screws, rivets, clips, adhesive etc. may be used. Either or both surfaces may have interlocking tabs, slots, recesses, protrusions, etc. In embodiments that utilize plug-in sockets, the case may be held to the chassis by the force of mating contacts and or tabs in the case. These forces may be supplemented or replaced by hold-down clips or other fasteners. As another example, in embodiments that utilize mounting rails or tracks, the mounting portion 1014 of the case 1012 may simply slide into or on the track or rail.

The chassis 1018 and mounting site are not limited to any particular configurations, although some specific examples are described below. In the embodiment of FIG. 23, the chassis 1018 is shown as a flat mounting plate that can be fabricated from metal or any other suitable material, and the mounting site 1020 is simply a portion of the plate matching the footprint of the case 1012. In some other embodiments, the chassis may be in the form of a rail or a track in which any portion of the rail or track may be designated as a mounting site. In other embodiments, the chassis may be a socket having a mounting site that includes receptacles for electrical terminals and/or tabs on the mounting portion of the case. In yet other embodiments, a printed circuit board may serve as the chassis with a mounting site that includes drilled holes, plated holes, etc. to receive the electrical switching component in the form of a board mount relay, circuit breaker, etc. The chassis may be a free-standing chassis, or it may be mounted in, or integral with, an enclosure.

The passage 1022 is shown as a simple circular hole in the embodiment of FIG. 23, but the inventive principles contemplate many different forms. The passage may include multiple holes, channels, tubes, valves, etc. to direct the blast from the vent 1016 to the blast diverting space 1024. As with the vent 1012, the passage 1022 may be implemented as a relatively weak or thin portion of the chassis that ruptures under pressure or heat.

The blast diverting space 1024 may be any suitable open or enclosed space. For example, it may be specifically designed to receive the blast, or it may utilize an existing space in the chassis or an enclosure in which the chassis is mounted. The blast diverting space may be empty, or it may be fully or partially filled with material to absorb, diffuse, cool, redirect, or otherwise process the blast.

Figure 24:
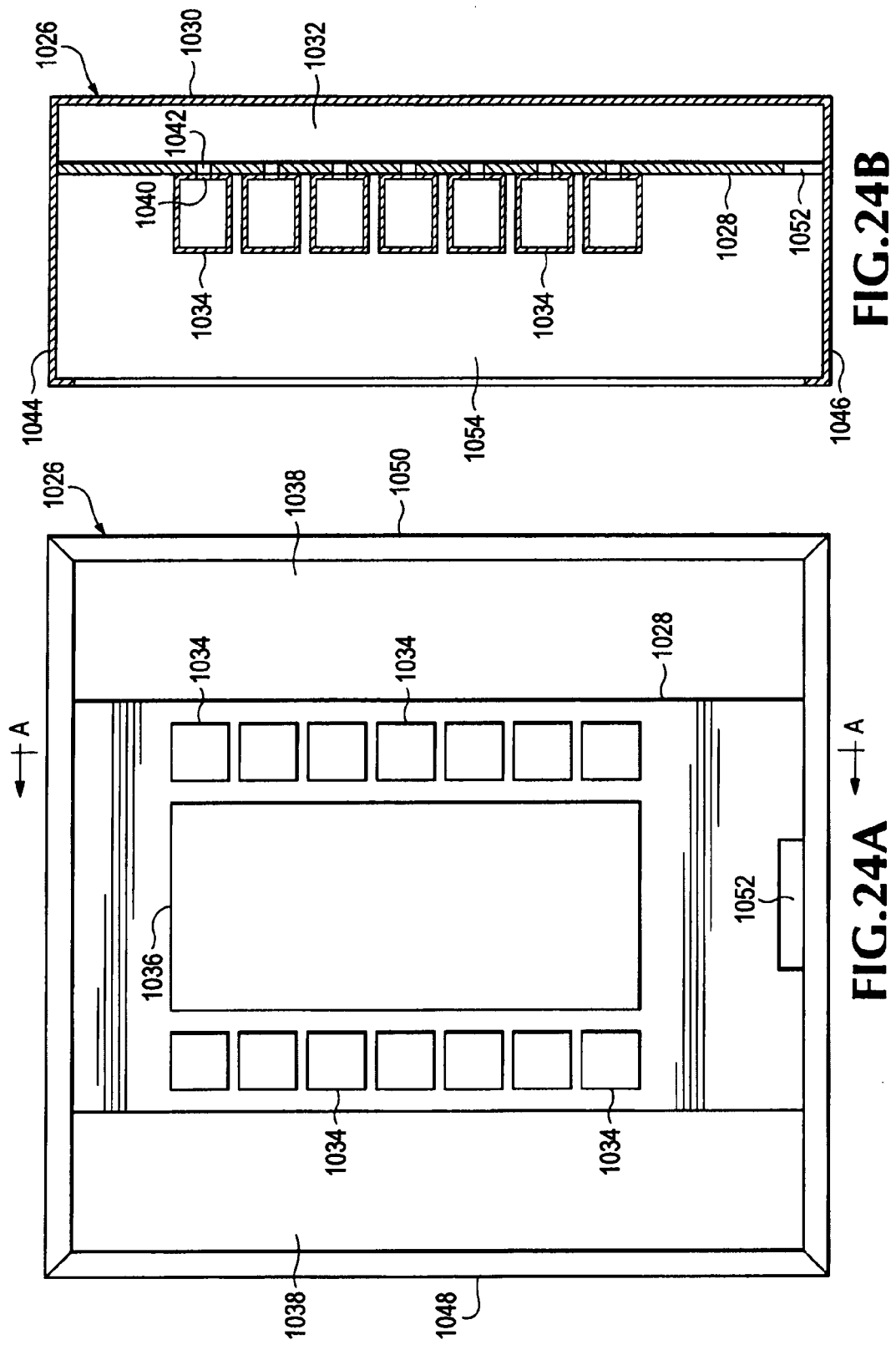
FIG. 24A is a front view of another embodiment of a venting system according to the inventive principles of this patent disclosure.
FIG. 24B is a cross section taken through line AA of the embodiment of FIG. 24A.

FIGS. 24A and 24B (which may be referred to collectively as FIG. 24) illustrate another embodiment of a venting system according to the inventive principles of this patent disclosure. The embodiment of FIG. 24 is directed to a relay control panel that is housed in a sheet metal enclosure 1026. The electrical components are attached to a mounting plate 1028 which, as best seen in FIG. 24B, is spaced apart from the back wall 1030 of the enclosure 1026 to form a space 1032 which is utilized as a blast chamber as described below. The mounting plate 1028 may be positioned relative to the back wall using spacers, folded sheet metal, or any other suitable technique.

Referring to FIG. 24A, the relay control panel may include any number of relays 1034 which, in this example, are arranged in two rows on either side of low-voltage control circuitry 1036. The low-voltage control circuitry may include a printed circuit board having one or more microprocessors, communication interfaces, timing circuits, interface circuitry for photo sensors, occupancy sensors and the like, as well as circuitry to drive the coils of relays 1034. High voltage wiring areas 1038 on either side of the enclosure 1026 provide space for the connection of line and load wires to the relay contact terminals. Though not shown, the enclosure may include a front panel to fully enclose the panel.

In the example embodiment of FIG. 24, the relays may have molded plastic cases with mounting portions implemented as flat bottom flanges that mount directly to designated sites on the mounting plate 1028 using any suitable attachment technique. High-voltage connections may be made to the relay contacts through spade-lug connectors or screw terminals on the tops of the relays, while low voltage connections may be made to the relay coils through similar terminals on the tops of the relays.

In other embodiments, the relays may be attached in the form of relay cards having one or more relays mounted on a printed circuit board along with terminal blocks and other support circuitry. Each relay card may have a terminal header to couple the card to corresponding terminals of the low voltage control circuitry 1036. The relay card may also be attached to the mounting panel with spacers, stand-offs, a sheet of insulated material, etc.

In the embodiment shown in FIG. 24B, each relay has a vent hole 1040 in the bottom of its case that aligns with a corresponding hole 1042 in the mounting plate 1028. In an embodiment having relay cards, each printed circuit board may have a corresponding hole that aligns with both of the holes 1040 and 1042. Depending on the manner in which the printed circuit board is attached to the mounting plate, i.e., if the card is spaced apart from the plate, a tube or other apparatus may be included to direct the blast from the holes in the relay and printed circuit board to the hole in the mounting plate 1028.

As best seen in FIG. 24B, any blast from one of the relays 1034 is directed into a blast chamber 1032 formed between the mounting plate 1028 and the back wall 1030 of the enclosure, as well as a portion of the top wall 1044 and bottom wall 1046 and the side walls 1048 and 1050 of the enclosure. A vent 1052 is located at the lower end of the mounting plate 1028 and opens the blast chamber into the main volume 1054 of the enclosure. Upon release from the vent hole 1040, gases and/or other matter in a blast from relay 1034 is dispersed throughout the blast chamber 1032 and may eventually travel downward to vent 1052. If and when the blast makes its way through vent 1052 and into the main volume 1054 of the enclosure 1028, it may have dissipated enough to prevent damage or interfere with the operation of other components located within the enclosure. For example, hot exhaust gases may have cooled, ionized air may have become de-ionized, and molten metal may have solidified, clung to the back wall of the enclosure, or fallen to the bottom of the blast chamber.

The blast chamber 1032 may be empty, or it may be fully or partially filled with a material such as loose flame-resistant fiberglass insulation batting to further contain the blast.

The embodiment of FIG. 24 may provide several benefits depending on the implementation. For example, the system may require few, if any additional components. Electrical enclosures typically include mounting plates that are attached to the back wall of the enclosure with spacers or standoffs. A mounting plate is typically fabricated by a stamping operation in which the plate is cut to size and any necessary holes punched in one stamping operation. The additional holes for the vents may be fabricated in the same stamping operation. Likewise, the vent holes for the relays may be formed in the same molding operation used to create the relay case. Other than providing electrical isolation between components on the mounting plate and the back wall of the enclosure, the space between the plate and the enclosure may essentially be wasted space. Thus, at low additional cost, and perhaps even no additional cost, the embodiment of FIG. 24 may provide effective blast containment by modifying existing components and utilizing previously wasted portions of an electrical enclosure to solve a problem that has troubled panel designers for years.

Figure 25:
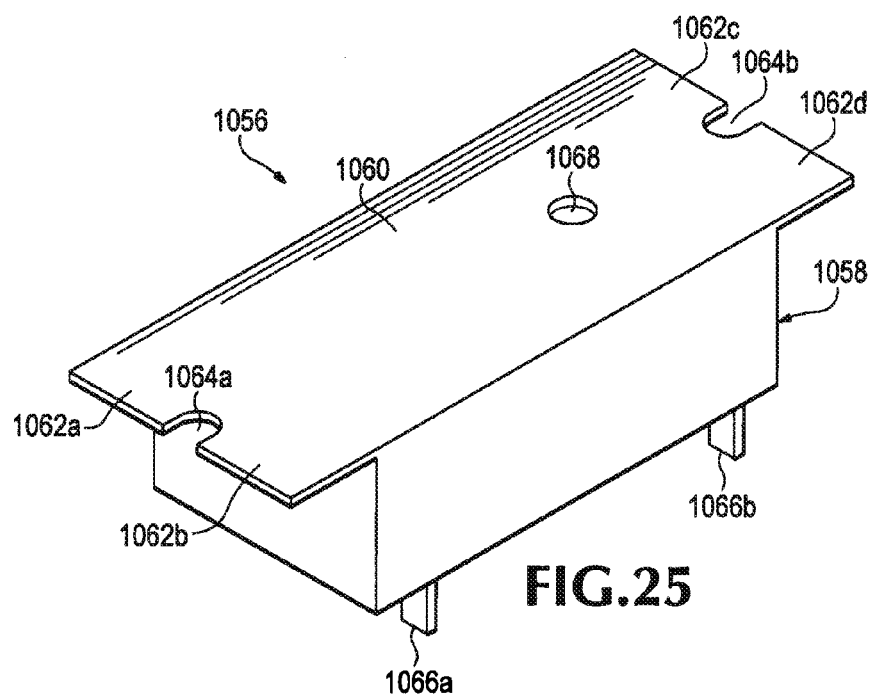
FIG. 25 illustrates an embodiment of a relay according to some inventive principles of this patent disclosure.

FIG. 25 illustrates an embodiment of a relay 1056 according to some inventive principles of this patent disclosure. In the embodiment of FIG. 25, a relay circuit (not shown) is encapsulated in a molded plastic case 1058 having a flat mounting portion 1060. The flat mounting portion includes tabs 1062a-62d which form an enlarged flange at the bottom of the relay for attachment to a generally flat mounting site on a chassis. Slots 1064a, 1064b are formed between the tabs on either side of the flange to accommodate screws or other fasteners to attach the relay to the chassis. Electrical connections are made to the relay through terminals 1066a, 1066b which protrude through the top of the case 1058. A vent hole 1068 enables gases or other material to escape from within the case 1058. The vent hole 1068 may be sized and located to align with a corresponding passage in the mounting site of the chassis. Although not limited to any particular application, the embodiment of FIG. 25 may be suited for use in the embodiment of the relay panel of FIG. 24.

Figure 26:
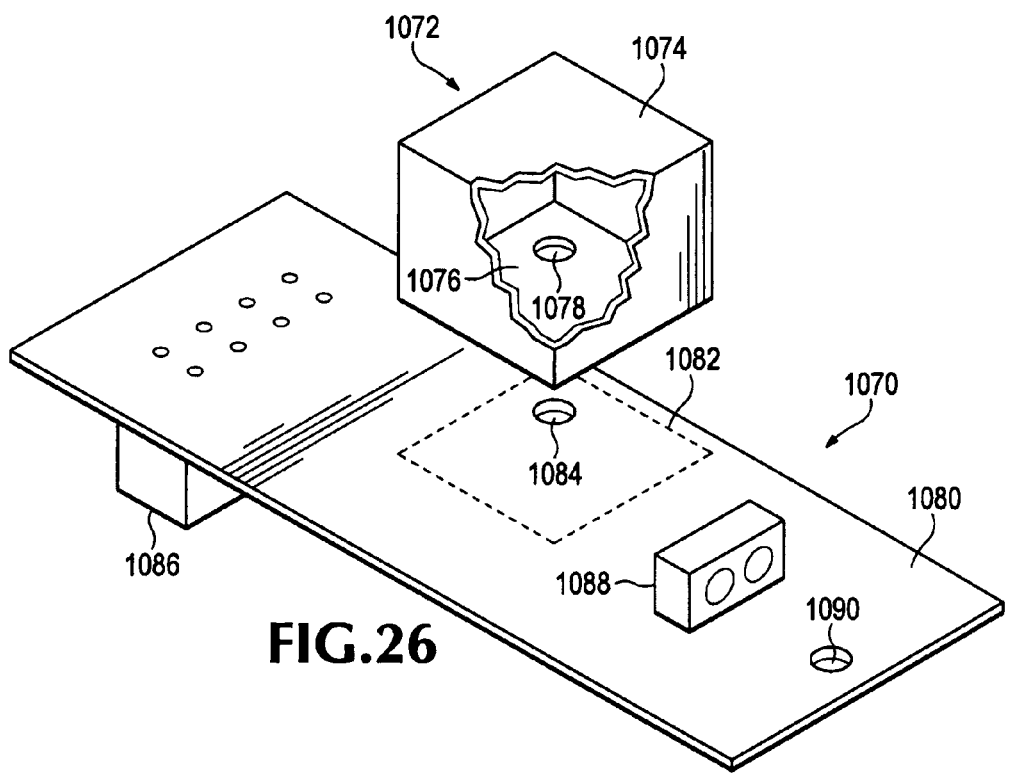
FIG. 26 illustrates an embodiment of a relay card according to some inventive principles of this patent disclosure.

FIG. 26 illustrates an embodiment of a relay card according to some inventive principles of this patent disclosure. The relay card 1070 of FIG. 26 includes a relay 1072 having a case 1074 with a mounting portion 1076, which in this example is the bottom of the case 1074. The mounting portion includes a vent 1078 to enable gases and other material from a blast to escape from within the case. The relay 1072 is attached to PC board 1080 at a mounting site 1082 which includes an additional passage or vent 1084 to enable the blast to pass through the printed circuit board. A terminal header 1086 on the bottom of the PC board engages terminal pins on a control PC board to couple the relay coil and other circuitry on the relay board to low-voltage control circuitry on a control PC board, or to other control circuitry. A terminal block 1088 enables high-voltage wiring to be connected to the contacts of the relay 1072 through traces on the PC board. Connections to the relay are through terminals (not visible in this view) on the bottom of the case 1074 which may be soldered to contacts, plated holes, etc., on the PC board.

The relay card 1070 of FIG. 26 maybe mechanically supported at one end by the terminal header 1086 and at the other end by a standoff attached to a mounting hole 1090. If the terminal card of FIG. 26 is used in a system such as the relay panel shown in FIG. 24, the blast from vents 1078 and 1084 may be further directed through a corresponding hole 1042 in the mounting plate 1028. A tube or other blast directing device may be included between the PC board and the mounting plate to form a continuous passage between vents 1078 and 1084 and hole 1042 in the mounting plate 1028.

Figure 27:
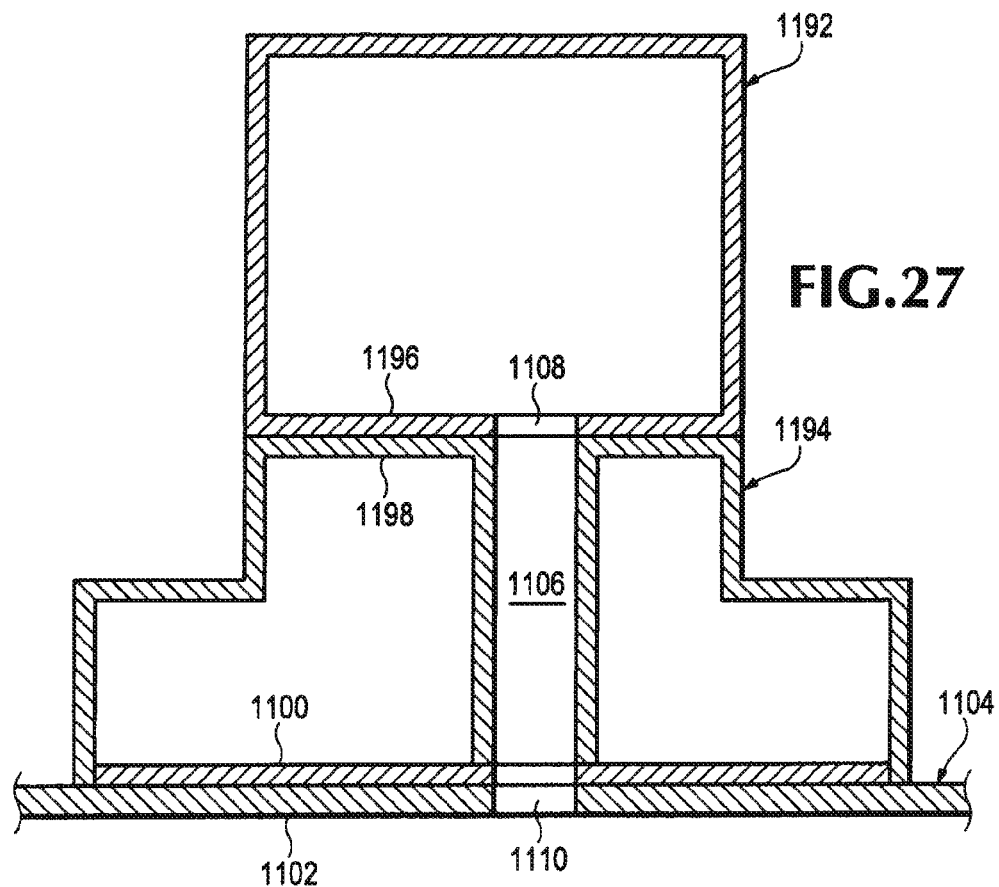
FIG. 27 is a cross-sectional view illustrating another embodiment of a venting system according to some inventive principles of this patent disclosure.

FIG. 27 illustrates another embodiment of a venting system according to some inventive principles of this patent disclosure. The embodiment of FIG. 27 includes a relay 1092 similar to the relay 1072 of FIG. 26. Rather than being mounted to a PC board, however, the relay 1092 is mounted in a plug-in relay socket 1094. Though not shown in FIG. 27, electrical and mechanical connections are made through terminal pins or spades that protrude from the bottom mounting portion 1096 of the relay 1092 and extend through openings in a mounting site 1098 of the socket to engage receptacles in the socket. The socket 1094 also includes a bottom mounting portion 1100 that mounts to a mounting site 1102 on a plate 1104 or other additional chassis.

In the embodiment of FIG. 27, the socket 1094 is formed with a through-passage 1106 to connect vent 1108 in the bottom of the relay 1092 with a passage 1110 in the plate 1104. This provides a continuous passage to channel a blast from the relay through the socket and plate and into a blast chamber 1112. In an alternative embodiment, the socket itself may include a blast chamber, in which case, the bottom of the socket may be closed, or have a reduced aperture to enable only a portion of the blast to pass through the socket and plate.

Figure 28:
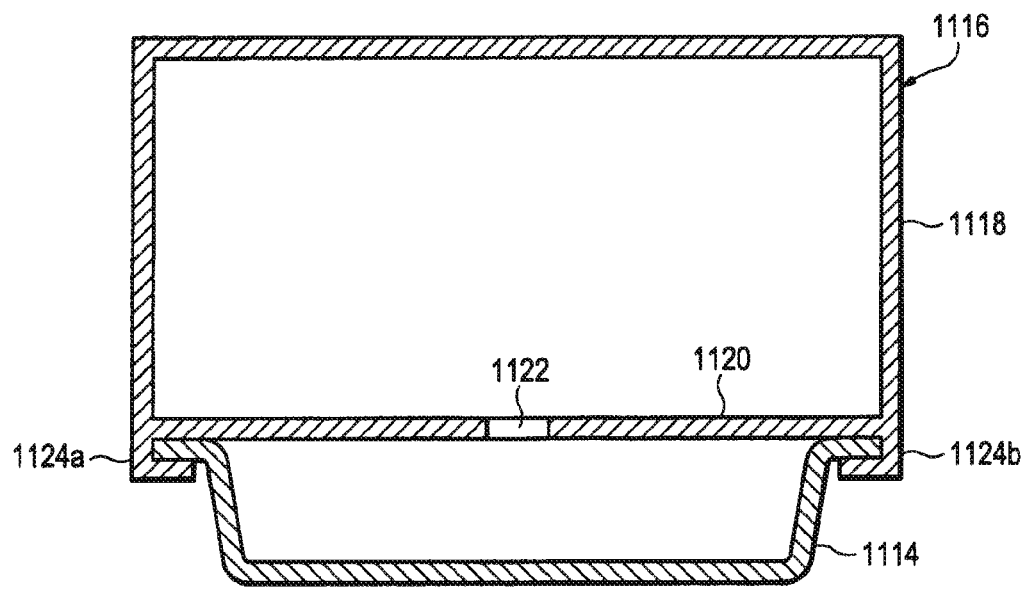
FIG. 28 is a cross-sectional view illustrating another embodiment of a venting system according to some inventive principles of this patent disclosure.

FIG. 28 illustrates another embodiment of a venting system according to some inventive principles of this patent disclosure. The embodiment of FIG. 28 includes a mounting track or rail 1114 such as a standard DIN mounting rail. An electrical switching component 1116 includes a case 1118 having a mounting portion 1120 with a vent 1122. The case is secured to the rail 1114 by rail-engaging members 1124a, 1124b. The mounting site is simply the portion of the rail on which the case is mounted. In this embodiment, the rail may serve as a blast chamber, either alone, or by directing the blast to one or more additional blast diverting spaces. Thus, the interior cavity of the rail may be filled with blast-absorbing material.

Figure 29:
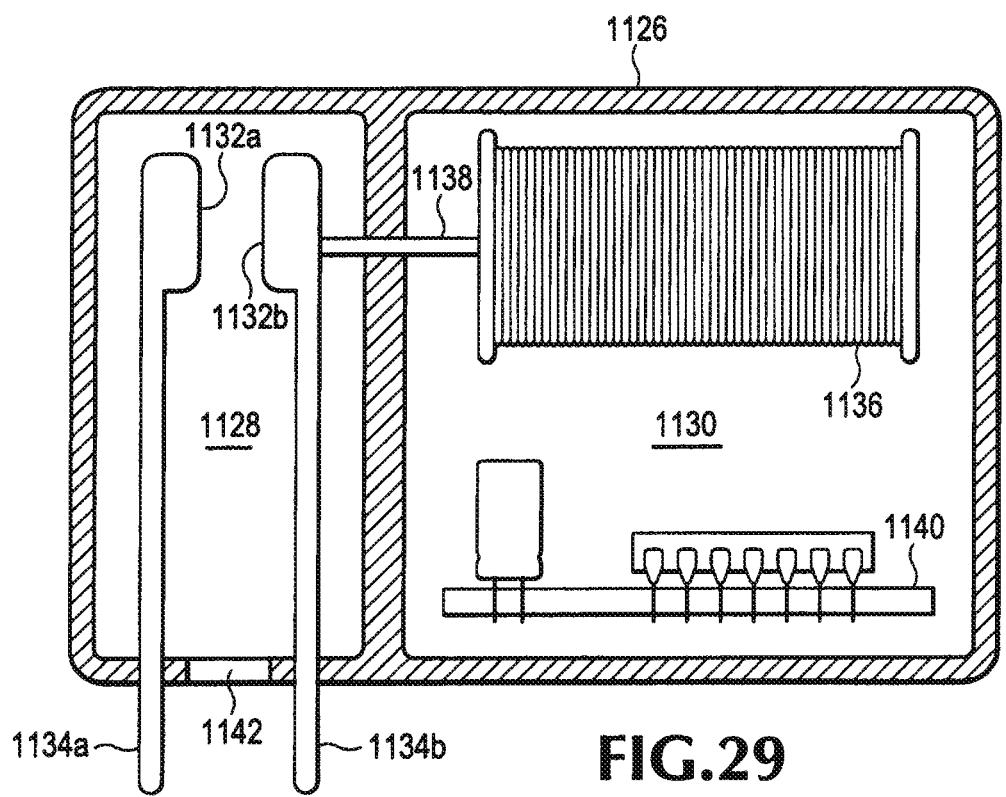
FIG. 29 is a cross-sectional view illustrating another embodiment of an electrical switching component according to some inventive principles of this patent disclosure.

FIG. 29 is a cross-sectional view illustrating another embodiment of an electrical switching component according to some inventive principles of this patent disclosure. In the embodiment of FIG. 29, a relay is housed in a case 1126 having at least two chambers. A first chamber 1128 contains a pair of contacts 1132a,132b, or other switching element, electrically connected to terminals 1134a,134b that extend through the case 1126. A vent 1142 enables a blast from the contacts, for example from an overload or short circuit condition, to escape from the first chamber. The first chamber may include other openings, provided a substantial portion of a blast is directed through vent 1142. In some embodiments, the portion of the case having the vent 1142 may be a mounting portion, which may also include the terminals 1134a, 1134b.

A second chamber 1130 includes a solenoid 1136 or other actuating device to actuate the contacts using a plunger 1138 that passes through a chamber wall that separates the first and second chambers. The second chamber 1130 also includes electronics 1140 to control the operation of the relay and communicate with external components such as a controller.

Placing the contacts 1132a, 1132b in a separate chamber may protect the components in the second chamber from a blast from the contacts. The second chamber need not be totally enclosed, but may simply be separated enough from the first chamber to substantially protect components in the second chamber from a blast in the first chamber.

Countless variations of this embodiment are possible according to some of the inventive principles of this patent disclosure. In the example of FIG. 29, there are two chambers, but other configurations having different numbers of chambers are contemplated. Some variations may include locating the relay coil in the first chamber or a third chamber. In other embodiments, additional sets of contacts may be located in the first chamber, or the additional contacts may be located in a third chamber, fourth chamber, etc., to prevent a blast from one set of contacts from interfering with the operation of the other contacts. The additional chambers may have additional vents which may be located in the same mounting portion as the first vent, in a different mounting portion of the case, or in a non-mounting portion of the case.

Figure 30:
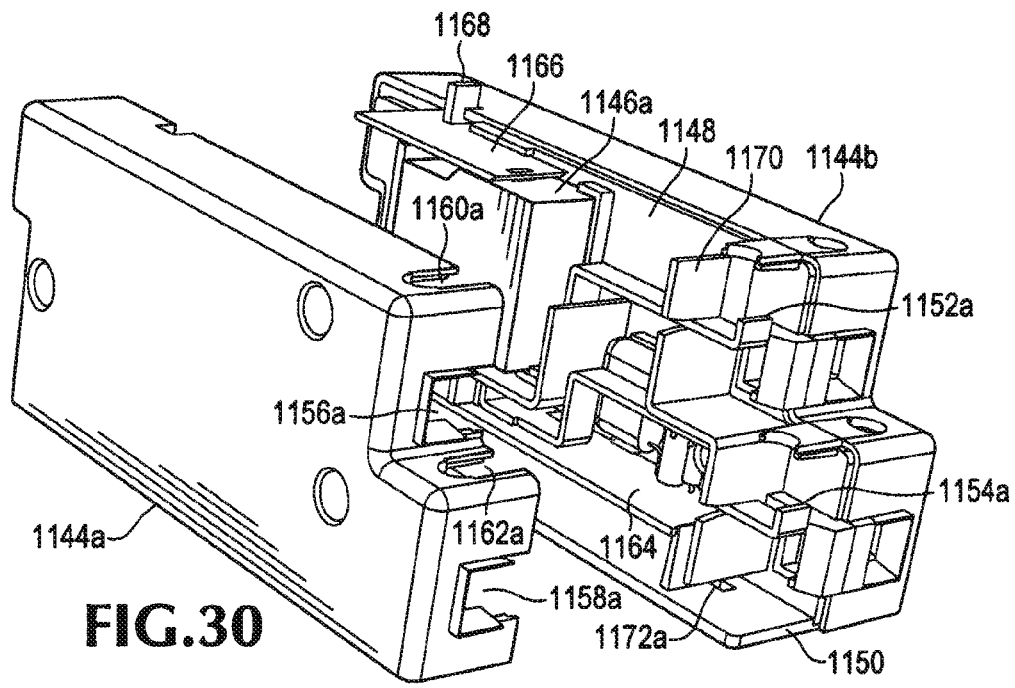
FIG. 30 is a partially exploded perspective view illustrating another embodiment of a venting system according to some inventive principles of this patent disclosure.

FIG. 30 is a partially exploded perspective view illustrating an embodiment of a relay assembly having a venting system according to some inventive principles of this patent disclosure. The embodiment of FIG. 30 illustrates a two-pole assembly, meaning that two different relays for switching two different circuits are included in one case. The case includes two side shells 1144a and 1144b, each of which houses one of the relays. In this view, only the left-side relay 1146a is visible. A bulkhead 1148 divides the entire case in half so that a blast on one side does not interfere with the operation of the circuitry on the other side. The case also includes a base plate 1150 to mount the relay assembly to a mounting site on a plate, channel, or other suitable apparatus.

Connections to the contacts of the left-side relay 1146a are through conductors 1152a and 1154a. External wires may be connected to the conductors by screw terminals (not shown) attached to the conductors. Apertures 1156a and 1158a allow the wires to be inserted into the terminals, while apertures 1160a and 1162a provide screwdriver access to the terminals. Connections to the relay solenoid and/or control electronics may be made through header pins, terminal blocks, wire leads or any other suitable arrangement. In the example of FIG. 30, the relay 1146a is mounted to a printed circuit board 1164 which includes header pins (not visible in this view) to provide connections through the case to the relay solenoid and/or control electronics on the circuit board. A slider plate 1166 moves manual override actuators simultaneously on both relays in response to motion of a manual actuator 1168 which protrudes through an opening in the case.

In the event of a blast from relay 1146a, another bulkhead 1170 prevents the blast from exiting the terminal apertures 1156a-162a (which may damage the external wires) and instead directs the blast through a vent 1172a in the base plate 1150. Another vent 1172b (not visible in this view) is arranged in a similar location on the other side of the base plate to vent a blast from the relay 1146b on the other side of the case.

Relay 1146a may be an open frame device, or it may be contained within another (inner) case as shown here. The inner case may have a single chamber, or it may have multiple chambers as described above in the context of FIG. 29. The inner case may be designed to rupture in the event of a blast, in which case the gases and/or other material from the blast flow through the open spaces within the outer case 1144a, 1144b, 1150 until they are directed to the vent 1172a. In some embodiments, additional bulkheads, passages, baffles, etc. may be arranged within the outer case to channel the blast to the vent. Alternatively, the inner case may be designed to expel a blast in a more controlled manner. For example, the inner case may include a vent in a mounting portion, or any other portion, which may be oriented to direct a blast in the general direction of the vent 1172a, either directly through any open space in the outer case, or through a system of additional bulkheads, passages, baffles, etc.

Figure 31:
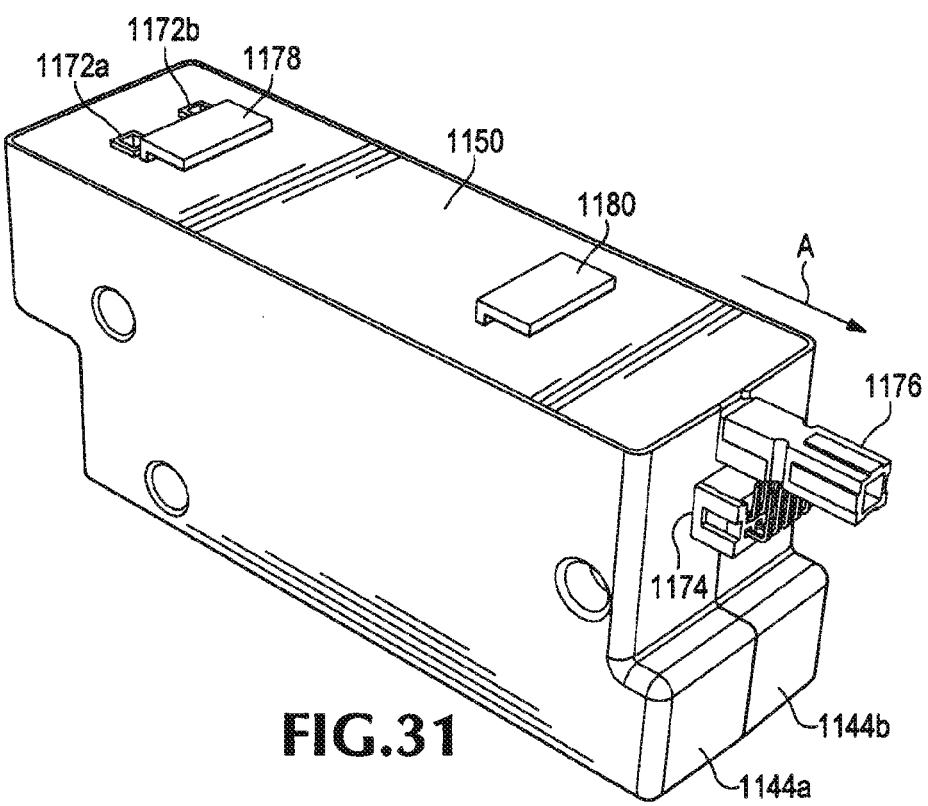
FIG. 31 is a perspective view showing the opposite side of the embodiment of FIG. 30.

FIG. 31 is a perspective view showing the opposite side of the embodiment of FIG. 30. In the view of FIG. 31, both of vents 1172a and 1172b are visible in the base plate 1150, and both case shells 1144a and 1144b are shown in their assembled positions. A right angle header 1174 is shown in the position it is in when the header pins for the solenoid/ control connections are fully engaged with the header. The right angle terminals extending from the header 1174 may be soldered to a circuit board (not shown) on which control circuitry is located. For example, control circuitry 1036 shown in FIG. 24A may be interfaced to the embodiment of FIG. 31 through header 1174. Another connector 1176 may be included to provide additional or alternative mechanical and/or electrical connections to the relay assembly.

In the embodiment of FIG. 31, the base plate 1150 includes mounting ears 1178 and 1180 which may pass through apertures in a mounting plate and engage the plate to secure the relay assembly to a mounting site on the plate when the relay assembly is slid in the direction of arrow A. This sliding action may also cause the terminal pins to engage in header 1174, and may additionally cause connector 1176 to engage the case of the relay assembly. The vents 1172a and 1172b are located relative to mounting ear 1178 such that, after the mounting ear passes through an aperture on the mounting plate and the relay assembly is slid into position in the direction of arrow A, the aperture is then positioned over the vents to enable the vents to communicate with the space on the other side of the mounting plate. Thus, the one aperture in the mounting plate operates synergistically as both a passage to vent a blast, and an aperture to engage the mounting ear 1178.

Although the example embodiment of FIGS. 30 and 31 is shown as a two-pole relay assembly, other embodiments may be realized with relays, circuit breakers, or other switching devices, and with any number of poles, e.g., single pole, three-pole, etc. Moreover, any number of switch states or positions may be used, for example, single throw, double throw, etc.

Figure 32:
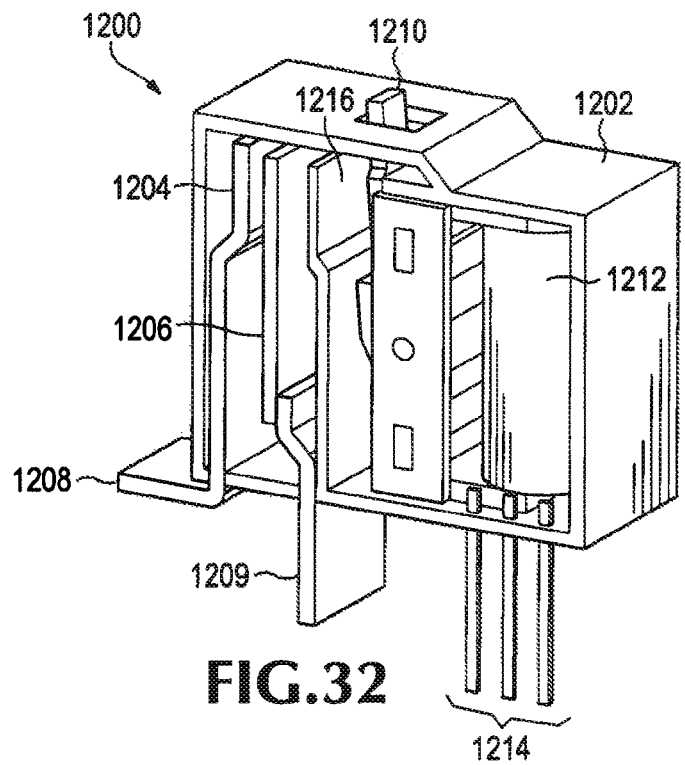
FIG. 32 is a perspective view illustrating an electrical switching device according to some inventive principles of this patent disclosure.

FIG. 32 is a perspective view illustrating an electrical switching device according to some inventive principles of this patent disclosure. In this embodiment, the electrical switching device 1200 includes a case 1202, contacts 1204 and 1206, a manual actuator 1210, and a solenoid 1212. A wall 1216 within the electrical switching device substantially separates the contacts 1204 and 1206 within the case 1202 from the manual actuator 1210 and the solenoid 1212. The contacts 1204 and 1206 are coupled to terminals 1208 and 1209.

Although the electrical switching device 1200 is illustrated apparently as a cutaway view, in an embodiment, the electrical switching device 1200 can have an open side. For example, the case 1202 can be configured to include less than all sides to encapsulate the internal components. That is, the electrical switching device 1200 can be manufactured with the contacts 1204 and 1206, solenoid 1212, or the like within the case 1202 exposed. In another embodiment, the electrical switching device 1200 can be configured with a wall enclosing the contacts 1204 and 1206, solenoid 1212, or the like. The electrical switching device 1200 can be configured that such a wall is removable. For example, the electrical switching device 1200 can be an off-the-shelf component. In particular, the electrical switching device can be an off the shelf component substantially lacking in structures to guide a blast. That is, a blast could exit from the case 1202 of such an off-the-shelf electrical switching device 1200 in an undetermined location on the case 1202. However, by removing a lid, wall, side, or the like of such an electrical switching device 1200, a blast can be guided as will be described in further detail below. Regardless, the electrical switching device 1200 includes an opening in the case 1202 that is configured to expose the contacts 1204 and 1206.

Although an opening in the case 1202 has been illustrated as including substantially all of one side of the electrical switching device 1200, the opening can include more or less of the case 1202. For example, in an embodiment, the case 1202 can include an opening that only exposes the contacts 1204 and 1206 within the case. In other words, the manual actuator 1210, the solenoid 1212, or the like within the case 1202 may not be exposed through the opening. In another embodiment, multiple sides of the electrical switching device 1200 can expose the internal components.

Although a particular type of electrical switching device has been described, namely an electrical switching device 1200 with a solenoid 1212 actuator, any actuator can be used. In addition, the electrical switching device 1200 can be any switching device as described above.

Figure 33:
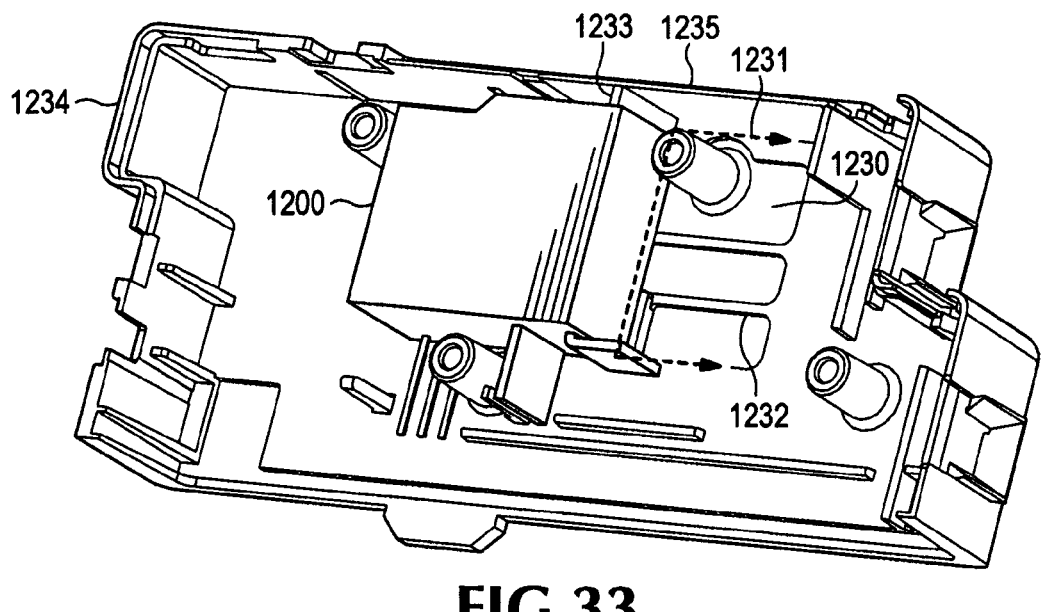
FIG. 33 is a cutaway view illustrating a duct according to some inventive principles of this patent disclosure.

FIG. 33 is a cutaway view illustrating a duct according to some inventive principles of this patent disclosure. In this embodiment, a case can be arranged to substantially encapsulate the electrical switching device 1200. A side 1234 of the case is illustrated. The electrical switching device 1200 is disposed in contact with the side.

In the following description, various portions of an electrical switching device assembly will be described. However, portions that may have been previously described or portions that will be described later may or may not be illustrated. The illustrations may omit some portions for the sake of clarity.

The side 1234 includes at least one duct 1230. A duct 1230 includes one or more structures that form an opening. The duct 1230 is disposed adjacent to the electrical switching device 1200. In particular, the duct 1230 is disposed adjacent to the opening in the electrical switching device 1200. Accordingly, as the opening is disposed to expose the contacts 1204 and 1206 of the electrical switching device 1200, any blast from the contacts 1204 and 1206 can enter the duct 1230.

In this embodiment, a rib 1232 can be disposed in the ducts. The rib 1232 can be disposed in the duct 1230 such that the duct 1230 has additional structural support. For example, the rib 1232 can increase a stiffness of the side 1234 in the duct 1230. In an embodiment, the duct 1230 can be formed from a recessed region of the side 1234. The recessed region can be strengthened by ribs 1232. Although one rib 1232 has been described, in an embodiment, multiple ribs 1232 can be disposed in the duct 1230 as desired.

In another embodiment, the rib 1232 can be configured to contact the case 1202 of the electrical switching device 1200. As a result, the rib 1232 can provide an amount of support to the case 1202. Moreover, in an embodiment, the rib 1232 can but need not be aligned substantially parallel to an axis of the case 1202. For example, the rib 1232 can be disposed at an angle, such as at an angle directed towards a vent. Thus, the rib 1232 can be configured to guide a blast from the electrical switching device 1200.

In another embodiment, the side 1234 can include a bulkhead 1233. The bulkhead 1233 is disposed extending from a top 1235 of the side 1234 to the case 1202. As described above, the duct 1230 can guide a blast from the electrical switching device 1200. However, once the blast exits the electrical switching device 1200, the blast can expand through any available opening. The bulkhead 1233 can be configured to substantially isolate other electrical circuitry from the blast. That is, the bulkhead 1233 can guide the blast away from travelling around the case 1202.

Figure 34:
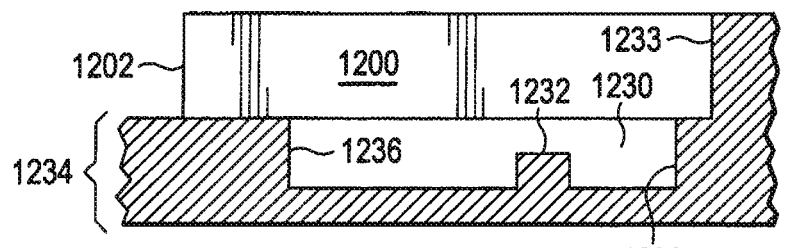
FIG. 34 is a cross-sectional view illustrating an example of an interface of the electrical switching device and case of FIG. 33.

FIG. 34 is a cross-sectional view illustrating an example of an interface of the electrical switching device and case of FIG. 33 along cross-section 1231. The case 1202 of the electrical switching device 1200 is in contact with the side 1234 of the case. Where the case 1202 contacts the side 1234, the side 1234 can include walls 1236 and 1238. The walls 1236 and 1238 can be disposed to contact a perimeter of the case 1202. Although walls of the side 1234 have been described, in an embodiment, the perimeter of the case 1202 can contact the surface of the side 1234. That is, the side 1234 need not have distinguishable walls to contact the case 1202. However, the case 1202 and the side 1234 can still be in contact to aid in guiding a blast.

Accordingly, the contact of the case 1202 and the side 1234 forms the duct 1230. Gasses, particles, or the like from a blast can be exhausted through the duct 1230. In particular, in an embodiment, the case 1202 of the electrical switching device 1200 can form an expansion chamber coupled to the duct 1230. As will be described in further detail below, the duct 1230 can open on to such an expansion chamber. The blast can be guided into the expansion chamber where the gases can expand and cool.

Figure 35:
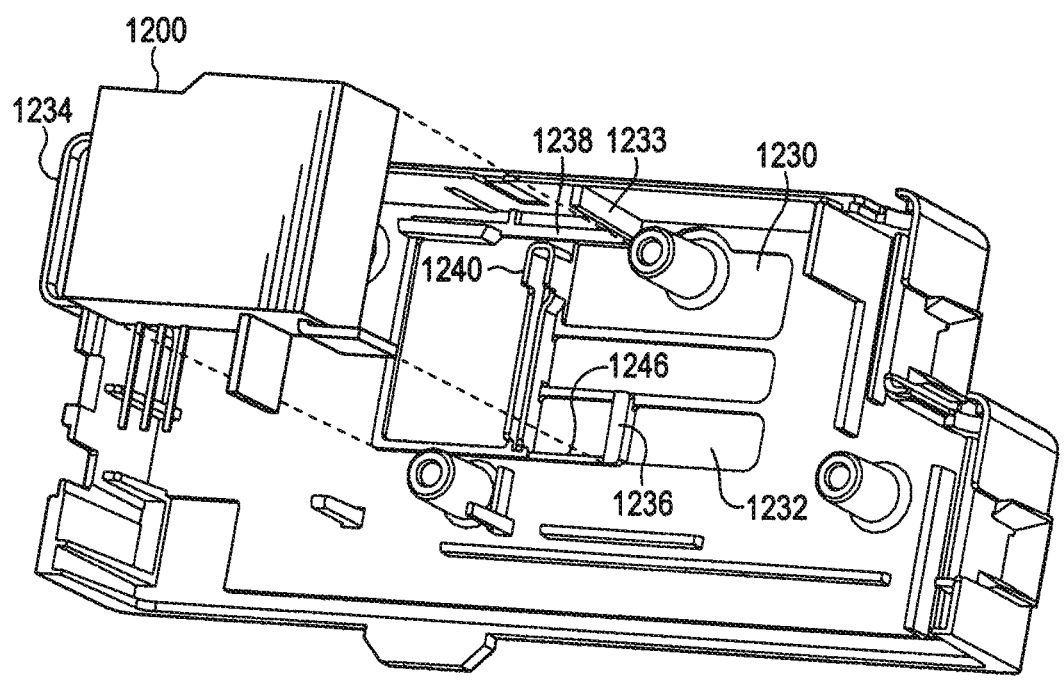
FIG. 35 is an exploded cutaway view of the embodiment of FIG. 33.

FIG. 35 is an exploded cutaway view of the embodiment of FIG. 33. In this view, the electrical switching device 1200 is illustrated as offset from the side 1234 to expose the wall 1240. The wall 1240 of the side 1234 can be disposed within the case 1202 of the electrical switching device 1200.

That is, in an embodiment, the wall 1240 can be configured to extend into the case 1202 of the electrical switching device. The wall 1240 can be configured to be disposed adjacent to the wall 1216 of the case 1202. Accordingly, the wall 1216 of the case and the wall 1240 of the side 1234 can function as a bulkhead to contain a blast from the contacts 1204 and 1206.

Additional walls can also contact the case 1202. For example, the walls 1236, 1238, and 1246 of the side 1234 and the corresponding perimeter of the case 1202 of the electrical switching device 1200 form additional walls. The case 1202 can provide additional walls. Such walls can substantially contain a blast.

However, because of the interface between the case 1202 and the duct 1230, an opening remains to guide the blast from the chamber 1244. As a result, the blast can be guided away from the electrical switching device 1200.

Figure 36:
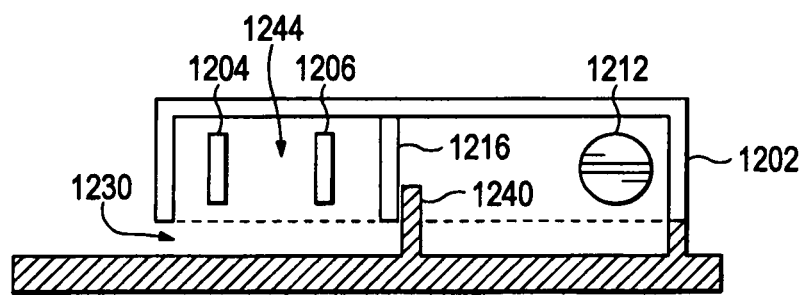
FIG. 36 is a cross-sectional view illustrating an example of an interface of a wall of the case and a wall of the electrical switching device.

FIG. 36 is a cross-sectional view illustrating an example of an interface of a wall of the case and a wall of the electrical switching device. As described above, a wall 1216 can separate the contacts 1204 and 1206 from other components of the electrical switching device 1200, such as the solenoid 1212. The wall 1240 of the side 1234 extends into the electrical switching device 1200. In this embodiment, the wall 1240 partially extends into the electrical switching device 1200. However, in other embodiments, the wall 1240 can fully extend to the opposite side of the electrical switching device 1200. In another embodiment the wall 1240 can form a butt joint.

That is, the wall 1240 of the side 1234 and the wall 1216 of the electrical switching device 1200 form a wall of a chamber 1244. Accordingly, a blast from contacts 1204 and 1206 can be guided substantially in a desired direction. Accordingly, any blast from the contacts 1204 and 1206 can be substantially prevented from traveling towards the solenoid 1212 or other electronics. The blast can be guided through the duct 1230.

In an embodiment, the duct 1230 can be the only opening exposing the chamber 1244 to a region external to the electrical switching device 1200. For example, the contact of the walls, the case 1202, and the like can be sealed together. Adhesives, welding, gaskets, or the like can seal the surfaces together. As a result, the only route for expanding gas and particles from the blast is through the duct 1230.

In another embodiment, the duct 1230 can be sized such that a majority of the blast is directed through the duct 1230. For example, there can be some opening between the wall 1216 of the electrical switching device 1200 and the wall 1240 of the side 1234. Other interfaces, such as the interface of the walls 1236 and 1238 to the perimeter of the electrical switching device 1200 can also have similar gaps, openings, or the like. As a result, a portion of the blast can escape beyond the junction of the walls.

However, the duct 1230 can be sized such that a cross-sectional area of an opening created in the duct 1230 between the side 1234 and the electrical switching device 1200 can be greater than a combination of similar cross-sectional areas of the gaps, openings, or the like described above. As a result, even though it is possible for the blast to escape through the other openings, a majority of the blast can escape through the duct 1230.

As illustrated in FIG. 36, the wall 1240 can be a planar wall. As illustrated in FIG. 35, the wall 1240 can include multiple walls. Accordingly, the wall 1240 can take any variety of configurations. That is, the wall 1240 can be disposed on the solenoid 1212 side of the wall 1216. In another embodiment, the wall can straddle the wall 1216. In another embodiment, the wall 1240 can be disposed on the contact 1206 side of the wall 1216.

Figure 37:
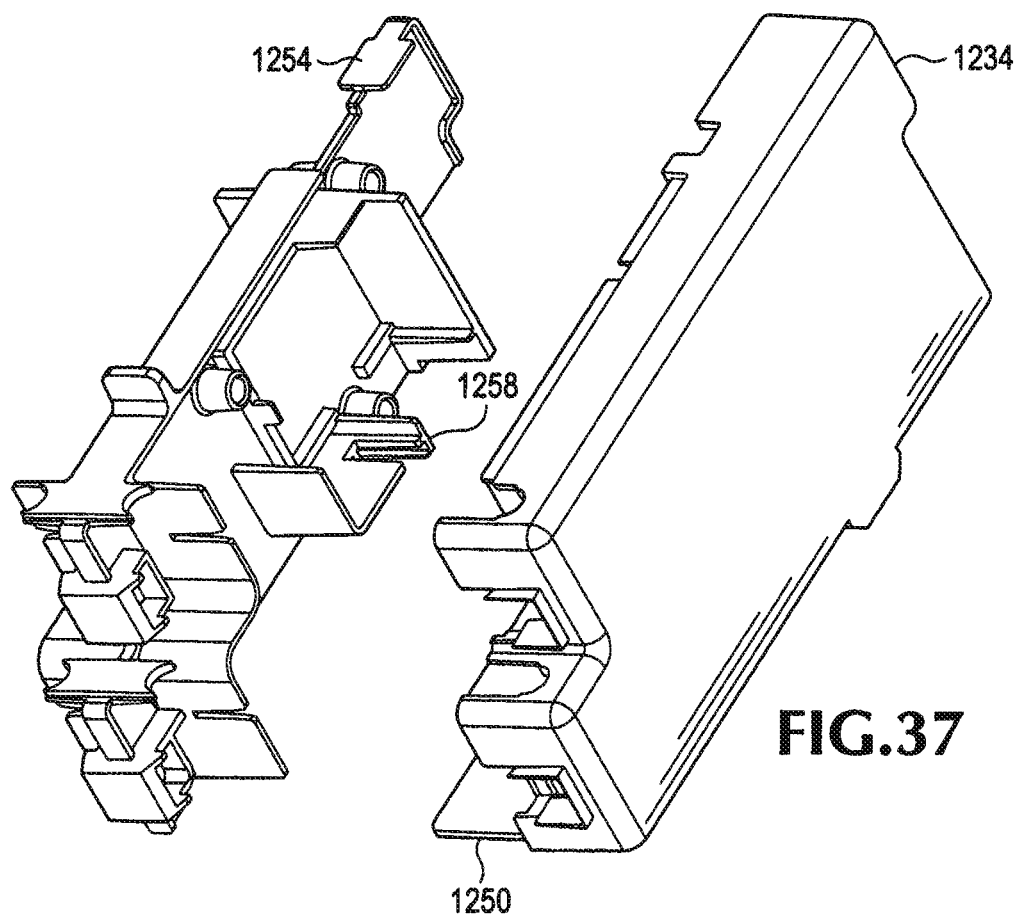
FIG. 37 is a cutaway view illustrating a bulkhead according to some inventive principles of this patent disclosure.
Figure 38:
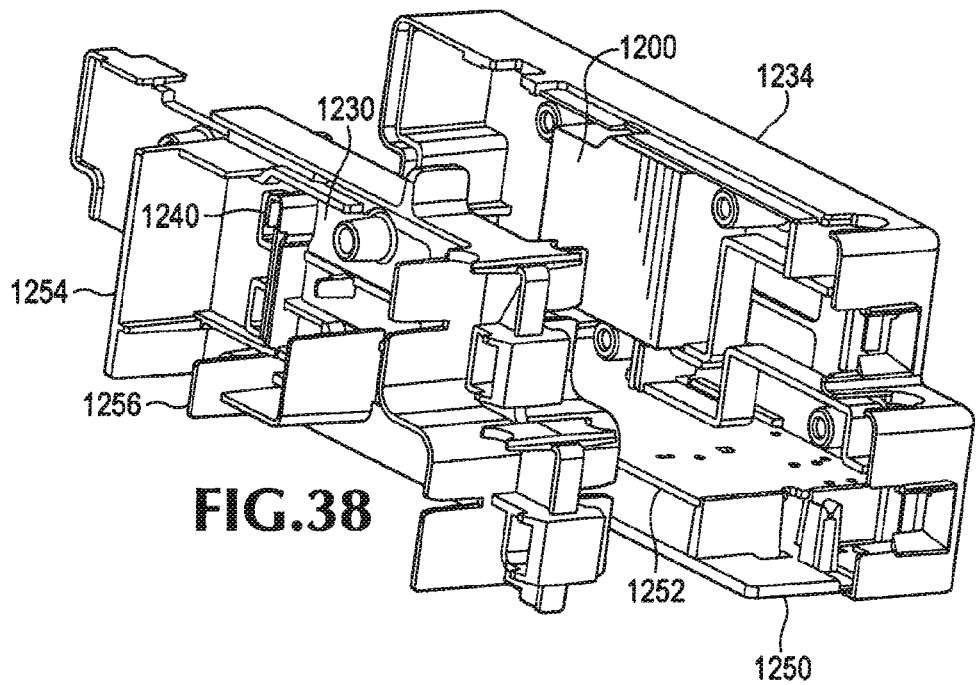
FIG. 38 is an exploded cutaway view of the embodiment of FIG. 37 from a different angle.

FIG. 37 is an exploded cutaway view illustrating a bulkhead according to some inventive principles of this patent disclosure. FIG. 38 is an exploded cutaway view of the embodiment of FIG. 38 from a different angle. Referring to FIGS. 37 and 38, in an embodiment, a first bulkhead 1258 can extend between an electrical switching device 1200 and a second bulkhead 1252.

In this embodiment, the first bulkhead 1258 is part of a center bulkhead 1254 dividing the electrical switching component. When the center bulkhead 1254 is assembled with the side 1234, the bulkhead 1258 is disposed between the electrical switching device 1200 and the second bulkhead 1252.

In an embodiment, the second bulkhead 1252 is a circuit board. However, the second bulkhead 1252 need not be a circuit board. For example, in an embodiment, the second bulkhead 1252 can be a bottom 1250 of the electrical switching component, the side 1234, or the like. Thus, the bulkhead 1258 can extend from the electrical switching device 1200 to the bottom 1250 of the electrical switching component. In another embodiment, the second bulkhead 1252 can be another internal structure of the electrical switching component. Similar to the bulkhead 1233 described above, the bulkhead 1258 can substantially isolate other electrical components from the blast by guiding the blast away from the side of the case 1202.

Figure 39:
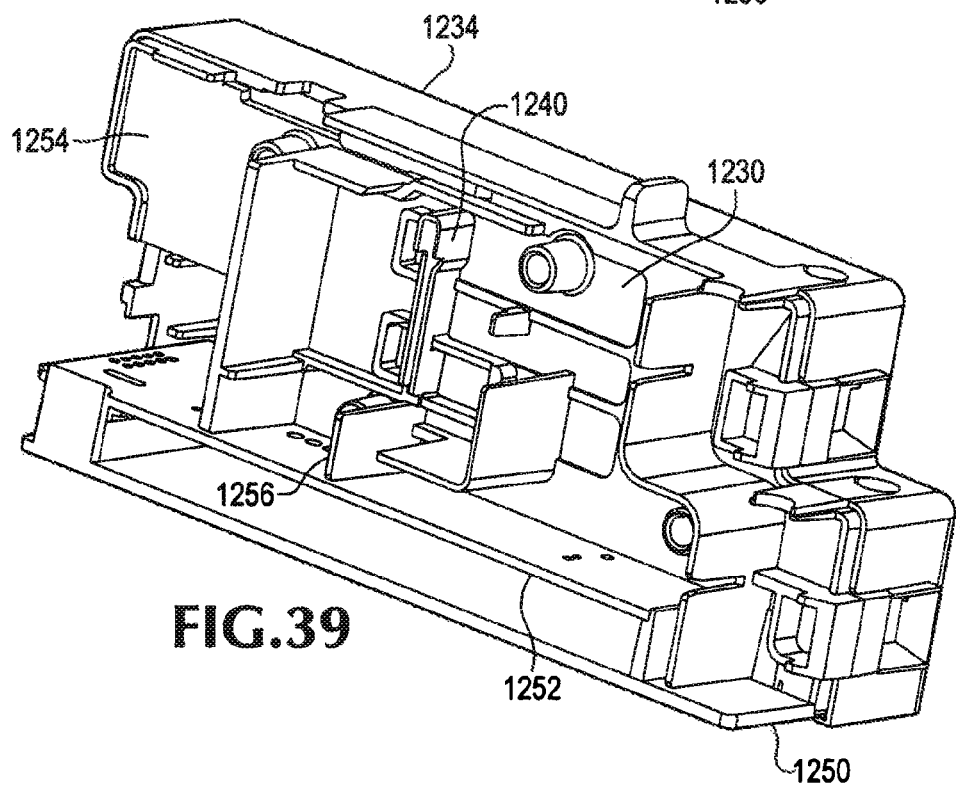
FIG. 39 is a cutaway view illustrating a circuit board in the assembly of FIG. 38 according to some inventive principles of this patent disclosure.

FIG. 39 is a cutaway view illustrating a circuit board in the assembly of FIG. 38 according to some inventive principles of this patent disclosure. In this view, the center bulkhead 1254 is assembled with the side 1234. The center bulkhead 1254 can include a duct 1230, a wall 1240, and the like similar to the side 1234. Accordingly, a second electrical switching device (not illustrated) similar to the electrical switching device 1200 described above can be assembled with the center bulkhead. A bulkhead 1256 can extend from the electrical switching device to the bulkhead 1252.

In addition to guiding the blast, the various bulkheads can isolate other electrical circuitry from the blast. As described above, a blast can travel through duct 1230. The blast can expand towards the circuit board 1252. The blast can be blocked by the circuit board 1252. Accordingly, electrical components, and in particular, electrical components that are electrically coupled to lower voltage circuitry, can be protected from the blast.

Although the bulkhead 1256 has been illustrated as substantially in line with the wall 1240, the bulkhead 1256 can be disposed in other locations. For example, the bulkhead 1256 can be disposed further away from the ducts 1230. Additional walls such as the wall 1242 can contact the perimeter of the case 1202 of the electrical switching device 1200. Accordingly, other components including the components of the electrical switching device 1200 can be substantially isolated from the blast.

Although the duct 1230 has been illustrated as disposed on the center bulkhead 1254, the duct 1230 can be disposed in other locations. In an embodiment, the duct 1230 can be disposed on another side (not illustrated) of the electrical switching component opposite the side 1234. In another embodiment, the ducts for multiple electrical switching devices 1200 can be disposed on the center bulkhead 1254. The openings of the electrical switching devices 1200 can be disposed to open on to the duct 1230, regardless of the particular location.

Figure 40:
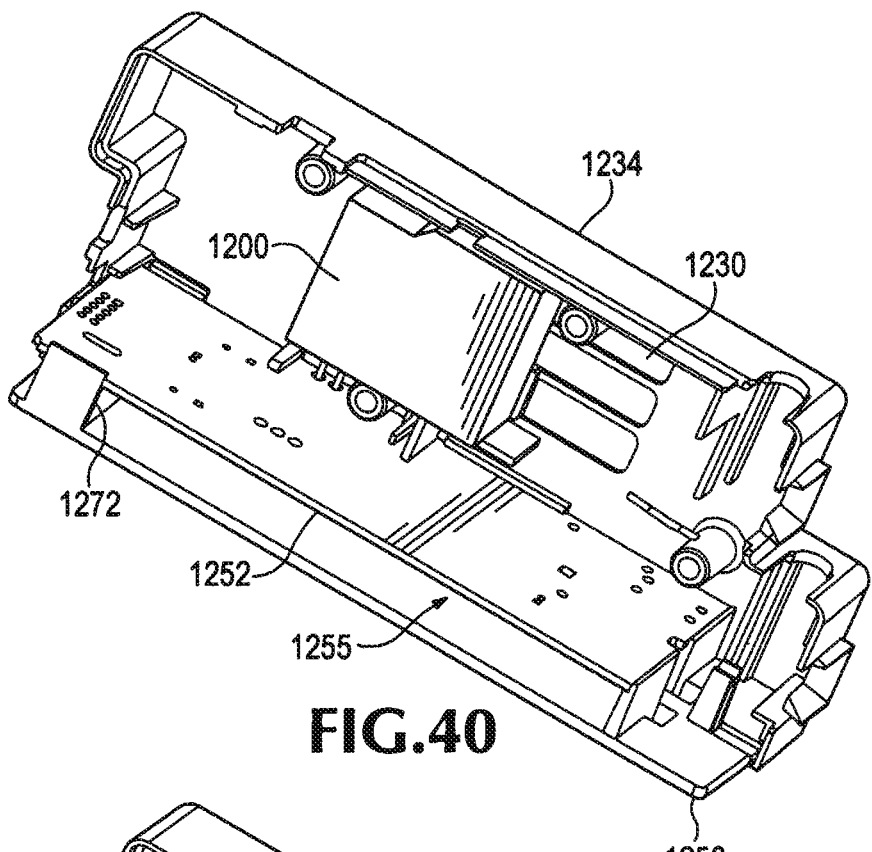
FIG. 40 is a cutaway view illustrating a circuit board according to some inventive principles of this patent disclosure.

FIG. 40 is a cutaway view illustrating a circuit board according to some inventive principles of this patent disclosure. In this embodiment, the circuit board 1252 is mounted to the side 1234 and the bottom 1250. The circuit board 1252 can be similarly mounted on another side of the case (not illustrated). The circuit board 1252 is supported by stand-offs 1270 and 1272. The stand-offs 1270 and 1272 can be configured to offset the circuit board 1252 from the bottom 1250. As a result, circuitry can be disposed on side 1255 of the circuit board 1252.

In addition to supporting the circuit board 1252, the stand-off 1270 can substantially isolate the opposite side 1255 of the circuit board 1252. For example, the blast can be directed along the circuit board 1252. The stand-off 1270 can also be configured to direct such a blast away from the opposite side 1255 of the circuit board 1252.

Figure 41:
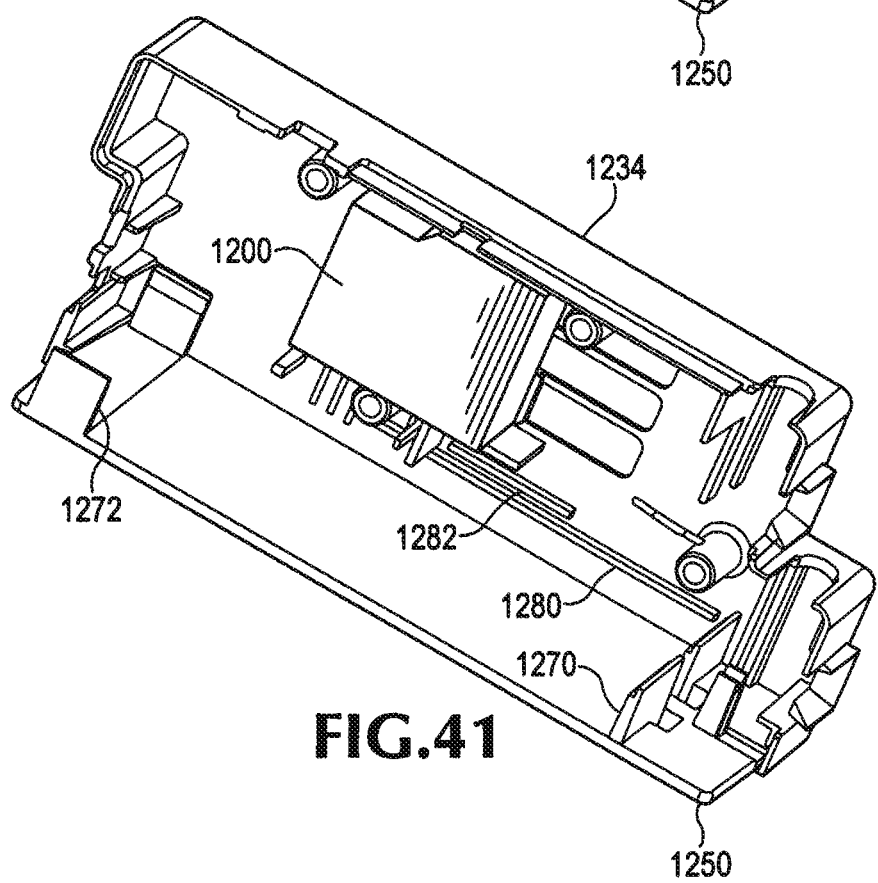
FIG. 41 is the cutaway view of FIG. 39 without the circuit board.

FIG. 41 is the cutaway view of FIG. 40 without the circuit board. Supports 1280 and 1282 can be configured to support an edge of the circuit board 1252. For example, the circuit board 1252 can be disposed between the supports 1280 and 1282.

The supports 1280 and 1282 can extend along a length of the circuit board 1252. In particular, in an embodiment, the support 1280 can extend along a length of the circuit board 1252. Accordingly, when a blast increases the pressure on the circuit board 1252, the circuit board 1252 can be pressed on to the support 1280. Thus, the blast can be substantially prevented from escaping around an edge of the circuit board extending along the length.

The support 1280 can, but need not extend along the entire length of the circuit board 1252. For example, the support can extend only along a length of the circuit board 1252 where the circuit board 1252 may encounter a blast. Similarly, the support 1282 can, but need not extend along an entire length of the circuit board 1252. For example, the support 1282 can include periodically spaced supports along the edge. Although the support 1280 has been illustrated as continuous along a length of the circuit board 1252, the support 1280 can include periodically spaced structures.

The supports 1280 and 1282 have been illustrated for an example. Other supports can be included on another side of the case, a center bulkhead 1254, or the like. Accordingly, along a perimeter of the circuit board 1252, the edges of the circuit board 1252 can be substantially sealed. However, in an embodiment, the edges of the circuit board can, but need not be substantially sealed beyond a bulkhead, such as bulkhead 1256 or 1258. That is, if the blast is substantially isolated from a region of the circuit board 1252, the edges in that region need not be substantially sealed.

Moreover, although the supports 1280 and 1282 have been illustrated as protrusions, the supports 1280 and 1282 can take different forms. For example, the supports 1280 and 1282 can include a slot, recessed region of the side 1234, or the like configured to receive an edge of the circuit board 1252. Any combination of such protrusions and recessed regions can be used.

Figure 42:
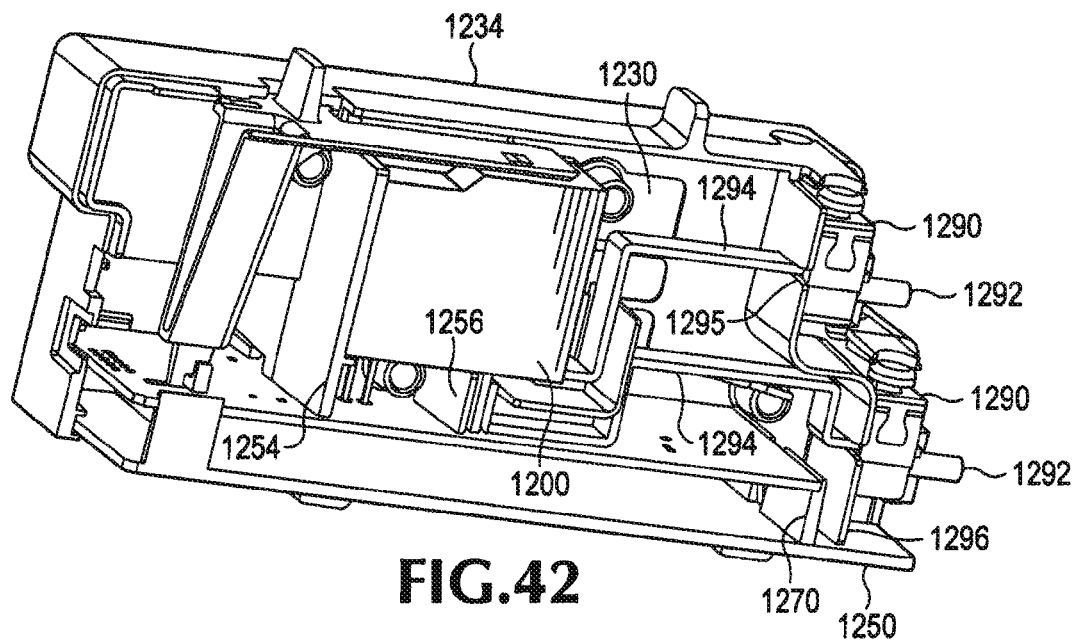
FIG. 42 is a cutaway view illustrating a bulkhead and terminals according to some inventive principles of this patent disclosure.

FIG. 42 is a cutaway view illustrating a bulkhead and terminals according to some inventive principles of this patent disclosure. In this embodiment, a second electrical switching device 1200 is illustrated as assembled on the center bulkhead 1254. The contacts of the electrical switching device 1200 are coupled to conductors 1294. The conductors 1294 are coupled to corresponding terminals 1290. The terminals 1290 can be configured to be coupled to wiring 1292.

Although the terminals 1290 have been illustrated as screw terminals, the terminals 1290 can have a variety of configurations. For example, the terminals 1290 can be quick-connect terminals, connectors, or the like.

A blast from the electrical switching device 1200 can travel through the chamber including the conductors 1294. However, a bulkhead 1296 can be disposed between the electrical switching device 1200 and the terminals 1290. The conductors 1294 can be disposed to extend through the bulkhead where the bulkhead 1296 can be configured to substantially isolate the terminals 1290 from a blast.

As illustrated in FIG. 42, the bulkhead 1296 is part of the center bulkhead 1254. However, a gap 1295 can be present in the bulkhead 1296 to allow for placement of the conductors 1294. The gap 1295 can be substantially filled by a corresponding structure on another side (not illustrated) of the electrical switching component. Accordingly, although the bulkhead 1296 has been described as substantially isolating the terminals 1290 from a blast, the isolation can include a contribution from the additional structure of the other side. Moreover, although the bulkhead 1296 has been illustrated as an internal bulkhead, the bulkhead 1296 can be formed from a side of the case, such as side 1234. That is, in an embodiment, the bulkhead 1296 can be a wall of the case.

Figure 43:
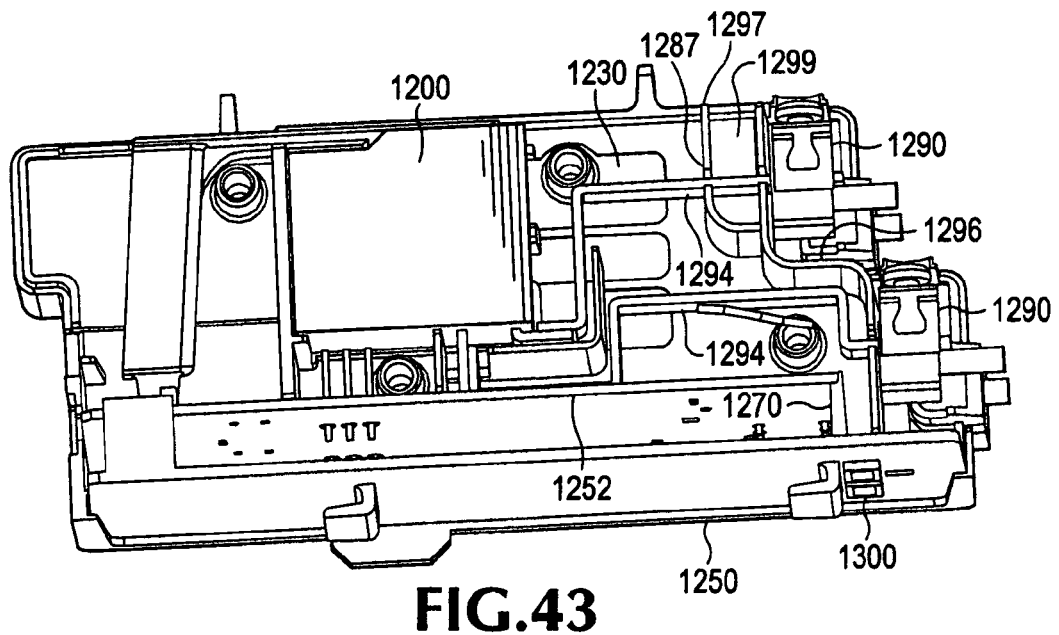
FIG. 43 is the cutaway view of FIG. 42 rotated to illustrate a vent according to some inventive principles of this patent disclosure.

FIG. 43 is the cutaway view of FIG. 42 rotated to illustrate a vent according to some inventive principles of this patent disclosure. As described above, a vent 1300 can be disposed in the case to allow a blast to vent to outside of the case. In this embodiment, the vent 1300 is disposed between the electrical switching device 1200 and the bulkhead 1296. However, in other embodiments, the vent 1300 can be disposed anywhere such that there is a substantially continuous path between the electrical switching device 1200 and the vent.

Accordingly, a blast can occur in the electrical switching device 1200. The blast can be guided through the ducts 1230. The ducts 1230 can vent into the chamber defined by the center bulkhead 1254, the circuit board 1252, the bulkhead 1256, the bulkhead 1296, and the other side (not illustrated). As the chamber is larger than the chamber 1244 of the electrical switching device 1200, the blast can expand, reducing the temperature and pressure. The gap between the stand-off 1270 and the bulkhead 1296 directs the blast towards the vent 1300 and towards an exterior of the electrical switching component.

Similar to the size of the duct relative to the size of any opening created by the junction of the case 1202 of the electrical switching device 1200 and the side 1234, the size of the vent 1300 can be selected such that a cross-sectional opening of the vent 1300 is larger than a combination of other gaps, openings, or the like between the various sides, circuit board, bulkheads, and the like guiding the blast. Accordingly, a substantial amount of the blast can be guided out of the vent 1300.

In an embodiment, the electrical switching component can include multiple bulkheads disposed between the electrical switching device 1200 and the terminals 1290. As illustrated in FIG. 43, the conductor 1294 extends through bulkhead 1297. In this embodiment, only one of the conductors 1294 passes through a bulkhead 1297 in addition to the bulkhead 1296. However, in other embodiments, the other conductor 1294, each of the conductors 1294, or the like can pass through multiple bulkheads between the electrical switching device 1200 and the terminals 1290.

In an embodiment, the conductor 1294 that is furthest from the vent 1300 can pass through bulkhead 1297. A blast guided by the ducts 1230 and directed towards the bulkhead 1297 may not have fully expanded and could have a pressure high enough to blow past an interface of the conductor 1294 and the bulkhead 1296. However, the bulkhead 1297 can redirect the blast such that the blast can further expand, reduce in pressure, temperature, or the like, before the blast reaches an interface exposing the outside of the electrical switching component. That is, the shock front of the blast can be guided such that pressure is reduced before the blast has an opportunity to escape the electrical switching component.

Moreover, in an embodiment, the bulkhead 1297 can create a substantially separate chamber 1299. The chamber 1299 can be formed from a curvature of the bulkhead 1297 towards the bulkhead 1296. Other structures such as the center bulkhead 1254 or the like can create other sides of the chamber 1299. Accordingly, a blast must travel through multiple chambers, experiencing an expansion out of the duct 1230, a constriction when passing through a gap 1287, another expansion in chamber 1299, and so on. Multiple chambers such as chamber 1299 can be created such that a blast travelling towards the terminal 1209 can experience such expansions and constrictions. As a result, the interfaces of the sides, bulkheads, walls, or the like can be more likely to contain the blast and guide it to the intended vent 1300.

In an embodiment, a sealant, such as a silicone based sealant, or other sealants, can be used between bulkheads, components, or the like, where such components meet. For example, a room temperature vulcanizing (RTV) silicone rubber sealant can be added between the conductor 1294 and the bulkheads 1291 and 1297. In another example, a sealant can be added between bulkheads 1254 and bulkhead 1297. Furthermore, although a sealant can be added between all bulkheads and components, a sealant can omitted from some joints, for example, to provide a lower resistance path for a blast.

Figure 44:
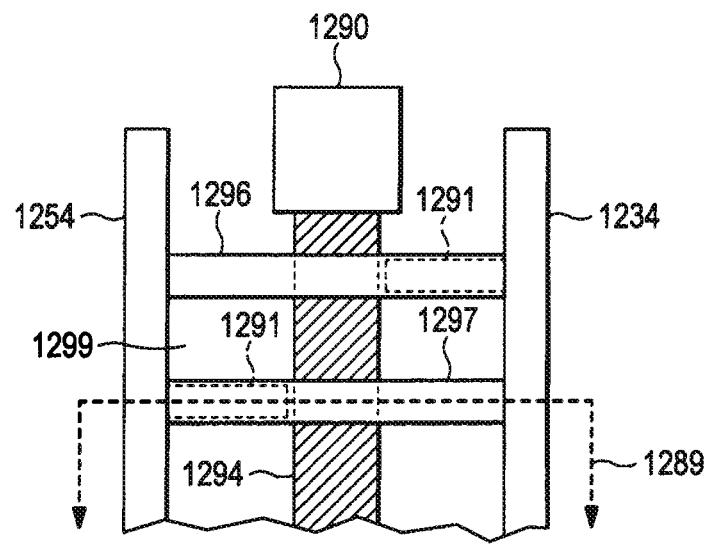
FIG. 44 is a cross-sectional view illustrating a second chamber according to some inventive principles of this patent disclosure.
Figure 45:
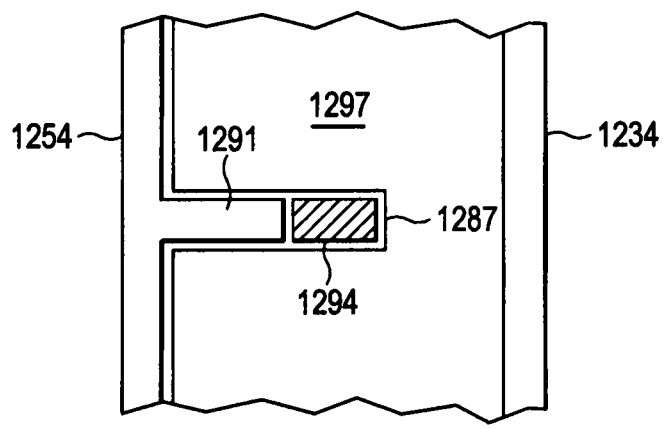
FIG. 45 is a cross-sectional view illustrating a wall of the second chamber of FIG. 44 according to some inventive principles of this patent disclosure.

FIG. 44 is a cross-sectional view illustrating a second chamber according to some inventive principles of this patent disclosure. FIG. 45 is a cross-sectional view along plane 1298 illustrating a wall of the second chamber of FIG. 44 according to some inventive principles of this patent disclosure. In the embodiment of FIG. 43, the bulkheads 1299 and 1296 are illustrated as including gaps 1287 and 1295 allowing the conductor 1294 to be assembled in the electrical switching component. In contrast, in the embodiment of FIG. 44, the corresponding gaps are on opposite sides of the conductor 1294.

For example, the center bulkhead 1254 includes the bulkhead 1296. The bulkhead 1296 extends towards the side 1234. As described above, a gap 1295 is present to allow assembly. A tab 1291, illustrated in phantom, can substantially fill the gap 1295, substantially sealing that wall of the chamber 1299. In contrast, the gap 1287 of the bulkhead 1297 is disposed on an opposite side of the conductor 1294. Moreover, the bulkhead 1297 is disposed on the side 1234, not on the center bulkhead 1254 as illustrated in FIG. 43. A tab 1291 of the center bulkhead 1254 extends to fill the gap 1297 of the bulkhead 1297.

The cross-sectional view along plane 1289 is illustrated for bulkhead 1297. However, the orientation of the gap 1295 and the bulkhead 1296 are on opposite sides for a similar cross-section. A blast can escape through the gaps in such structures. However, a blast travelling along conductor 1294 will not have a substantially straight path through chamber 1299. That is, because of the orientation of the gaps, the blast can change direction, deposit suspended particles on the walls, and further isolate the terminal 1290 and any wiring from the blast.

Figure 46:
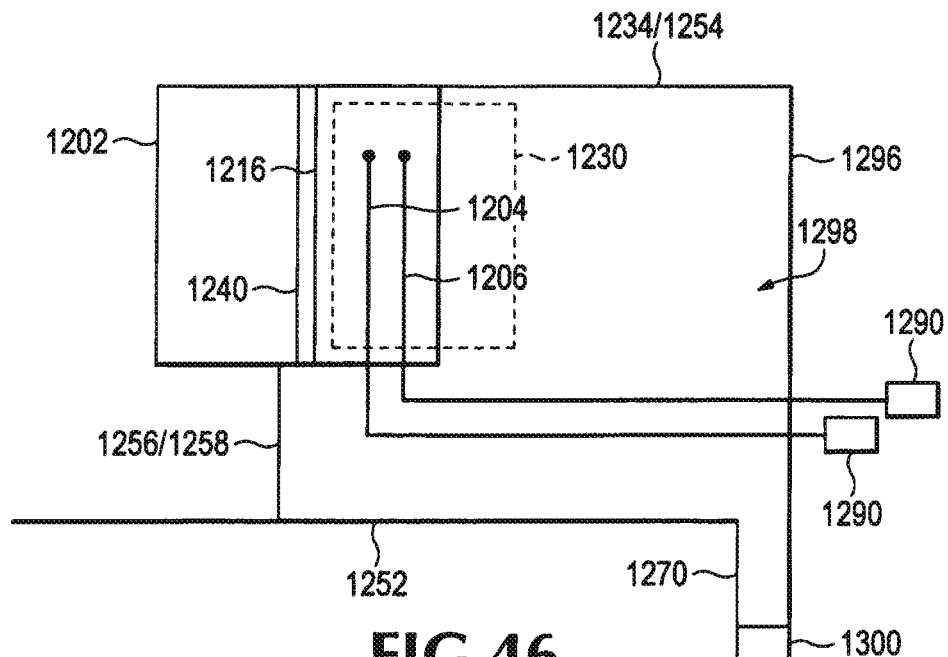
FIG. 46 is a block diagram illustrating an example of guiding a blast according to some inventive principles of this patent disclosure.

FIG. 46 is a block diagram illustrating an example of guiding a blast according to some inventive principles of this patent disclosure. In this embodiment various components described above are conceptually illustrated to show a path traveled by a blast. A case 1202 of an electrical switching device 1200 includes the contacts 1204 and 1206 where a blast occurs. Walls 1216 and 1240 contain the blast and, with the case 1202, guide the blast through the ducts 1230 into an expansion chamber 1298.

The chamber 1298 is bounded by the center bulkhead 1254, a corresponding side such as side 1234, bulkhead 1296, bulkhead 1256 or 1258, circuit board 1252, and stand-off 1270. In one example, a blast can be deflected by the center bulkhead 1254 or side 1234, directed towards the vent 1300 by bulkhead 1298. In another example, the blast can be deflected by walls 1256 or 1258, and circuit board 1252 towards the vent 1300. Accordingly, in an embodiment, each of the various walls, bulkheads, circuit boards, and the like contribute to containing the blast and guiding it towards the vent 1300.

Moreover, in an embodiment, the electrical switching component can form a module.

That is, the electrical switching device 1200, which has its own case 1202, can be encapsulated within the case formed by the various walls, bulkheads, and the like described above to form a modular component.

Figure 47:
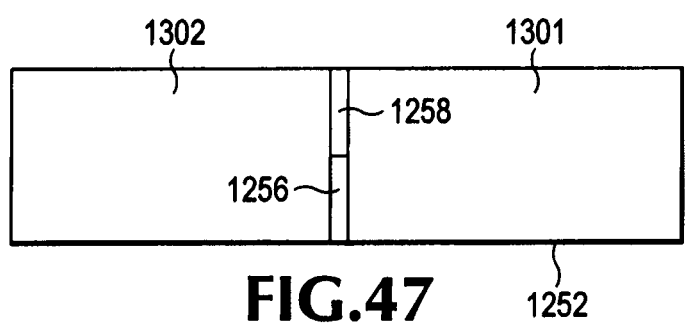
FIG. 47 is a block diagram illustrating various zones according to some inventive principles of this patent disclosure.

FIG. 47 is a block diagram illustrating various zones according to some inventive principles of this patent disclosure. As described above, walls 1256 and 1258, and stand-off 1270 can substantially isolate portions of the circuit board 1252 from a blast. FIG. 47 illustrates a top view of the circuit board 1252. Walls 1256 and 1258 can divide the circuit board 1252 into two different zones 1301 and 1302.

Zone 1301 can be a high voltage circuit zone. That is, high voltage circuitry, relays, switches, or the like can be disposed in circuit zone 1301. For example, various components that may be coupled to the electrical switching device 1200, the conductors 1294, or the like within the electrical switching component can be coupled to the circuit board 1252 in zone 1301. In addition, circuit zone 1301 can include the portion of the circuit board 1252 that can deflect a blast as described above. Accordingly, as a blast can create short circuits between a line terminal of the electrical switching component, circuitry within the zone 1301 could be subjected such line voltages. Accordingly, the circuitry in zone 1301 could be exposed to a voltage range including high voltages.

In contrast, circuit zone 1302 can be substantially isolated from the blast. As described above, the walls 1256 and/or 1258 can prevent an amount of the blast from reaching circuitry within zone 1302. Accordingly, the circuitry in zone 1302 can be exposed to a voltage range including maximum voltages lower than that of circuit zone 1301. That is, even after a blast, short circuits caused by the blast may not cause high voltages to be conducted to circuitry in zone 1302. Thus, low voltage circuitry, processors, interfaces, or the like can be placed in zone 1302.

Figure 48:
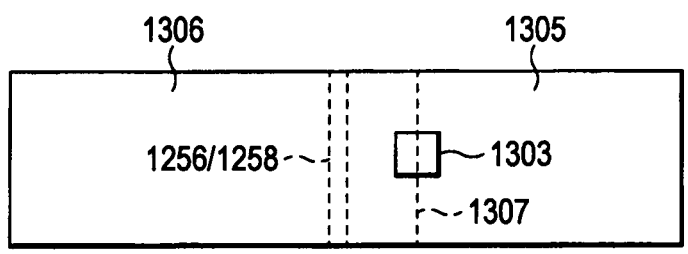
FIG. 48 is a block diagram illustrating additional zones of the circuit board of FIG. 47 according to some inventive principles of this patent disclosure.

FIG. 48 is a block diagram illustrating additional zones of the circuit board of FIG. 47 according to some inventive principles of this patent disclosure. FIG. 46 illustrates the opposite side of circuit board 1252. Walls 1256 and 1258 are illustrated in phantom for reference.

This side of the circuit board 1252 includes zones 1305 and 1306. The zones 1305 and 1306 can be divided by an isolator 1303. The isolator 1303 can form a division 1307 between the zones 1305 and 1306. The isolator 1303 can be a variety of devices. For example, the isolator 1303 can be an opto-isolator, a transformer, or the like such that current is substantially prevented from flowing directly across the isolator 1303.

In zone 1305, circuitry can be present that does not operate in the high voltage range of zone 1301. However, zone 1305 can include through-hole components that penetrate the circuit board 1252. As a result, the components can have electrical contact with zone 1301 on the opposite side. As a result, in the event of a blast, a short circuit in zone 1301 can cause a high voltage to appear on circuitry in zone 1305.

Accordingly, at least one isolator 1303 can allow signals to pass between zones 1305 and 1306. Any high voltage in zone 1305 can be contained in zone 1305. Note that as the blast can be substantially isolated from this side of the circuit board 1252, materials that can create short circuits will likely not be deposited in either zones 1305 or 1306. As a result, a short will likely not be created across the isolator 1303. Thus, the isolator 1303 can bridge the division 1307 of zones 1305 and 1306.

Figure 49:
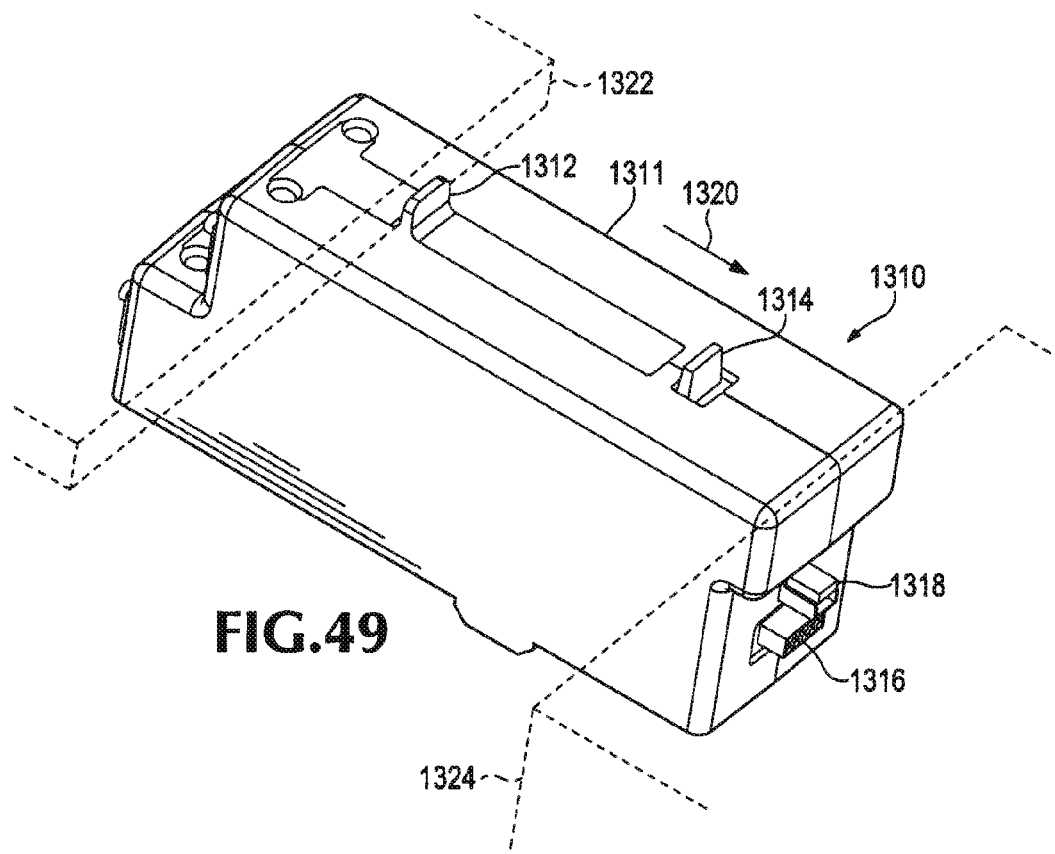
FIG. 49 is a perspective view illustrating an electrical switching component according to some inventive principles of this patent disclosure.

FIG. 49 is a perspective view illustrating an electrical switching component according to some inventive principles of this patent disclosure. In this embodiment, an electrical switching component 1310 can include a case 1311 and a connector 1316. An additional connector 1318 is illustrated; however, any number of connectors can be used.

The connector 1316 is disposed on a first end of the case such that the connector 1316 can be coupled to a second connector (not illustrated) on a mounting site 1324 by moving the case 1311 in a direction 1320. That is the connector 1316 is disposed on the case 1311 such that movement on direction 1320 can engage the connector 1316.

The case 1311 includes a retaining structure 1312. The retaining structure 1312 is configured to be constrained such that movement of the case in the direction 1320 is limited. For example, a panel 1322 of an enclosure containing the electrical switching component 1310 can be installed after the electrical switching component 1310 is mounted on the mounting site 1324. As a result, the movement of the electrical switching component 1310 is constrained along direction 1320. That is, the mounting site 1324 can prevent the electrical switching component 1310 from moving in the direction of the arrow of direction 1320 while the plate 1322 can be configured to prevent the electrical switching component 1310 from moving in a direction opposite the arrow of direction 1320.

As illustrated, the retaining structure 1312 can include a protrusion extending from a surface of the case 1311. The plate 1322 can be disposed on a side of the retaining structure 1312 opposite the mounting site 1324.

In another embodiment, the retaining structure 1312 can include a recessed region within a surface of the case 1311. The recessed region can be configured to receive a corresponding tab, protrusion, or other structure of the plate 1322.

In another embodiment, the retaining structure 1312 can include mounting locations for a fastener. For example, a fastener can include a screw, brad, bolt, nut, or the like. The case 1311 can include a threaded hole configured to receive a screw, for example. Accordingly, the plate 1322 can be mounted to the case 1311 using the retaining structure 1312.

In an embodiment, the electrical switching component 1310 can include a manual actuator 1314 coupled to an electrical switching device of the electrical switching component 1310 as described above. The manual actuator 1314 can be configured to change a state of the electrical switching device as the manual actuator is actuated in the direction 1320.

Since the manual actuator 1314 can be actuated in the direction 1320, the force applied to actuate the manual actuator 1314 has the potential to dislodge the electrical switching component 1310 from the mounting site 1324. However, since the retaining structure 1312 is coupled with the plate 1322, limiting the movement along direction 1320, such actuation of the manual actuator 1314 can reduce a chance that the force applied will dislodge the electrical switching component 1310.

Figure 50:
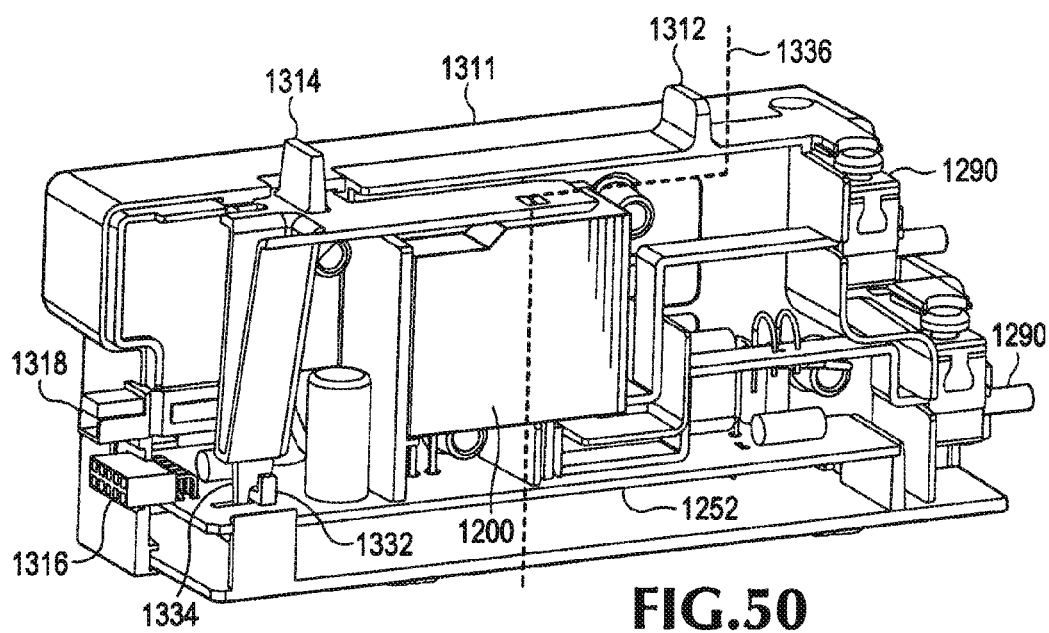
FIG. 50 is a cutaway view illustrating an actuator according to some inventive principles of this patent disclosure.

FIG. 50 is a cutaway view illustrating an actuator according to some inventive principles of this patent disclosure. The manual actuator 1314 can include an end 1334. The end 1334 can be configured to actuate a photointerruptor 1332. The photointerruptor 1332 can be disposed on the circuit board 1252 described above. Accordingly, when the manual actuator 1314 is actuated, such actuation can be sensed. In addition, the manual actuator 1314 can be configured to move when the electrical switching device 1200 is electrically actuated. That is, when the electrical switching device 1200 is actuated by an electronic signal, the electrical switching device 1200 can cause the manual actuator 1314 to be actuated. Such actuation can also be sensed by the photointerruptor 1332 and interpreted as the position of the manual actuator 1314 and hence, the state of the electrical switching device 1200. That is, from the position, a state of the electrical switching device can be sensed. For example, not only can an on/off state be sensed, but with an appropriately configured sensor, other states, such as a tripped state can be sensed.

In an embodiment, the manual actuator 1314 need not be present, yet the actuation of the electrical switching device 1200 can still be sensed. For example, the manual actuator 1314 can be replaced with a linkage configured to couple contacts or other structures of the electrical switching device 1200 to the photointerruptor 1332. Thus, the actuation can be sensed without a manual actuator 1314. However, in another embodiment, such linkages can include the manual actuator 1314.

Although a photointerruptor has been described above, other types of sensors can be used. For example, a mechanical contact sensor that makes or breaks an electrical circuit can be used. A digital position encoder can be used to sense the position of the end 1334. Any sensor that can sense position, movement, acceleration, or the like can be used.

As described above, the electrical switching component 1310 can have both high voltage circuitry and low voltage circuitry. In an embodiment the high voltage circuitry can be substantially isolated from a user. That is, a user may be required to remove panels, cases, enclosures, or the like beyond that used in normal operations to access the high voltage circuitry.

Accordingly, the retaining structure 1312 can be disposed on the case 1311 to facilitate such isolation from a user. For example, as described above, the assembly can have various high voltage circuitry, conductors, or the like. Line 1336 conceptually divides the electrical switching component 1310 into high voltage and low voltage regions. At one end of the electrical switching component 1310 with the terminals 1290, high voltage circuitry is exposed through an opening of the case 1311. At another end of the electrical switching component 1310 with the connectors 1316 and 1318, low voltage circuitry is exposed through the case 1311.

The retaining structure 1312 can be disposed on the case 1311 between such openings. Accordingly, when secured by the panel 1322 described above or other similar structure, the high voltage electrical circuitry and, in particular, the exposed contacts such as the terminals 1290 of the high voltage circuitry can be substantially isolated from a user.

Figure 51:
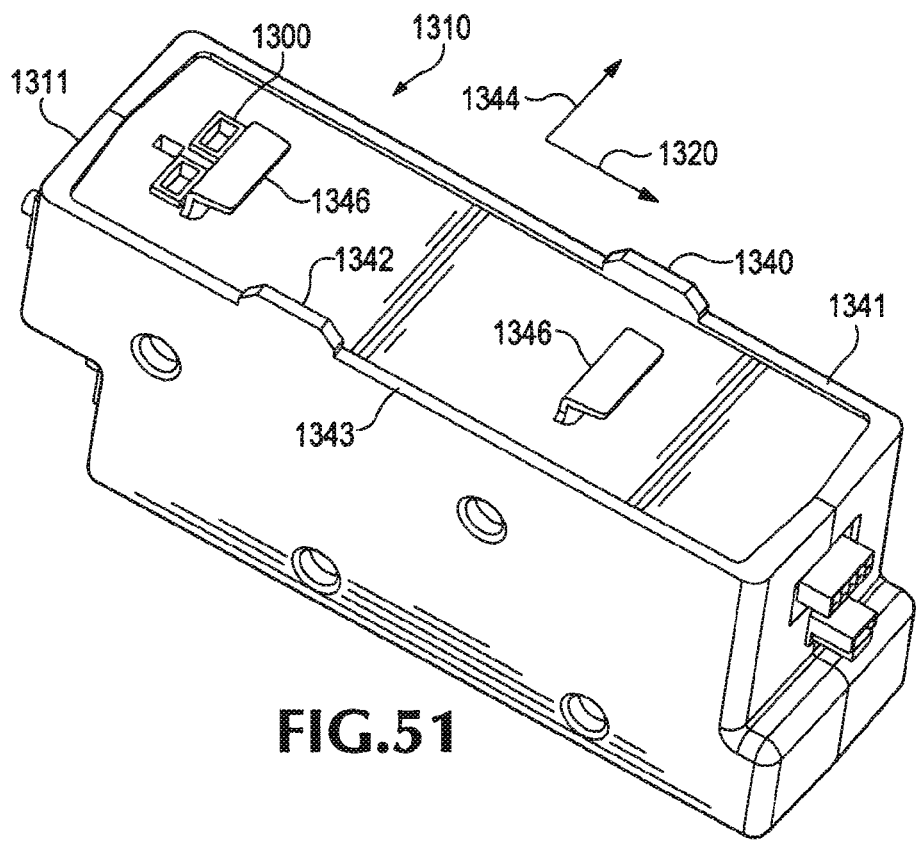
FIG. 51 is a perspective view illustrating a case according to some inventive principles of this patent disclosure.

FIG. 51 is a perspective view illustrating a case according to some inventive principles of this patent disclosure. In this embodiment, the case 1311 of the electrical switching component 1310 includes a protrusion 1340 extending from a surface of the case 1311. The protrusion 1340 can extend from a side of the case opposite the retaining structure 1312.

The protrusion 1340 can be aligned along the direction such that when the protrusion is disposed in a corresponding opening, the case is substantially constrained in a second direction 1344 substantially orthogonal to the first direction 1320. The protrusion 1340 can be aligned such that the case 1311 is not substantially constrained when disposed in the corresponding opening in direction 1320.

For example, the opening can be a slot aligned with a long axis in direction 1320. The protrusion 1340 can have a width in direction 1344 substantially equal to the width of the slot, while a length of the protrusion 1340 is less than a corresponding length of the slot in direction 1320. Thus, the electrical switching component 1310 can have a range of motion along direction 1320 while being substantially constrained in direction 1344.

In an embodiment, the case 1311 can include a second protrusion 1342. The second protrusion can be disposed on the same side of the case 1311 as the first protrusion 1340 opposite the retaining structure 1312. The second protrusion 1342 can, but need not be shaped similarly to the first protrusion. The second protrusion 1342 can be similarly formed to constrain the motion of the electrical switching component 1310 when disposed in a corresponding opening as is the first protrusion 1340.

The first protrusion 1340 and the second protrusion 1342 can be disposed on opposite edges of case 1311. For example, the first protrusion 1340 can be disposed on a first edge 1341 of the case 1311. The second protrusion 1342 can be disposed on a second edge 1343. Although the edges 1341 and 1343 can be on the same side of the case 1311 opposite the retaining structure 1312, the edges 1341 and 1343 can be on opposite edges of that side.

In an embodiment, the protrusions 1340 and 1342 can be offset from each other along direction 1320. That is, along the direction of insertion for mounting the electrical switching component 1310, the protrusions 1340 and 1342 can be offset. However, in other embodiments, the protrusions 1340 and 1342 need not be offset.

In an embodiment, mounting ears 1346 can be disposed on the case 1311 to mount the electrical switching component 1310 to a mounting location. For example, the mounting location can have an opening configured to receive the mounting ears 1346.

Figure 52:
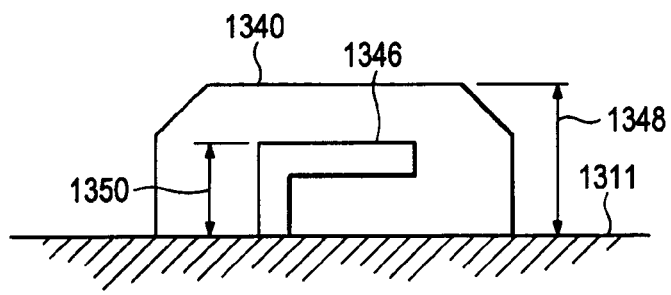
FIG. 52 is a side view illustrating the protrusion and mounting ear of FIG. 51.

FIG. 52 is a side view illustrating the protrusion and mounting ear of FIG. 51. The protrusion 1340 can have a height 1348 that is greater than a height 1350 of the mounting ear 1346. Accordingly, in an embodiment, when being mounted on a mounting site, the protrusion 1340 can contact the mounting site prior to the mounting ear 1346. As a result, when the protrusion 1340 is aligned with a corresponding opening, the protrusion 1340 can pass through the opening, allowing the mounting ear 1346 to approach the mounting site.

Figure 53:
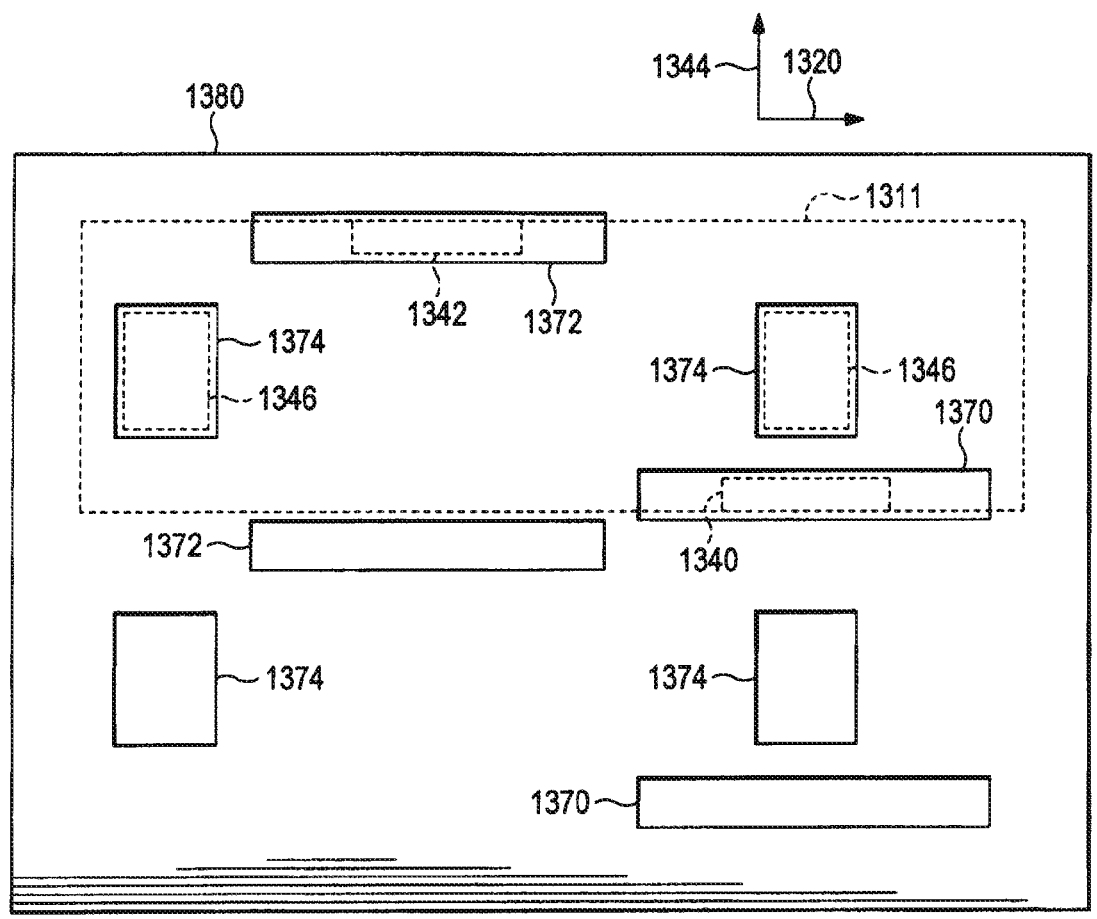
FIG. 53 is a plan view of an example of a mounting site for the assembly of FIG. 51.

FIG. 53 is a plan view of an example of a mounting site for the assembly of FIG. 51. In this embodiment, the side of the case 1311 opposite the retaining structure 1312 is illustrated in phantom. FIG. 53 illustrates a state where the electrical switching component 1310 is mounted on the mounting site 1380, but the mounting ears 1346 are not engaged. The mounting site 1380 includes openings 1370, 1372, and 1374. The protrusions 1340 and 1342 are disposed in openings 1370 and 1372, respectively. The mounting ears 1346 are disposed in the openings 1374.

As described above, the protrusions 1370 and 1372 can be higher than the mounting ears 1346. Accordingly, when the electrical switching component 1310 is brought into contact with the mounting site 1380, the contact will be with the protrusions 1340 and 1342.

In an embodiment, the openings 1370 and 1372 can be longer along direction 1320 than necessary to accommodate a range of motion of the electrical switching component 1310 when the mounting ears 1346 are disposed in the openings 1376. That is, a greater amount of misalignment of the protrusions 1340 and 1342 relative to an installed location can be tolerated with the openings 1370 and 1372.

Accordingly, the protrusions 1340 and 1342 can engage with the openings 1370 and 1372 with an amount of misalignment between the mounting ears 1346 and the openings 1376. However, this does not mean that the mounting ears 1346 cannot engage the openings as the protrusions 1340 and 1342 can engage with the openings 1370 and 1372. If the protrusions 1340 and 1342 engage with the openings 1370 and 1372 with the mounting ears 1346 misaligned, the mounting ears 1346 can contact the mounting site 1380 and slide along as the electrical switching component 1310 is moved.

As the protrusions 1340 and 1342 are engaged with the openings 1370 and 1372, the motion of the electrical switching component 1310 is constrained. Thus, the motion of the assembly, is limited in direction 1344; however, the motion in direction 1320 is possible due to the relative lengths of the protrusions 1340 and 1372 and the openings 1370 and 1372. The electrical switching component 1310 can be moved along direction 1320 until the mounting ears 1346 pass through the openings 1374. The electrical switching device 1310 can then be moved again along direction 1320 to engage the mounting ears 1346 with the mounting site 1380.

Although the mounting ears 1346 have been used as an example, other mounting structures can be used. For example, clips, hooks, or the like can be used to mount the electrical switching device 1310 to the mounting site 1380.

Figure 54:
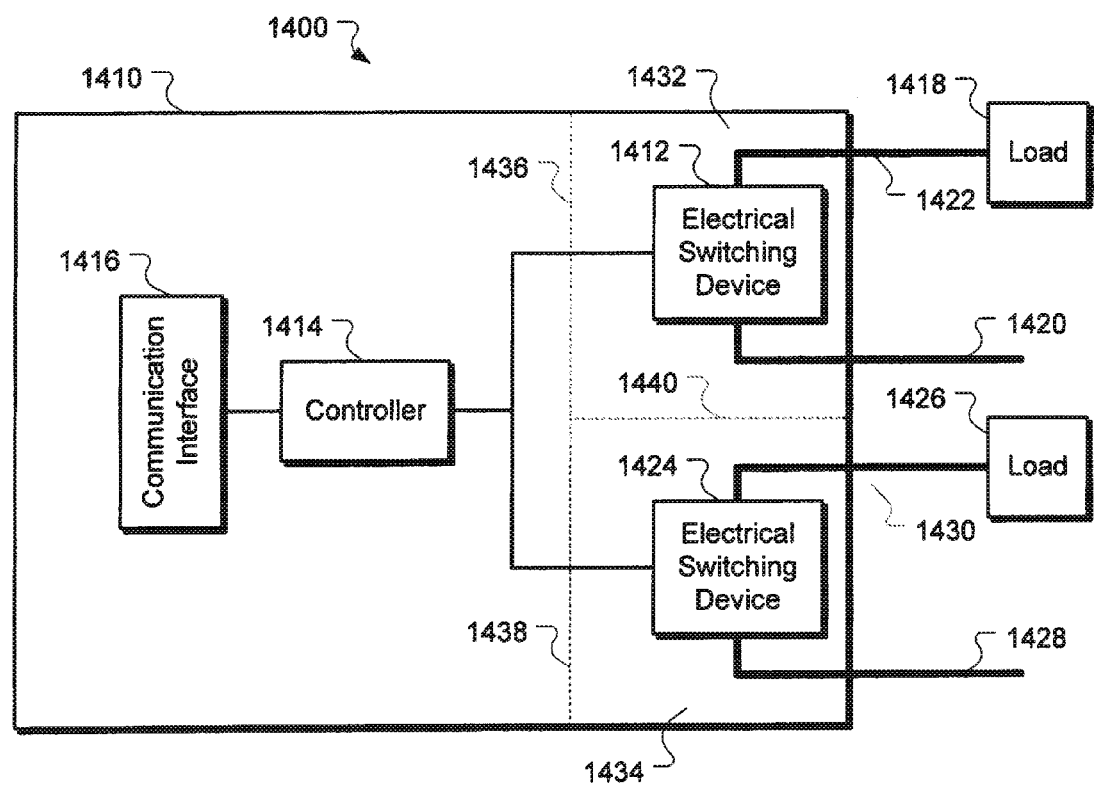
FIG. 54 illustrates an embodiment of an electrical switching module according to some inventive principles of this patent disclosure.

FIG. 54 illustrates an embodiment of an electrical switching module according to some inventive principles of this patent disclosure. In this embodiment, the module 1400 includes an electrical switching device 1412, a controller 1414, and a communication interface 1416, similar to modules 1-7 described above. The electrical switching device 1412 is coupled to line wiring 1420 and building wiring 1422 and is configured to control power to load 1418.

Module 1400 also includes a second electrical switching device 1424. The second electrical switching device 1424 is also substantially encapsulated by the case 1410. The second electrical switching device 1424 is coupled to line wiring 1428 and building wiring 1430 and configured to control power to load 1426. Although the wiring 1420 and 1428 has been illustrated as distinct, the wirings 1420 and 1428 can be coupled together. Furthermore, although two electrical switching devices 1412 and 1424 have been illustrated, a module 1400 can have any number of electrical switching devices and associated structures and circuitry.

As illustrated, each of the electrical switching devices 1412 and 1424 are coupled to controller 1414. However, each electrical switching device 1412 and 1424 can be associated with independent circuitry. For example, each electrical switching device 1412 and 1424 can have independent drive circuitry to actuate the electrical switching device. Accordingly, each electrical switching device 1412 and 1424 can be opened and closed independently.

As described above, an electrical switching device can be coupled to a variety of other circuitry and components. For example, as illustrated in FIG. 2, an actuator 30 and position sensor 32 can be coupled to the electrical switching device 12. Similarly, each of electrical switching devices 1412 and 1424 of FIG. 53 can have an actuator and sensor 32.

In an embodiment, the actuators of the electrical switching devices 1412 and 1424 can be substantially independent of each other. For example, the actuators could be placed in different positions. Moreover, the associated position sensors can be configured to substantially independently sense the positions of the actuators. Although the actuators can be independent of one another, in an embodiment, the actuators can have some dependence. For example, the actuators may be independently engaged; however, the actuators can be structured to disengage at substantially the same time.

Similar to the actuators, each electrical switching device 1412 and 1424 can include other circuitry, such as a zero-crossing detector, current and voltage sensors, or the like. Any of the above described circuits and/or components that are coupled to an electrical switching device can be coupled to one or more of the electrical switching devices 1412 and 1424.

In an embodiment, each electrical switching device 1412 and 1424 can have its own independent circuitry, such as the drive circuitry, detectors, sensors, or the like described above. However, the electrical switching devices 1412 and 1424 can have come common. For example, the controller 1414 can include a processor that is coupled to both the electrical switching devices 1412 and 1424. This processor could be part of the controller 1414, described above. In another example, the electrical switching devices 1412 and 1424 can share a common power supply. That is, from one or more of the line wirings 1420 and 1428, a power supply can be generated for us in the electronics of the module 1400. In yet another example, the power supply could be received from outside of the module 1400 and similarly used for circuitry of both electrical switching devices 1412 and 1424. In another example, a common circuit board can be used for the electrical switching devices 1412 and 1424.

In an embodiment, the electrical switching devices 1412 and 1424 can be substantially encapsulated in different chambers. As illustrated, electrical switching device 1412 is substantially encapsulated in chamber 1432. Similarly, electrical switching devices 1424 is substantially encapsulated in chamber 1434. Bulkheads 1436, 1436, 1440, or the like, such as the bulkheads described above, can define the chambers 1432 and 1434, and substantially isolate the electrical switching devices 1412 and 1424. As a result, a failure in one electrical switching device can have a reduced impact on other electrical switching devices in the module.

Moreover, the inventive principles of this patent disclosure have been described above with reference to some specific example embodiments, but these embodiments can be modified in arrangement and detail without departing from the inventive concepts. Such changes and modifications are considered to fall within the scope of the following claims.

The invention claimed is:

1. A module, comprising:
   a case;
   an electrical switching device configured to directly control power to a load;
   a controller coupled to the electrical switching device; and
   a dimming interface coupled to the controller and configured to provide dimming control to the load, the dimming interface is disposed on a first voltage region of the case, and the controller is disposed in a second voltage region substantially isolated from the first voltage region;
   wherein the electrical switching device and the controller are substantially encapsulated by the case.

2. The module of claim 1, wherein the controller is configured to monitor the electrical switching device.

3. The module of claim 1, further comprising:
   a position sensor configured to sense a state of the electrical switching device;
   wherein the position sensor is coupled to the controller.

4. The module of claim 3, further comprising:
a manual actuator coupled to the electrical switching device;
wherein the position sensing circuit is configured to sense a position of the manual actuator.

5. The module of claim 1, further comprising a zero-crossing detector coupled to the controller and configured to detect a zero-crossing associated with the electrical switching device.

6. The module of claim 1, further comprising a current sensor coupled to the controller and configured to sense a current associated with the electrical switching device.

7. The module of claim 1, further comprising a voltage sensor coupled to the controller and configured to measure a voltage associated with the electrical switching device.

8. The module of claim 1, further comprising:
a terminal configured to receive a signal; and
a communication interface coupled to the controller;
wherein the controller is configured to determine a parameter for the communication interface in response to the signal at the terminal.

9. The module of claim 1, further comprising:
a communication interface;
wherein the controller is configured to expose functionality of the electrical switching device through the communication interface.

10. The module of claim 1, the electrical switching device and the load referred to as a first electrical switching device and a first load, the module further comprising:
a second electrical switching device configured to control power to a second load;
wherein the second electrical switching device is substantially encapsulated by the case.

11. The module of claim 10, wherein:
the first electrical switching device is substantially encapsulated within a first chamber of the case;
the second electrical switching device is substantially encapsulated within a second chamber of the case; and
the first chamber is substantially isolated from the second chamber.

12. The module of claim 11, further comprising:
a controller coupled to the first electrical switching device and the second electrical switching device and substantially encapsulated by the case;
wherein the controller is substantially isolated from the first chamber and the second chamber.

13. The module of claim 10, further comprising:
a first manual actuator coupled to the first electrical switching device;
a first position sensing circuit configured to sense a position of the first manual actuator;
a second manual actuator coupled to the second electrical switching device; and
a second position sensing circuit configured to sense a position of the second manual actuator.

14. A method comprising:
providing a module as set out in claim 1;
sensing an attribute associated with the electrical switching device substantially encapsulated in a case;
communicating the sensed attribute through a communication interface of the case; and
exposing functionality of the electrical switching device through the communication interface.

15. The method of claim 14, further comprising:
actuating the electrical switching device; and
sensing a state of the electrical switching device.

16. The method of claim 14, further comprising detecting a zero-crossing associated with the electrical switching device.

17. The method of claim 14, further comprising detecting a voltage associated with the electrical switching device.

18. The method of claim 14, further comprising detecting a current associated with the electrical switching device.

19. The method of claim 14, further comprising:
measuring a voltage on a terminal; and
determining a parameter for the communication in response to the measured voltage.

20. The method of claim 14, further comprising outputting a dimming control signal from the case.

21. A circuit comprising:
providing a module as in claim 1;
a pulse width modulated (PWM) signal generator configured to generate a PWM signal having a pulse width corresponding to an analog signal in a first voltage region of a case;
an isolator spanning the first voltage region and a second voltage region of the case and configured to transfer the PWM signal between the first voltage region and the second voltage region.

22. The circuit of claim 21, wherein:
the isolator includes an actuator;
the pulse width modulator includes:
a charge storage circuit; and
a discharge circuit; and
the actuator is coupled in series with the charge storage circuit and the discharge circuit.

23. The circuit of claim 22, wherein:
the discharge circuit is a current source configured to activate on a first half-cycle of the analog signal; and
the charge storage circuit is configured to store a charge during a second half-cycle of the analog signal.

24. The circuit of claim 21, further comprising:
a zero-crossing detector configured to detect a zero-crossing associated with an electrical switching device;
wherein the PWM signal generator is configured to generate the PWM signal in response to the zero-crossing detector.

25. The circuit of claim 21, further comprising:
a filter configured to convert the PWM signal received through the isolator substantially to another analog signal.

26. The circuit of claim 21, further comprising a controller configured to sense both the analog signal and the zero-crossing in response to the PWM signal transferred through the isolator.

27. The circuit of claim 21, further comprising:
a line voltage terminal configured to receive a line voltage in a first voltage region of a case;
wherein the PWM signal generator is configured to generate the PWM signal with a pulse width corresponding to an amplitude of the line voltage.

28. The circuit of claim 21, further comprising:
a power supply coupled to the isolator and configured to generate a power voltage from a line voltage;
wherein at a minimum specified voltage of the line voltage, the power voltage is substantially equal to a threshold voltage to enable the isolator.

29. A method, comprising:
providing a module as set out in claim 1;
generating a periodic signal substantially synchronized with zero-crossings associated with the electrical switching device; and
generating a pulse width modulated (PWM) signal in response to the periodic signal;

wherein the PWM signal has a pulse width corresponding to an analog signal.

30. The method of claim 29, further comprising:
propagating the PWM signal through an isolator; and
filtering the PWM signal propagated through the isolator to substantially recover the analog signal.

31. The method of claim 29, further comprising identifying a zero-crossing in response to an edge of the PWM signal.

32. A method comprising:
providing a module as set out in claim 1;
generating a pulse width modulated (PWM) signal having a pulse width corresponding to a voltage; and
propagating the PWM signal through an isolator.

33. The method of claim 32, further comprising filtering the PWM signal propagated through the isolator.

34. The method of claim 32, further comprising:
lowering a power supply voltage as a line voltage decreases;
disabling the isolator when the line voltage decreases below a threshold in response to the corresponding power supply voltage.

35. The module of claim 1, wherein the dimming interface comprises one of a digital addressable lighting interface (DALI), a 0-10V load interface, or a digital signal interface (DSI).

36. The module of claim 1, wherein the electrical switching device is disposed in the first voltage region of the case.

37. A module, comprising:
a case;
an electrical switching device configured to control power to a load, the electrical switching device having a manual actuator;
a controller coupled to the electrical switching device; and
a dimming interface coupled to the controller and configured to provide dimming control to the load, the dimming interface is disposed on a first voltage region of the case, and the controller is disposed in a second voltage region substantially isolated from the first voltage region;
wherein the electrical switching device and the controller are substantially encapsulated by the case, the case having an opening to allow the manual actuator to be accessible external to the case.

* * * * *